US012676156B2

(12) United States Patent
Chinen et al.

(10) Patent No.: US 12,676,156 B2
(45) Date of Patent: Jul. 7, 2026

(54) ENCODING DEVICE AND ENCODING METHOD, DECODING DEVICE AND DECODING METHOD, AND PROGRAM

(71) Applicant: Sony Group Corporation, Tokyo (JP)

(72) Inventors: Toru Chinen, Kanagawa (JP); Masayuki Nishiguchi, Kanagawa (JP); Runyu Shi, Kanagawa (JP); Mitsuyuki Hatanaka, Kanagawa (JP); Yuki Yamamoto, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/493,363

(22) Filed: Oct. 24, 2023

(65) Prior Publication Data

US 2024/0055007 A1     Feb. 15, 2024

Related U.S. Application Data

(63) Continuation of application No. 17/464,594, filed on Sep. 1, 2021, now abandoned, which is a continuation
(Continued)

(30) Foreign Application Priority Data

Mar. 24, 2014     (JP) ................................. 2014-060486
Jul. 2, 2014     (JP) ................................. 2014-136633

(51) Int. Cl.
*G10L 19/008*     (2013.01)
*G10L 19/032*     (2013.01)
(Continued)

(52) U.S. Cl.
CPC .......... *G10L 19/008* (2013.01); *G10L 19/032* (2013.01); *G10L 19/06* (2013.01);
(Continued)

(58) Field of Classification Search
None
See application file for complete search history.

(56) References Cited

U.S. PATENT DOCUMENTS 5,020,135 A * 5/1991 Kasparian ............. H04W 88/02
                                                          455/76
7,328,162 B2 * 2/2008 Liljeryd ................ G10L 21/038
                                                          704/503
(Continued)

FOREIGN PATENT DOCUMENTS

CN        1272259 A     11/2000
CN      101529504 A      9/2009
(Continued)

OTHER PUBLICATIONS

International Search Report and Written Opinion thereof mailed Jun. 29, 2015 in connection with International Application No. PCT/JP2015/001432.
(Continued)

*Primary Examiner* — Richa Sonifrank
(74) *Attorney, Agent, or Firm* — Wolf, Greenfield & Sacks, P.C.

(57)     ABSTRACT

There is provided a decoding device including at least one circuit configured to acquire one or more encoded audio signals including a plurality of channels and/or a plurality of objects and priority information for each of the plurality of channels and/or the plurality of objects, and to decode the one or more encoded audio signals according to the priority information.

15 Claims, 32 Drawing Sheets

Related U.S. Application Data of application No. 16/726,755, filed on Dec. 24, 2019, now abandoned, which is a continuation of application No. 15/127,182, filed as application No. PCT/JP2015/001432 on Mar. 16, 2015, now abandoned.

(51) Int. Cl.

| | |
|---|---|
| *G10L 19/06* | (2013.01) |
| *G10L 19/22* | (2013.01) |
| *G10L 19/24* | (2013.01) |
| *G10L 21/038* | (2013.01) |
| *H03M 7/30* | (2006.01) |

(52) U.S. Cl.
CPC .............. *G10L 19/22* (2013.01); *G10L 19/24* (2013.01); *G10L 21/038* (2013.01); *H03M 7/30* (2013.01)

(56) References Cited

U.S. PATENT DOCUMENTS

| | | | | |
|---|---|---|---|---|
| 7,974,422 | B1* | 7/2011 | Ho | H04H 60/04 |
| | | | | 455/512 |
| 8,396,576 | B2* | 3/2013 | Kraemer | H04S 7/308 |
| | | | | 709/231 |
| 8,724,830 | B1* | 5/2014 | Fedigan | H03G 3/3005 |
| | | | | 381/119 |
| 10,748,547 | B2* | 8/2020 | Mehta | G10L 19/008 |
| 11,188,666 | B2* | 11/2021 | Coburn, IV | G06F 16/639 |
| 11,900,956 | B2* | 2/2024 | Yamamoto | G10L 25/51 |
| 2002/0031086 | A1* | 3/2002 | Welin | H04L 47/24 |
| | | | | 370/428 |
| 2002/0057705 | A1* | 5/2002 | Hagai | H04N 21/234327 |
| | | | | 375/E7.267 |
| 2005/0234714 | A1* | 10/2005 | Takagi | G10L 19/167 |
| | | | | 704/E21.009 |
| 2006/0045295 | A1 | 3/2006 | Kim | |
| 2006/0059535 | A1* | 3/2006 | D'Avello | G06F 16/68 |
| | | | | 725/139 |
| 2007/0291951 | A1* | 12/2007 | Faller | G10L 19/008 |
| | | | | 381/119 |
| 2008/0008323 | A1* | 1/2008 | Hilpert | H04N 7/15 |
| | | | | 348/E7.083 |
| 2008/0082321 | A1* | 4/2008 | Ide | G10L 19/035 |
| | | | | 704/203 |
| 2009/0024397 | A1* | 1/2009 | Ryu | G10L 19/16 |
| | | | | 704/500 |
| 2010/0241434 | A1* | 9/2010 | Ono | G10L 19/008 |
| | | | | 704/500 |
| 2011/0040395 | A1* | 2/2011 | Kraemer | H04R 3/12 |
| | | | | 700/94 |
| 2011/0040396 | A1 | 2/2011 | Kraemer et al. | |
| 2011/0040397 | A1 | 2/2011 | Kraemer et al. | |
| 2011/0051940 | A1* | 3/2011 | Ishikawa | H04L 12/40013 |
| | | | | 381/22 |
| 2011/0182432 | A1* | 7/2011 | Ishikawa | G10L 19/008 |
| | | | | 381/23 |
| 2011/0286593 | A1* | 11/2011 | Ho | H04H 60/04 |
| | | | | 381/119 |
| 2012/0005347 | A1 | 1/2012 | Chen et al. | |
| 2012/0005457 | A1 | 1/2012 | Chen et al. | |
| 2012/0243526 | A1* | 9/2012 | Yamamoto | G10L 21/038 |
| | | | | 370/343 |
| 2013/0108054 | A1* | 5/2013 | Groh | H04S 3/008 |
| | | | | 381/17 |
| 2013/0202129 | A1* | 8/2013 | Kraemer | H04S 7/308 |
| | | | | 704/500 |
| 2013/0223456 | A1* | 8/2013 | Kim | H04N 21/439 |
| | | | | 370/474 |
| 2013/0329922 | A1* | 12/2013 | Lemieux | H04S 7/30 |
| | | | | 381/307 |
| 2014/0036999 | A1* | 2/2014 | Ryu | H04N 19/159 |
| | | | | 375/240.12 |
| 2014/0056461 | A1* | 2/2014 | Afshar | G06F 3/016 |
| | | | | 381/385 |
| 2014/0112140 | A1* | 4/2014 | Chan | H04L 47/32 |
| | | | | 370/235 |
| 2014/0133682 | A1* | 5/2014 | Chabanne | H04S 7/30 |
| | | | | 381/300 |
| 2014/0350944 | A1 | 11/2014 | Jot et al. | |
| 2015/0201041 | A1* | 7/2015 | Wang | H04M 7/0072 |
| | | | | 709/203 |
| 2015/0213790 | A1* | 7/2015 | Oh | H04S 3/02 |
| | | | | 381/23 |
| 2015/0332680 | A1* | 11/2015 | Crockett | G10L 19/20 |
| | | | | 381/23 |
| 2015/0358754 | A1* | 12/2015 | Koppens | H04S 1/005 |
| | | | | 381/17 |
| 2016/0029138 | A1* | 1/2016 | France | G10L 19/008 |
| | | | | 381/23 |
| 2016/0050508 | A1* | 2/2016 | Redmann | H04S 7/302 |
| | | | | 381/303 |
| 2016/0057556 | A1* | 2/2016 | Boehm | G10L 19/008 |
| | | | | 381/23 |
| 2016/0093289 | A1* | 3/2016 | Pollet | G10L 13/08 |
| | | | | 704/260 |
| 2016/0133267 | A1* | 5/2016 | Adami | G10L 19/008 |
| | | | | 381/23 |
| 2016/0174008 | A1* | 6/2016 | Boehm | H04S 3/02 |
| | | | | 381/22 |
| 2016/0330560 | A1* | 11/2016 | Chon | H04S 5/005 |
| 2017/0229139 | A1* | 8/2017 | Yamamoto | G10L 21/0388 |
| 2018/0033440 | A1* | 2/2018 | Chinen | G10L 19/06 |
| 2019/0115037 | A1* | 4/2019 | Choo | G10L 21/038 |
| 2020/0135216 | A1 | 4/2020 | Chinen et al. | |
| 2021/0360694 | A1* | 11/2021 | Pandian | H04W 72/541 |
| 2021/0398546 | A1 | 12/2021 | Chinen et al. | |
| 2024/0055007 | A1* | 2/2024 | Chinen | G10L 19/06 |

FOREIGN PATENT DOCUMENTS

| | | |
|---|---|---|
| CN | 102549655 A | 7/2012 |
| CN | 103649706 A | 3/2014 |
| EP | 2 465 114 A1 | 6/2012 |
| EP | 2 465 259 A1 | 6/2012 |
| EP | 2 686 654 A1 | 1/2014 |
| EP | 3 059 732 A1 | 8/2016 |
| JP | 2002-516421 A | 6/2002 |
| JP | 2002229593 A | 8/2002 |
| JP | 2003-066994 A | 3/2003 |
| JP | 2005031289 A | 2/2005 |
| JP | 2007225762 A | 9/2007 |
| JP | 2011164638 A | 8/2011 |
| JP | 2012-133366 A | 7/2012 |
| JP | 2012521012 A | 9/2012 |
| JP | 2013-502184 A | 1/2013 |
| JP | 2013511752 A | 4/2013 |
| JP | 2013-257569 A | 12/2013 |
| JP | 2014-525048 A | 9/2014 |
| JP | 2014-526168 A | 10/2014 |
| KR | 20120084314 A | 7/2012 |
| WO | WO 98/57436 A2 | 12/1998 |
| WO | WO 2010/109918 A1 | 9/2010 |
| WO | WO 2011/020065 A1 | 2/2011 |
| WO | WO 2011/020067 A1 | 2/2011 |
| WO | WO 2012/125855 A1 | 9/2012 |
| WO | WO 2013/006342 A1 | 1/2013 |
| WO | WO 2013/181272 A2 | 12/2013 |

OTHER PUBLICATIONS

International Preliminary Report on Patentability mailed Oct. 6, 2016 in connection with International Application No. PCT/JP2015/001432.

Chinese Office Action issued Mar. 15, 2019 in connection with Chinese Application No. 201580014248.6, and English translation thereof.

(56)　　　　References Cited

OTHER PUBLICATIONS

Japanese Office Action mailed Jan. 16, 2020 in connection with Japanese Application No. 2018-217178 and English translation thereof.

Brazilian Search Report and Written Opinion dated Jun. 30, 2020 in connection with Brazilian Application No. BR112016021407, and partial English translation thereof.

Japanese Office Action dated Jun. 24, 2020 in connection with Japanese Application No. 2018-217178, and English translation thereof.

[No Author Listed], Information technology—Coding of audio-visual objects—Part 3: Audio, International Standard, ISO/IEC 14496-3, Fourth Edition, Sep. 1, 2009, 1416 pages.

[No Author Listed], Information technology—High efficiency coding and media delivery in heterogeneous environments—Part 3: 3D audio. ISO/IEC CD 23008-3. Apr. 4, 2014. 339 pages.

[No Author Listed], Information technology—MPEG audio technologies—Part 3: Unified speech and audio coding, International Standard, ISO/IEC 23003-3, First Edition, Apr. 1, 2012, 286 pages.

Benyassine et al., ITU-T Recommendation G. 719 Annex B: A Silence Compression Scheme for Use with G.729 Optimized for V.70 Digital Simultaneous Voice and Data Applications. IEEE Communications Magazine. Sep. 1997, pp. 64-73.

Herre et al., New concepts in parametric coding of spatial audio: From SAC to SAOC. 2007 IEEE International Conference on Multimedia and Expo Jul. 2, 2007:1894-97.

Yamamoto et al., Proposal on Complexity Reduction of the MPEG-H 3D Audio CO Object Renderer, MPEG Meeting, Valencia, Spain, Motion Picture Expert Group or ISO/IEC JTC1/SC29/WG11, No. M33137, XP030061589, Mar. 2014.

[No Author Listed], "Information technology—High efficiency coding and media delivery in heterogeneous environments—Part 3: 3D audio", ISO/IEC DIS 23008-3, ISO/IEC JTC 1/SC 29/WG 11, Jul. 25, 2014.

[No Author Listed], "Information technology—High efficiency coding and media delivery in heterogeneous environments—Part 3: 3D audio", ISO/IEC DIS 23008-3, ISO/IEC 23008-3, Aug. 5, 2014.

[No Author Listed], "Information technology—High efficiency coding and media delivery in heterogeneous environments—Part 3: 3D audio",ISO/IEC WD1 23008-3, ISO/IEC 23008-3, Jan. 24, 2014.

Takeshi Norimatsu, "The audible signal coding which unified a sound and musical tone" Journal of the Acoustical Society of Japan, Mar. 2012, the 68th volume, No. 3, pp. 123-128.

(No Author Listed), "Information technology—MPEG audio technologies—Part 3: Unified speech and audio coding". ISO/IEC JTC 1/SC 29/WG 11, ISO/IEC FDIS 23003-3:2011(E), Final Draft International Standard, Sep. 20, 2011.

Kazuya Iwata, et al, "Sound Field for Movie Surround Sound Field Generation Control Technology", Panasonic Technical Journal, vol. 56, No. 4, Jan. 2011, pp. 27-29.

Ville Pulkki, "Compensating Displacement of Amplitude-Panned Virtual Sources", AES 22nd International Conference on Virtual, Synthetic and Entertainment Audio, Nov. 5, 2025 (Nov. 5, 2025), pp. 1-10, XP055119863.

* cited by examiner

FIG. 3

| CHANNEL NUMBER | PRIORITY INFORMATION (0–7) |
|---|---|
| 0 | 3 |
| 1 | 0 |
| 2 | 4 |
| 3 | 7 |
| 4 | 5 |
| 5 | 7 |
| ... | |
| M-2 | 2 |
| M-1 | 6 |

FIG. 4

| PRIORITY INFORMATION (0–7) | MEANING |
|---|---|
| 0 | PRIORITY AT THE TIME OF REPRODUCTION IS LOWEST |
| 1 | |
| 2 | |
| 3 | |
| 4 | |
| 5 | |
| 6 | |
| 7 | PRIORITY AT THE TIME OF REPRODUCTION IS HIGHEST |

FIG. 8

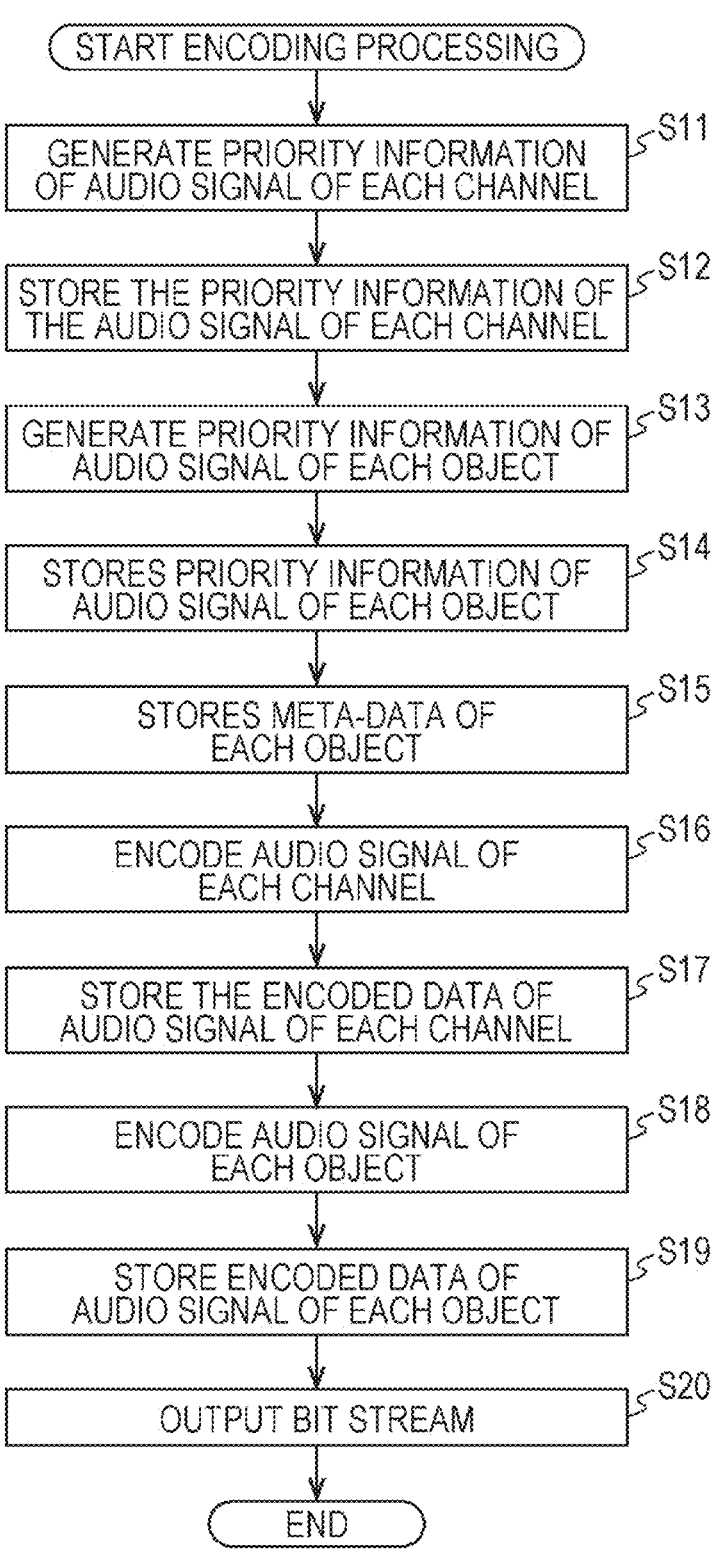

START ENCODING PROCESSING

GENERATE PRIORITY INFORMATION
OF AUDIO SIGNAL OF EACH CHANNEL — S11

STORE THE PRIORITY INFORMATION OF
THE AUDIO SIGNAL OF EACH CHANNEL — S12

GENERATE PRIORITY INFORMATION OF
AUDIO SIGNAL OF EACH OBJECT — S13

STORES PRIORITY INFORMATION OF
AUDIO SIGNAL OF EACH OBJECT — S14

STORES META-DATA OF
EACH OBJECT — S15

ENCODE AUDIO SIGNAL OF
EACH CHANNEL — S16

STORE THE ENCODED DATA OF
AUDIO SIGNAL OF EACH CHANNEL — S17

ENCODE AUDIO SIGNAL OF
EACH OBJECT — S18

STORE ENCODED DATA OF
AUDIO SIGNAL OF EACH OBJECT — S19

OUTPUT BIT STREAM — S20

END

| Syntax | No. of bits | Mnemonic |
|---|---|---|
| object_metadata() | | |
| { | | |
| for (o=1:num_objects) { | | |
| object_priority[o]; | 3 | uimsbf |
| position_azimuth[o]; | 8 | tcimsbf |
| position_elevation[o]; | 6 | tcimsbf |
| position_radius[o]; | 4 | uimsbf |
| gain_factor[o]; | 7 | tcimsbf |
| } | | |
| } | | |

ENCODING DEVICE AND ENCODING METHOD, DECODING DEVICE AND DECODING METHOD, AND PROGRAM

CROSS-REFERENCE TO RELATED APPLICATIONS

The present application claims the benefit under 35 U.S.C. § 120 as a continuation application of U.S. application Ser. No. 17/464,594, filed on Sep. 1, 2021, which is a continuation of U.S. application Ser. No. 16/726,755, filed on Dec. 24, 2019, which is a continuation of U.S. application Ser. No. 15/127,182, filed on Sep. 19, 2016, which claims the benefit under 35 U.S.C. § 371 as a U.S. National Stage Entry of International Application No. PCT/JP2015/001432, filed in the Japanese Patent Office as a Receiving office on Mar. 16, 2015, which claims priority to Japanese Patent Application Number 2014-136633, filed in the Japanese Patent Office on Jul. 2, 2014 and Japanese Patent Application Number 2014-060486, filed in the Japanese Patent Office on Mar. 24, 2014, the entire contents of each of which are incorporated herein by reference.

CROSS REFERENCE TO RELATED APPLICATIONS

This application claims the benefit of Japanese Priority Patent Application JP 2014-060486 filed Mar. 24, 2014, and Japanese Priority Patent Application JP 2014-136633 filed Jul. 2, 2014, the entire contents of each of which are incorporated herein by reference.

TECHNICAL FIELD

The present technology relates to an encoding device and an encoding method, and a decoding device and a decoding method and a program, particularly to an encoding device and an encoding method, a decoding device and decoding method and the program in which an amount of calculation for decoding an audio signal can be reduced.

BACKGROUND ART

For example, as a method of encoding an audio signal, a multi-channel encoding under a moving picture experts group (MPEG)-2 advanced audio coding (AAC) standard, MPEG-4 AAC standard, and MPEG-D unified speech and audio coding (USAC) which are International Standards, have been proposed (for example, refer to NPL 1 and NPL 2).

CITATION LIST

Non Patent Literature

[NPL 1]
INTERNATIONAL STANDARD ISO/IEC 14496-3 Fourth edition 2009-09-01 Information technology-coding of audio-visual objects-part3: Audio
[NPL 2]
INTERNATIONAL STANDARD ISO/IEC 23003-3 First edition 2012-04-01 Information technology-coding of audio-visual objects-part3: Unified speech and audio coding

SUMMARY OF INVENTION

Technical Problem

Incidentally, it is necessary to provide an encoding technology using more channels more sense of presence in reproduction or a transmission of a plurality of sound materials (objects) than in 5.1 channel surround reproduction in the related art.

For example, a case of encoding and decoding audio signals of 24 channels and a plurality of objects, and a case of encoding and decoding an audio signal of two channels, are considered.

In this case, in a mobile device having a poor calculation capability, it is possible to decode the audio signal of two channels in real time, however, there is a case where the decoding of the audio signals of 24 channels and a plurality of objects in real time is difficult.

In the current audio codec such as MPEG-D USAC or the like, since it is necessary to decode the audio signals of all the channels and all the objects, it is difficult to reduce the amount of calculation at the time of decoding. Therefore, there is a problem in that it is not possible to reproduce the audio signal in real time depending on the devices at the decoding side.

It is desirable to provide an encoding device and an encoding method, a decoding device and a decoding method and the program in which an amount of calculation for decoding can be reduced.

Solution to Problem

A decoding device according to a first embodiment of the present technology includes at least one circuit configured to acquire one or more encoded audio signals including a plurality of channels and/or a plurality of objects and priority information for each of the plurality of channels and/or the plurality of objects and to decode the one or more encoded audio signals according to the priority information.

The at least one circuit may be configured to decode according to the priority information at least in part by decoding at least one of the one or more encoded audio signals for which a priority degree indicated by the priority information is equal to or higher than a degree, and refraining from decoding at least one other of the one or more encoded audio signals for which a priority degree indicated by the priority information is less than the degree.

The at least one circuit is configured to change the degree based at least in part on the priority information for the plurality of channels and/or the plurality of objects.

The at least one circuit may be configured to acquire a plurality of sets of priority information for the one or more encoded audio signals, and the at least one circuit may be configured to decode the one or more encoded audio signals at least in part by selecting one of the sets of priority information and decoding based at least in part on the one set of priority information.

The at least one circuit may be configured to select the one of the sets of priority information according to a calculation capability of the decoding device.

The at least one circuit may be further configured to generate the priority information based at least in part on the encoded audio signal.

The at least one circuit may be configured to generate the priority information based at least in part on a sound pressure or a spectral shape of the audio of the one or more encoded audio signals.

The priority information for the plurality of channels and/or the plurality of objects may comprise, for at least one first channel of the plurality of channels and/or at least one first object of the plurality of objects, priority information indicating different priority degrees of the at least one first channel and/or at least one first object over a period of time, and the at least one circuit may be configured to decode based on the priority information at least in part by determining, for the first channel and/or the first object and at a first time during the period of time, whether or not to decode the first channel and/or the first object at the first time based at least in part on a priority degree for the first channel and/or the first object at the first time and a priority degree for the first channel and/or the first object at another time before or after the first time and during the period of time.

The at least one circuit may be further configured to generate an audio signal for a first time at least in part by adding an output audio signal for a channel or object at the time and an output audio signal of the channel or object at a second time before or after the first time, wherein the output audio signal for the channel or object for a time is a signal obtained by the at least one circuit as a result of decoding in a case where decoding of the channel or object for the time is performed and is zero data in a case where decoding of the channel or object for the time is not performed, and to perform a gain adjustment of the output audio signal of the channel or object at the time based on the priority information of the channel or object at the time and the priority information of the channel or object at the other time before or after the time.

The at least one circuit may be further configured to adjust a gain of a high frequency power value for the channel or object based on the priority information of the channel or object at the first time and the priority information of the channel or object at the second time before or after the first time, and generate a high frequency component of the audio signal for the first time based on the high frequency power value of which the gain is adjusted and the audio signal of the time.

The at least one circuit may be further configured to generate, for each channel or each object, an audio signal of the first time in which a high frequency component is included, based on a high frequency power value and the audio signal of the time, and to perform the gain adjustment of the audio signal of the first time in which the high frequency component is included.

The at least one circuit may be further configured to assign an audio signal of a first object, of the plurality of objects, to each of at least some of the plurality of channels with a gain value based on the priority information and to generate the audio of each of the plurality of channels.

A decoding method or a program according to the first embodiment of the present technology includes: acquiring priority information for each of a plurality of channels and/or a plurality of objects of one or more encoded audio signals, and decoding the plurality of channels and/or the plurality of objects according to the priority information.

According to the first embodiment of the present technology, priority information for each of a plurality of channels and/or a plurality of objects of one or more encoded audio signals is acquired; and the plurality of channels and/or the plurality of objects are decoded according to the priority information.

An encoding device according to a second embodiment of the present technology includes: at least one circuit configured to generate priority information for each of a plurality of channels and/or a plurality of objects of an audio signal, and to store the priority information in a bit stream.

The at least one circuit may be configured to generate the priority information at least in part by generating a plurality of sets of priority information for each of the plurality of channels and/or plurality of objects.

The at least one circuit may be configured to generate the plurality of sets of priority information for each of a plurality of calculation capabilities of decoding devices.

The at least one circuit may be configured to generate the priority information based at least in part on a sound pressure or a spectral shape of the audio signal.

The at least one circuit may be further configured to encode audio signals of the plurality of channels and/or the plurality of objects of the audio signal to form an encoded audio signal, and the at least one circuit may be further configured to store the priority information and the encoded audio signal in the bit stream.

An encoding method and a program according to the second embodiment of the present technology includes: generating priority information for each of a plurality of channels and/or a plurality of objects of an audio signal and storing the priority information in a bit stream.

According to the second embodiment of the present technology, priority information for each of a plurality of channels and/or a plurality of objects of an audio signal is generated, and the priority information is stored in a bit stream.

Advantageous Effects of Invention

According to the first embodiment and the second embodiment, it is possible to reduce the amount of calculation for decoding.

The effects described here are not necessarily limited hereto, and the effects described here may be any effect that is described in this disclosure.

BRIEF DESCRIPTION OF DRAWINGS

FIG. 3 is a diagram explaining priority information.
FIG. 4 is a diagram explaining meanings of values of the priority information.
FIG. 8 is a flowchart explaining encoding processing.
FIG. 13 is another configuration example of the unpacking/decoding unit.
FIG. 15 is a diagram illustrating an example of syntax of metadata of an object.

FIG. 18 is a diagram explaining selection of an output destination of an MDCT coefficient.

FIG. 32 is a diagram illustrating a configuration example of a computer.

DESCRIPTION OF EMBODIMENTS

Figure 1:
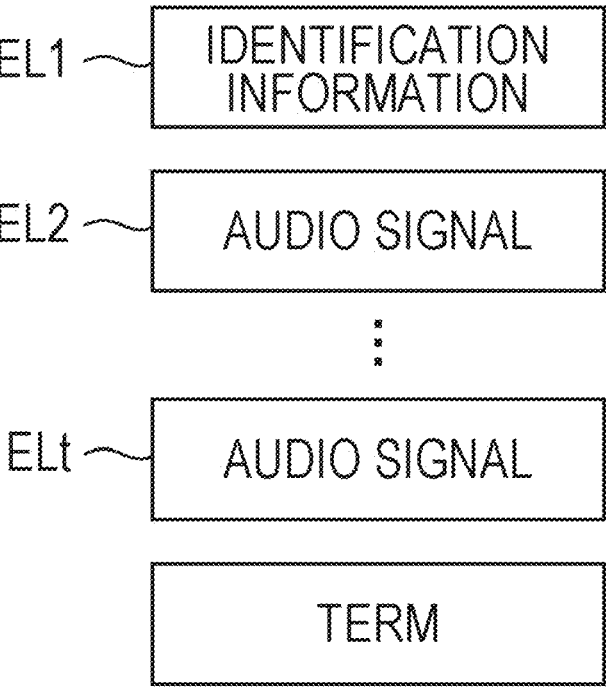
FIG. 1 is a diagram explaining a bit stream.

Hereinafter, embodiments to which the present technology is applied will be described referring to the drawings.

First Embodiment

<Overview of Present Technology>

In encoding an audio signal of each channel that consists a signal of multi-channels and an audio signal of an object, in the present technology, an amount of calculation in decoding can be decreased by transmitting priority information of the audio signal of each channel and priority information of the audio signal of each object.

In addition, in the present technology, in the decoding side, frequency-time conversion is performed in a case where a priority degree which is indicated by the priority information of each channel or of each object is equal to or larger than a predetermined priority degree, and frequency-time conversion is not performed and the result of the frequency-time conversion is made to be zero in a case where the priority degree which is indicated in the priority information of each channel or of each object is smaller than the predetermined priority degree, and thus, the amount of calculation in decoding the audio signals can be decreased.

Hereinafter, a case where the audio signal of each channel that consists the signal of multi-channels and the audio signal of the object are encoded according to the AAC standards will be described. However, in a case where the encoding by another method, the same processing will be performed.

For example, in a case where the audio signal of each channel that consists the multi-channel and the audio signal of a plurality of objects are encoded according to the AAC standards and transmitted, the audio signal of each channel or each object is encoded and transmitted for each frame.

Specifically, as illustrated in FIG. 1, the encoded audio signal or information necessary for decoding the audio signal is stored in a plurality of elements (bit stream elements), and a bit stream made of those bit stream elements is transmitted.

In this example, in the bit stream for one frame, the element EL1 to the element ELt of t number are disposed in order from the head, and finally an identifier TERM indicating the end position of the frame relating to information of the frame is disposed.

For example, the element EL1 disposed on the head is an ancillary data area called a data stream element (DSE), and information about each of a plurality of channels such as information about a down-mixing of the audio signal or identification information are described in the DSE.

In the elements EL2 to ELt subsequent to ELEMENT E11, the encoded audio signals are stored.

Particularly, an element in which an audio signal of a single channel is stored is called an SCE, and an element in which an audio signal of a pair of two channels is stored is called a CPE. In addition, an audio signal of each object is called an SCE. In addition, the audio signal of each object is stored in the SCE.

In the present technology, the priority information of the audio signal of each channel that consists a signal of multi-channels and the priority information of the audio signal of the object are generated and stored in the DSE.

Figure 2:
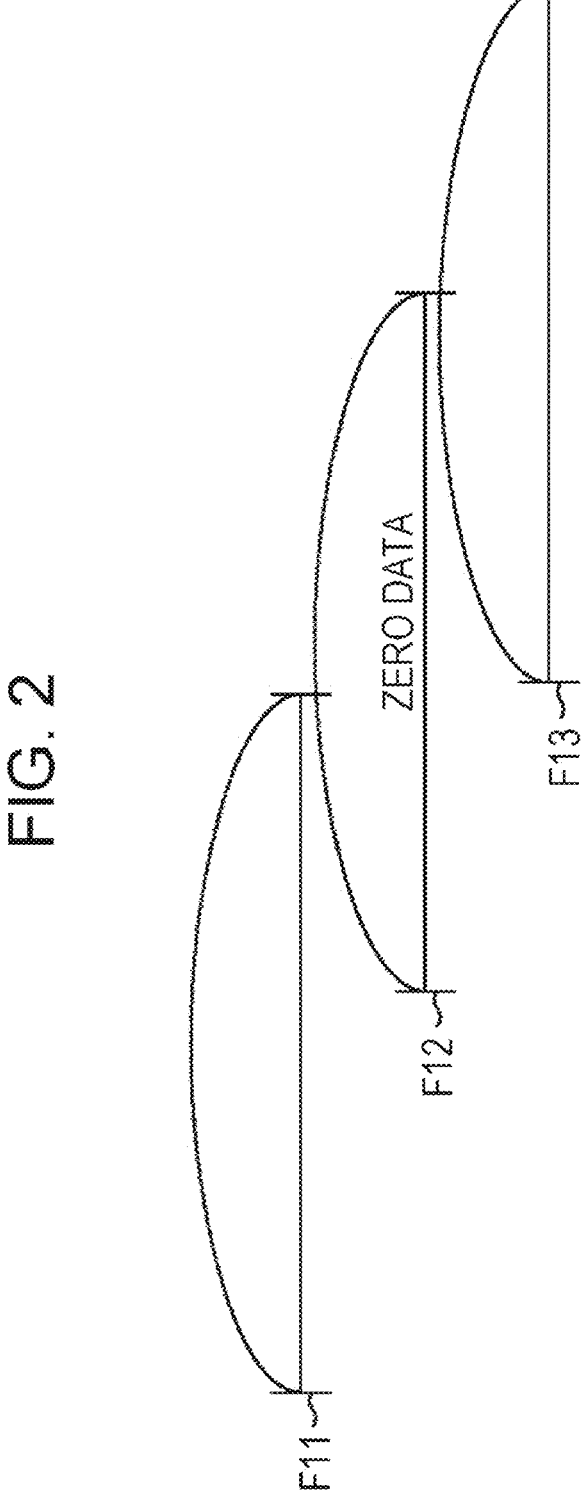
FIG. 2 is a diagram explaining an encoding.

For example, as illustrated in FIG. 2, it is assumed that the audio signals of successive frames F11 to F13 are encoded.

In this case, an encoding device (an encoder) analyzes the degree of the priority degree of the audio signal of each channel for each of those frames, and for example, as illustrated in FIG. 3, and generates the priority information of each channel.

Similarly, the encoding device also generates the priority information of the audio signal of each object.

For example, the encoding device analyzes the degree of the priority degree of the audio signal based on a sound pressure or a spectral shape of the audio signal, and a correlation of spectral shapes between channels or between objects.

In FIG. 3, the priority information of each channel in a case where the total number of channels is M is illustrated as an example. That is, with regard to each channel from the channel having a channel number of 0 to the channel having a channel number of M−1, a numerical value indicating the priority degree of the signal of those channels is illustrated as the priority information.

For example, the priority information of the channel having the channel number of 0 is 3, and the priority information of the channel having the channel number of 1 is 0. A channel having a predetermined channel number of m (m=0, 1, . . . , m−1) is assumed to also be called a channel m.

The value of the priority information illustrated in FIG. 3 is any value from 0 to 7 as illustrated in FIG. 4, as the value of the priority information increases, the priority degree at the time of reproducing the audio signal, that is, an importance degree becomes higher.

Therefore, the audio signal of which the value of the priority information is 0 has the lowest priority degree, and the audio signal of which the value of the priority information is 7 has the highest priority degree.

In a case where the audio signal of multi-channels and the audio signal of the plurality of objects are simultaneously reproduced, a sound not so important compared to another sound is included in the sound reproduced from these audio signals. In other words, even though a specific sound from the entire sounds is not reproduced, there exists a sound of the extent that does not cause an uncomfortable feeling to a listener.

Therefore, if the decoding for the audio signal of which the priority degree is low is not performed if necessary it is possible to suppress the deterioration of the sound quality and decrease the amount of calculation for decoding. Therefore, in the encoding device, the importance degree of each audio signal at the time of reproducing, that is, the priority information indicating the priority in decoding is assigned to each audio signal for each frame in such a manner that an audio signal which will not be decoded can be appropriately selected.

As described above, when the priority information for each audio signal is determined, the priority information is stored in the DSE of the element EL1 illustrated in FIG. 1. Particularly, in the example in FIG. 3, since the number of channels that configures the audio signal of multi-channels is M, the priority information of each of M channels of channel 0 to channel M−1 is stored in the DSE.

Similarly, the priority information of each object is also stored in the DSE of the element EL1. Here, for example, when it is assumed that there are N objects of object numbers from 0 to N−1, the priority information of each of the N objects is determined, and is stored in the DSE.

Hereinafter, the object of a predetermined object number n (n=0, 1, . . . , N−1) is also called an object n.

In this manner, if the priority information is determined for each audio signal, in the reproduction side, that is, in the decoding side for the audio signal, it is possible to simply specify which audio signal is important at the time of reproducing and is to be decoded with priority, that is, to be used in reproducing.

Referring back to FIG. 2, for example, it is assumed that the priority information of the audio signals of frame F11 and frame F13 in a predetermined channel is 7, and the priority information of the audio signal of the frame F12 in the predetermined channel is 0.

In addition, it is assumed that the decoding is not performed with respect to the audio signal of which the priority degree is lower than a predetermined priority degree at the side of decoding the audio signal, that is, in a decoding device (the decoder).

Here, for example, if the predetermined priority degree is called a threshold value and if the threshold value is 4, in the example described above, the decoding is performed with respect to the audio signals of the frame F11 and the frame F13 in the predetermined channel of which the priority information is 7.

On the other hand, the decoding is not performed with respect to the audio signal of the frame F12 in a predetermined channel of which the priority information is 0.

Therefore, in this example, the audio signal of the frame F12 becomes a soundless signal, and the audio signals of the frame F11 and the frame F13 are synthesized, and then becomes the final audio signal of the predetermined channel.

More specifically, for example, at the time of encoding each audio signal, time-frequency conversion with respect to the audio signal is performed and information obtained by the time-frequency conversion is encoded, and then, encoded data obtained as a result of the encoding is stored in the element.

Any processing may be performed for the time-frequency conversion. However, hereinafter, the description will be continued in which a modified discrete cosine transform (MDCT) is performed as the time-frequency conversion.

In addition, in the decoding device, the decoding is performed with respect to the encoded data, and an inverse modified discrete cosine transform (IMDCT) is performed with respect to an MDCT coefficient obtained from the result of the decoding, and then, the audio signal is generated. That is, here, the IMDCT is performed as an inverse conversion (frequency-time conversion) to the time-frequency conversion.

For this reason, more specifically, the IMDCT is performed with respect to the frame F11 and the frame F13 of which the priority information is equal to or higher than 4 which is a value of the threshold value, and the audio signal is generated.

In addition, the IMDCT is not performed with respect to the frame F12 of which the priority information is lower than 4 which is a value of the threshold value, and the result of the IMDCT is 0, and then, the audio signal is generated. In this way, the audio signal of the frame F12 becomes a soundless signal, that is, zero data.

Furthermore, as another example, in an example illustrated in FIG. 3, when the threshold value is 4, among the audio signals of each of channel 0 to channel M−1, the decoding is not performed for the audio signals of the channel 0, the channel 1, and the channel M−2 of which the value of the priority information is lower than the threshold value of 4.

As described above, according to a result of comparison between the priority information and the threshold value, the decoding is not performed with respect to the audio signal of which the priority degree indicated by the priority information is low, and thus, it is possible to minimize the deterioration of the sound quality and decrease the amount of calculation for decoding.

Configuration Example of Encoding Device

Next, a specific embodiment of the encoding device and the decoding device to which the present technology is applied will be described. First, the encoding device will be described.

Figure 5:
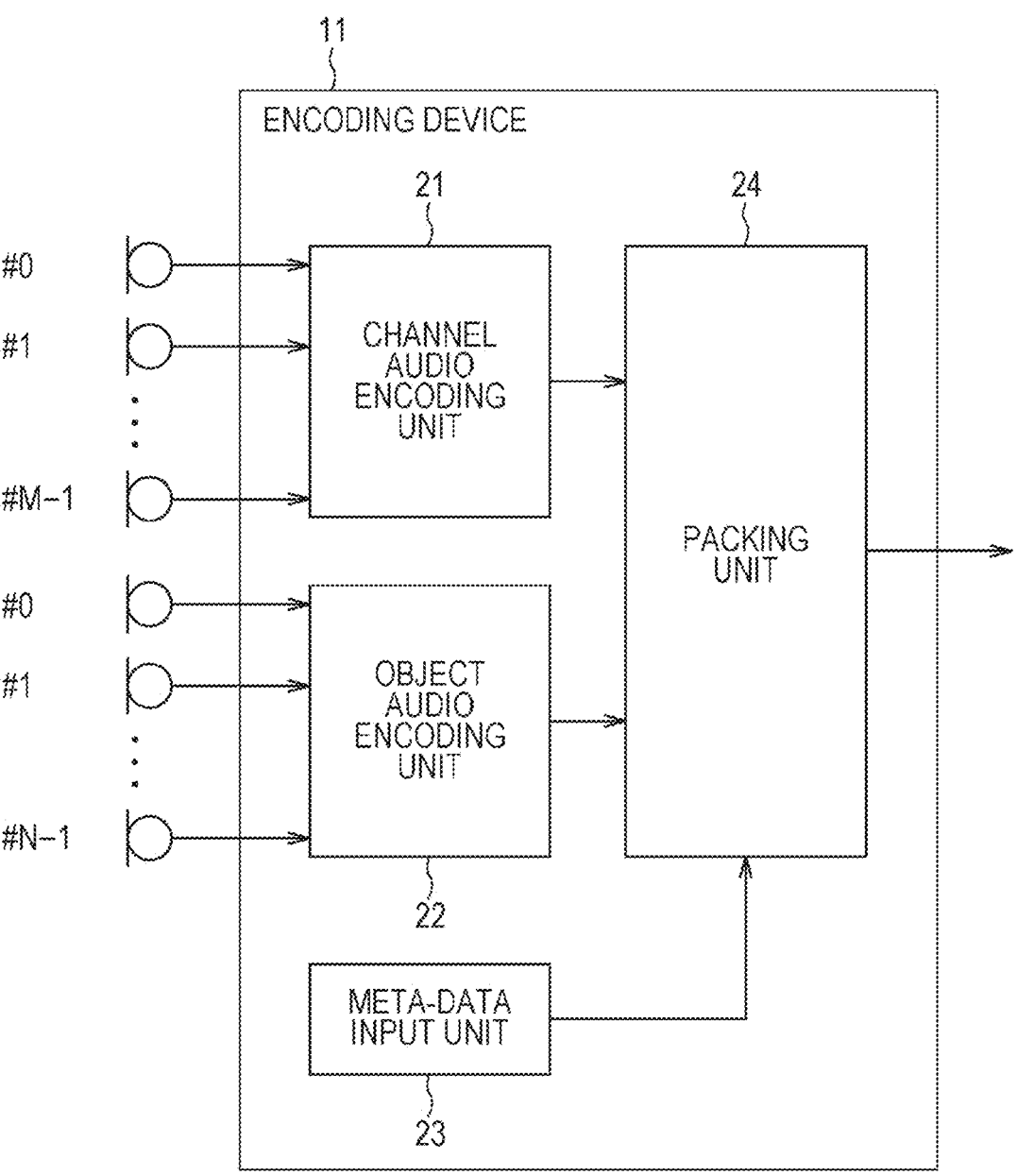
FIG. 5 is a diagram illustrating a configuration example of an encoding device.

FIG. 5 is a diagram illustrating a configuration example of the encoding device to which the present technology is applied.

The encoding device 11 in FIG. 5 includes a channel audio encoding unit 21, an object audio encoding unit 22, a meta-data input unit 23, and a packing unit 24.

The audio signal of each channel of the multi-channel signal of which the number of channels is M is supplied to the channel audio encoding unit 21. For example, the audio signal of each of the channels is supplied from microphones corresponding to those channels. In FIG. 5, the letters "#0" to "#M−1" indicate the channel numbers of the respective channels.

The channel audio encoding unit 21 encodes the supplied audio signal of each channel, and generates the priority information based on the audio signal, and then, supplies the encoded data obtained by the encoding and the priority information to the packing unit 24.

The audio signal of each of the N channels is supplied to the object audio encoding unit 22. For example, the audio signals of the objects are respectively supplied from microphones corresponding to those channels. In FIG. 5, the letters "#0" to "#N−1" indicate the object numbers of the respective objects.

The object audio encoding unit 22 encodes the supplied audio signal of each channel, and generates the priority information based on the audio signal, and then, supplies the encoded data obtained by the encoding and the priority information to the packing unit 24.

The meta-data input unit 23 supplies meta-data of each object to the packing unit 24. For example, the meta-data of each object is assumed to be spatial position information indicating a position of the object in the space. More specifically, for example, the spatial position information may be three-dimensional coordinates information that indicates the positional coordinates of the object in three-dimensional space.

The packing unit 24 performs packing of the encoded data and the priority information supplied from the channel audio encoding unit 21, the encoded data and the priority information supplied from the object audio encoding unit 22, and the meta-data supplied from the meta-data input unit 23, and generates a bit stream to output the generated bit stream.

In the bit stream obtained in this way, the encoded data of each channel for each frame, the priority information of each channel, the encoded data of each object, the priority information of each object, and the meta-data of each object are included.

Here, the audio signal of each of the M channels and the audio signal of each of the N objects stored in the bit stream of one frame are the audio signals of the same frame to be simultaneously reproduced.

Here, as the priority information of the audio signal of each channel or of each object, the example in which the priority information is generated with respect to each audio signal of one frame is described. However, one priority information item may be generated with respect to the audio signals of several frames, for example, within a unit of predetermined time.

Configuration Example of Channel Audio Encoding Unit

Figure 6:
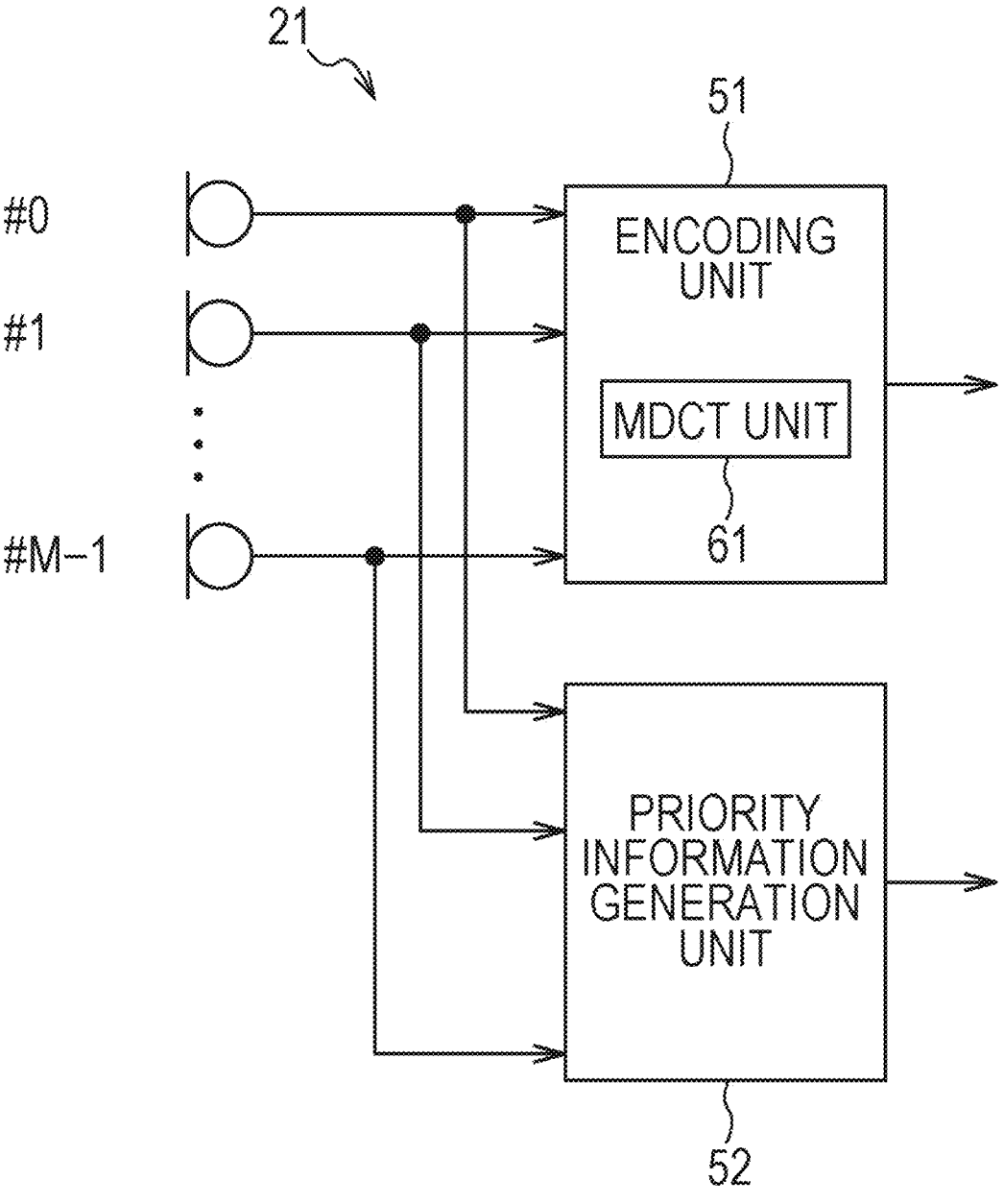
FIG. 6 is a diagram illustrating a channel audio encoding unit.

In addition, a more specific configuration of the channel audio encoding unit 21 in FIG. 5 is configured, for example, as illustrated in FIG. 6.

The channel audio encoding unit 21 illustrated in FIG. 6 includes an encoding unit 51 and a priority information generation unit 52.

The encoding unit 51 includes an MDCT unit 61, and the encoding unit 51 encodes the audio signal of each channel supplied from the outside.

That is, the MDCT unit 61 performs the MDCT with respect to the audio signal of each channel supplied from the outside. The encoding unit 51 encodes the MDCT coefficient of each channel obtained by the MDCT, and supplies the encoded data of each channel obtained by the encoding as a result, that is, the encoded audio signal to the packing unit 24.

In addition, the priority information generation unit 52 analyzes the audio signal of each channel supplied from the outside, and generates the priority information of the audio signal of each channel, and supplies the priority information to the packing unit 24.

Configuration Example of Object Audio Encoding Unit

Figure 7:
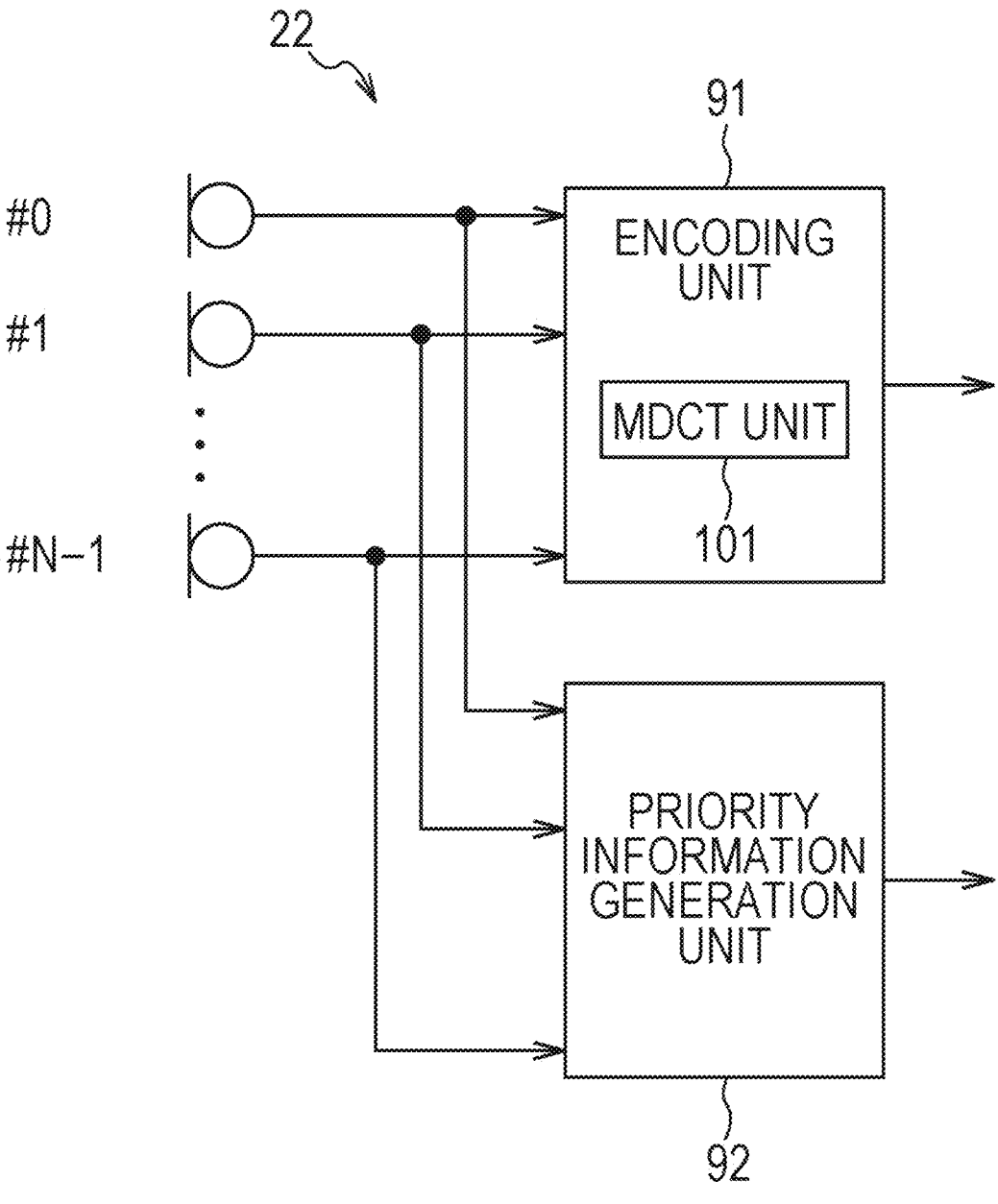
FIG. 7 is a diagram illustrating an object audio encoding unit.

Furthermore, a more specific configuration of the object audio encoding unit 22 in FIG. 5 is configured, for example, as illustrated in FIG. 7.

The object audio encoding unit 22 illustrated in FIG. 7 includes an encoding unit 91 and a priority information generation unit 92.

The encoding unit 91 includes an MDCT unit 101, and the encoding unit 91 encodes the audio signal of each object supplied from the outside.

That is, the MDCT unit 101 performs the MDCT with respect to the audio signal of each object supplied from the outside. The encoding unit 91 encodes the MDCT coefficient of each channel obtained by the MDCT, and supplies the encoded data of each object obtained by the encoding as a result, that is, the encoded audio signal to the packing unit 24.

In addition, the priority information generation unit 92 analyzes the audio signal of each object supplied from the outside, and generates the priority information of the audio signal of each object, and supplies the priority information to the packing unit 24.

<Description on Encoding Processing>

Next, the processing performed by the encoding device 11 will be described.

When audio signals of the plurality of channels and audio signals of the plurality of objects that are simultaneously reproduced are supplied only for one frame, the encoding device 11 performs the encoding processing and outputs the bit stream including the encoded audio signals.

Hereinafter, the encoding processing by the encoding device 11 will be described referring to the flow chart in FIG. 8. The encoding processing is performed for each frame of the audio signal.

In STEP S11, the priority information generation unit 52 of the channel audio encoding unit 21 generates the priority information of the supplied audio signal of each channel, and supplies the priority information to the packing unit 24. For example, the priority information generation unit 52 analyzes the audio signal for each channel, and generates the priority information based on the sound pressure or the spectral shape of the audio signal and the correlation of the spectral shapes between the channels.

In STEP S12, the packing unit 24 stores the priority information of the audio signal of each channel supplied from the priority information generation unit 52 in the DSE of the bit stream.

That is, the priority information is stored in the head element of the bit stream.

In STEP S13, the priority information generation unit 92 of the object audio encoding unit 22 generates the priority information of the supplied audio signal of each object, and supplies the priority information to the packing unit 24. For example, the priority information generation unit 92 analyzes the audio signal for each object, and generates the priority information based on the sound pressure or the spectral shape of the audio signal and the correlation of the spectral shapes between the channels.

When the priority information of the audio signal of each channel or of each object is generated, for each priority degree which is the value of the priority information, the number of the audio signals to which the priority degrees are assigned may be determined in advance with respect to the number of channels or the number of objects.

For example, in the example in FIG. 3, the number of audio signals to which the priority information of "7" is assigned, that is, the number of channels may be determined as five in advance, and the number of audio signals to which the priority information of "6" is assigned may be determined as three in advance.

In STEP S14, the packing unit 24 stores the priority information of the audio signal of each object supplied from the priority information generation unit 92 in the DSE of the bit stream.

In STEP S15, the packing unit 24 stores the meta-data of each object in the DSE of the bit stream.

For example, the meta-data input unit 23 acquires the meta-data of each object by receiving an input from a user, communicating with the outside, or performing reading from a storage region outside, and supplies the meta-data to the packing unit 24. The packing unit 24 stores the meta-data supplied in this manner from the meta-data input unit 23 in the DSE.

As a result of above-described processing, the priority information of the audio signals of all the channels, the priority information of the audio signals of all the objects, and the meta-data of all the objects are stored in the DSE of the bit stream.

In STEP S16, the encoding unit 51 of the channel audio encoding unit 21 encodes the supplied audio signal of each channel.

Specifically, the MDCT unit 61 performs the MDCT with respect to the audio signal of each channel, and the encoding unit 51 encodes the MDCT coefficient of each channel obtained by the MDCT, and supplies the encoded data of each channel obtained as the result of the encoding to the packing unit 24.

In STEP S17, the packing unit 24 stores the encoded data of the audio signal of each channel supplied from the encoding unit 51 in the SCE or the CPE of the bit stream. That is, the encoded data is stored in each element disposed subsequent to the DSE in the bit stream.

In STEP S18, the encoding unit 91 of the object audio encoding unit 22 encodes the supplied audio signal of each object.

Specifically, the MDCT unit 101 performs the MDCT with respect to the audio signal of each object, and the encoding unit 91 encodes the MDCT coefficient of each channel obtained by the MDCT, and supplies the encoded data of each object obtained as the result of the encoding to the packing unit 24.

In STEP S19, the packing unit 24 stores the encoded data of the audio signal of each object supplied from the encoding unit 91 in the SCE of the bit stream. That is, the encoded data is stored in some elements disposed later than the DSE in the bit stream.

As a result of above-described processing, with regard to the frames to be processed, the bit stream can be obtained, in which the priority information and the encoded data of the audio signals of all the channels, the priority information and the encoded data of the audio signals of all the objects, and the meta-data of all the objects are stored.

In STEP S20, the packing unit 24 outputs the obtained bit stream and ends the encoding processing.

As described above, the encoding device 11 generates the priority information of the audio signal of each channel and the priority information of the audio signal of each object, stores the priority information in the bit stream, and outputs the priority information. Therefore, in the decoding side, it is possible to simply ascertain which audio signal has a higher priority degree.

In this way, in the decoding side, it is possible to selectively perform the decoding of the encoded audio signal according to the priority information. As a result, it is possible to minimize the deterioration of the sound quality of the sound reproduced from the audio signal and decrease the amount of calculation for decoding.

Particularly, by storing the priority information of the audio signal of each object in the bit stream, in the decoding side, it is possible not only to decrease the amount of calculation for decoding but also to decrease the amount of calculation thereafter for the processing of rendering or the like.

Configuration Example of Decoding Device

Next, the decoding device will be described, to which the bit stream output from the encoding device 11 described above is input and which decodes the encoded data included in the bit stream.

Figure 9:
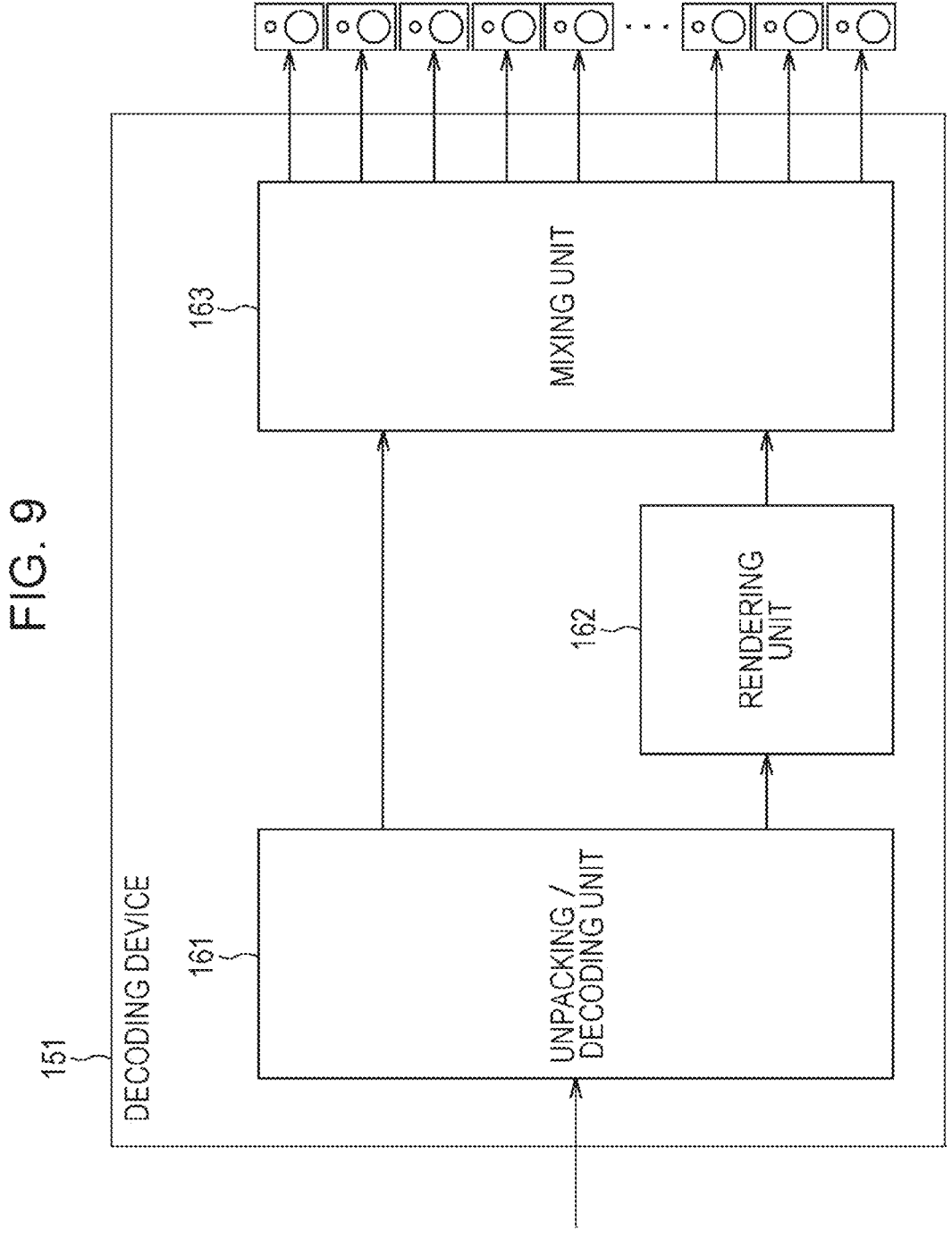
FIG. 9 is a diagram illustrating a configuration example of a decoding device.

Such a decoding device is configured, for example, as illustrated in FIG. 9.

The decoding device 151 illustrated in FIG. 9 includes an unpacking/decoding unit 161, a rendering unit 162, and a mixing unit 163.

The unpacking/decoding unit 161 acquires the bit stream output from the encoding device 11 and performs unpacking and decoding of the bit stream.

The unpacking/decoding unit 161 supplies the audio signal of each object obtained by the unpacking and decoding and the meta-data of each object to the rendering unit 162. At this time, the unpacking/decoding unit 161 performs the decoding of the encoded data of each object according to the priority information included in the bit stream.

In addition, the unpacking/decoding unit 161 supplies the audio signal of each channel obtained from the unpacking and decoding to the mixing unit 163. At this time, the unpacking/decoding unit 161 performs the decoding of the encoded data of each channel according to the priority information included in the bit stream.

The rendering unit 162 generates audio signals of M channels based on the audio signal of each object supplied from the unpacking/decoding unit 161 and the spatial position information as the meta-data of each object, and supplies the audio signals to the mixing unit 163. At this time, the rendering unit 162 generates the audio signals of each of the M channels in such a manner that a sound image of each object will be correctly positioned at the position indicated by the spatial position information of each object.

The mixing unit 163 performs weighted addition of the audio signal of each channel supplied from the unpacking/decoding unit 161 and the audio signal of each channel supplied from the rendering unit 162 for each channel, and then, generates a final audio signal of each channel. The mixing unit 163 supplies the final audio signal of each channel obtained as described above to the outside speaker corresponding to each channel to reproduce the sound.

Configuration Example of Unpacking/Decoding Unit

Figure 10:
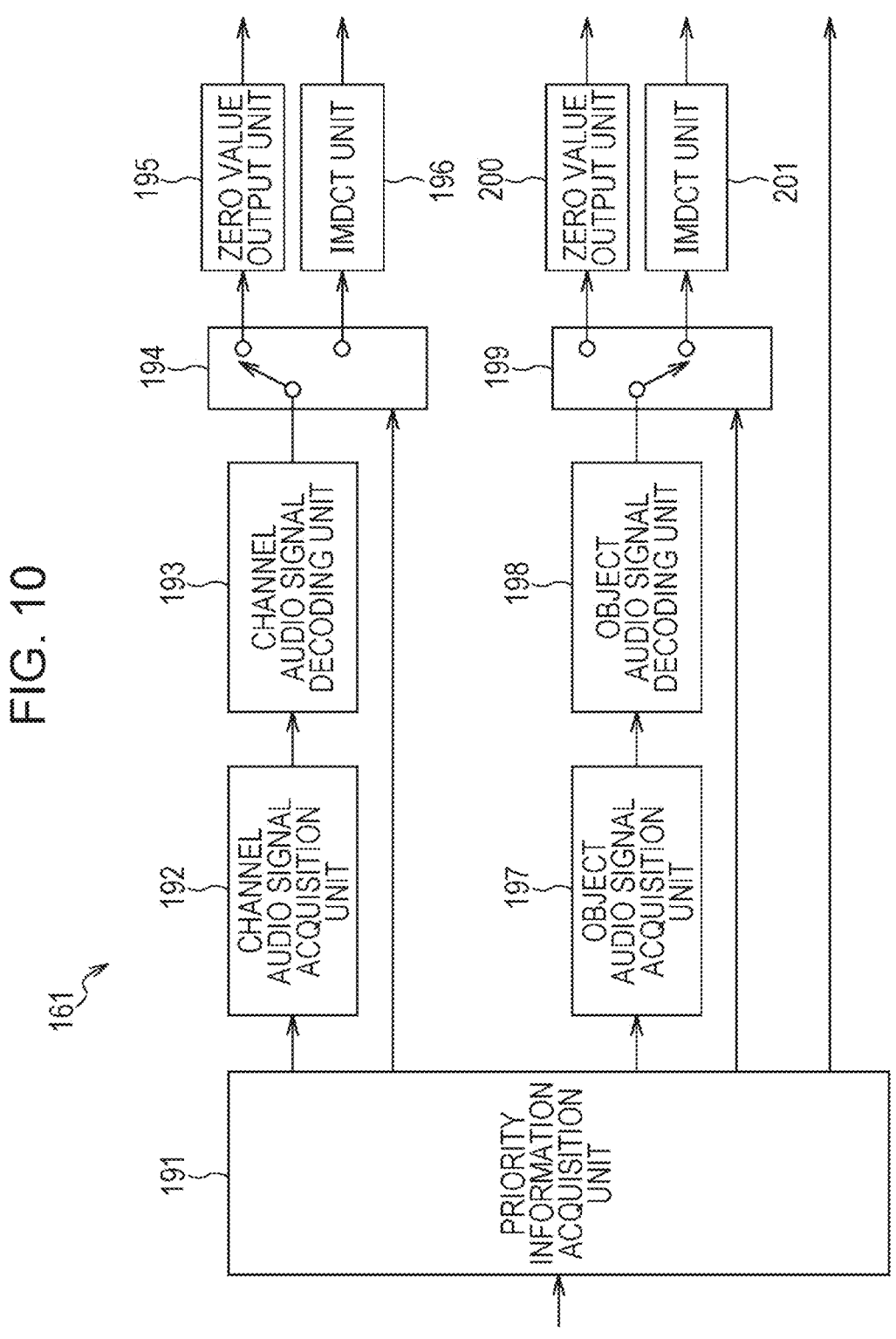
FIG. 10 is a configuration example of an unpacking/decoding unit.

In addition, more specifically, the unpacking/decoding unit 161 of the decoding device 151 illustrated in FIG. 9 is configured, for example, as illustrated in FIG. 10.

The unpacking/decoding unit 161 in FIG. 10 includes a priority information acquisition unit 191, a channel audio signal acquisition unit 192, a channel audio signal decoding unit 193, an output selection unit 194, a zero value output unit 195, an IMDCT unit 196, an object audio signal acquisition unit 197, an object audio signal decoding unit 198, an output selection unit 199, a zero value output unit 200, and an IMDCT unit 201.

The priority information acquisition unit 191 acquires the priority information of the audio signal of each channel from the supplied bit stream and supplies the priority information to the output selection unit 194, and acquires the priority information of the audio signal of each object from the bit stream and supplies the priority information to the output selection unit 199.

In addition, the priority information acquisition unit 191 acquires the meta-data of each object from the supplied bit stream and supplies the meta-data to the rendering unit 162, and supplies the bit stream to the channel audio signal acquisition unit 192 and the object audio signal acquisition unit 197.

The channel audio signal acquisition unit 192 acquires the encoded data of each channel from the bit stream supplied from the priority information acquisition unit 191 and supplies the encoded data to the channel audio signal decoding unit 193. The channel audio signal decoding unit 193 decodes the encoded data of each channel supplied from the channel audio signal acquisition unit 192 and supplies the MDCT coefficient obtained as the result of the decoding to the output selection unit 194.

The output selection unit 194 selectively switches the output destination of the MDCT coefficient of each channel supplied from the channel audio signal decoding unit 193 based on the priority information of each channel supplied from the priority information acquisition unit 191.

That is, in a case where the priority information of a predetermined channel is lower than a predetermined threshold value P, the output selection unit 194 supplies the MDCT coefficient of that channel to the zero value output unit 195 as a value zero. In addition, in a case where the priority information of a predetermined channel is equal to or higher than the predetermined threshold value P, the output selection unit 194 supplies the MDCT coefficient of that channel supplied from the channel audio signal decoding unit 193 to the IMDCT unit 196.

The zero value output unit 195 generates the audio signal based on the MDCT coefficient supplied from output selection unit 194 and supplies the audio signal to the mixing unit 163. In this case, since the MDCT coefficient is zero, a soundless audio signal is generated.

THE IMDCT unit 196 performs the IMDCT and generates the audio signal based on the MDCT coefficient supplied from the output selection unit 194, and supplies the audio signal to the mixing unit 163.

The object audio signal acquisition unit 197 acquires the encoded data of each object from the bit stream supplied from the priority information acquisition unit 191 and supplies the encoded data to the object audio signal decoding unit 198. The object audio signal decoding unit 198 decodes the encoded data of each object supplied from the object audio signal acquisition unit 197 and supplies the MDCT coefficient obtained from the result of the decoding to the output selection unit 199.

The output selection unit 199 selectively switches the output destination of the MDCT coefficient of each channel supplied from the object audio signal decoding unit 198 based on the priority information of each object supplied from the priority information acquisition unit 191.

That is, in a case where the priority information of a predetermined object is lower than a predetermined threshold value Q, the output selection unit 199 supplies the MDCT coefficient of that object to the zero value output unit 200 as a value zero. In addition, in a case where the priority information of a predetermined object is equal to or higher than the predetermined threshold value Q, the output selection unit 199 supplies the MDCT coefficient of that object supplied from the object audio signal decoding unit 198 to the IMDCT unit 201.

A value of the threshold value Q may be the same as the value of the threshold value P, or may be a value different from the threshold value P. By appropriately determining the threshold value P and the threshold value Q depending on the calculation ability or the like of the decoding device 151, it is possible to decrease the amount of calculation for decoding the audio signal down to the amount of calculation within the range within which the decoding device 151 can perform the decoding in real time.

The zero value output unit 200 generates the audio signal based on the MDCT coefficient supplied from output selection unit 199 and supplies the audio signal to the rendering unit 162. In this case, since the MDCT coefficient is zero, a soundless audio signal is generated.

THE IMDCT unit 201 performs the IMDCT and generates the audio signal based on the MDCT coefficient supplied from the output selection unit 199, and supplies the audio signal to the rendering unit 162.

<Description on Decoding Processing>

Next, an operation of the decoding device 151 will be described.

When the bit stream of one frame is supplied from the encoding device 11, the decoding device 151 performs the decoding processing and generates the audio signal, and outputs the audio signal to the speaker. Hereafter, the decoding processing performed by the decoding device 151 will be described referring to a flow chart in FIG. 11.

In STEP S51, the unpacking/decoding unit 161 acquires the bit stream transmitted from the encoding device 11. That is, the bit stream is received.

In STEP S52, the unpacking/decoding unit 161 performs a selective decoding processing.

The selective decoding processing will be described later in detail, however, in the selective decoding processing, the encoded data of each channel and the encoded data of each object are selectively decoded based on the priority information. Then, the audio signal of each channel obtained as a result of selective decoding is supplied to the mixing unit 163, and the audio signal of each object obtained as a result of selective decoding is supplied to the rendering unit 162. In addition, the meta-data of each object obtained from the bit stream is supplied to the rendering unit 162.

In STEP S53, the rendering unit 162 performs rendering of the audio signal of each object based on the audio signal of each object supplied from the unpacking/decoding unit 161 and the spatial position information as the meta-data of each object.

For example, the rendering unit 162 generates the audio signal of each channel by a vector base amplitude panning (VBAP) based on the spatial position information in such a manner that the sound image of each object is correctly positioned at the position indicated by the spatial position information, and supplies the audio signal to the mixing unit 163.

In STEP S54, the mixing unit 163 performs weighted addition of the audio signal of each channel supplied from the unpacking/decoding unit 161 and the audio signal of each channel supplied from the rendering unit 162 for each channel, and supplies the added audio signal to the outside speaker. In this way, the audio signal of each channel is supplied to each speaker corresponding to each channel, therefore, the sound being reproduced based on the audio signal supplied to each speaker.

When the audio signal of each channel is supplied to the speaker, the decoding processing ends.

As described above, the decoding device 151 acquires the priority information from the bit stream, and decodes the encoded data of each channel and each object according to the priority information.

<Description on Selective Decoding Processing>

Subsequently, the selective decoding processing corresponding to the processing in STEP S52 in FIG. 11 will be described referring to a flow chart in FIG. 12.

In STEP S81, the priority information acquisition unit 191 acquires the priority information of the audio signal of each channel and the priority information of the audio signal of each object from the supplied bit stream, and supplies each item of priority information item to the output selection unit 194 and the output selection unit 199 respectively.

In addition, the priority information acquisition unit 191 acquires the meta-data of each object from the bit stream and supplies the meta-data to the rendering unit 162, and supplies the bit stream to the channel audio signal acquisition unit 192 and the object audio signal acquisition unit 197.

In STEP S82, the channel audio signal acquisition unit 192 sets a channel number of 0 in the channel to be processed, and holds the channel number.

In STEP S83, the channel audio signal acquisition unit 192 determines whether or not the held channel number is less than the number of channels M.

In a case where, in STEP S83, the channel number is less than M, in STEP S84, the channel audio signal decoding unit 193 decodes the encoded data of the audio signal of the channel to be processed.

That is, the channel audio signal acquisition unit 192 acquires the encoded data of the channel subject to be processed from the bit stream supplied from the priority information acquisition unit 191, and supplies the encoded data to the channel audio signal decoding unit 193.

Then, the channel audio signal decoding unit 193 decodes the encoded data supplied from the channel audio signal acquisition unit 192, and supplies the MDCT coefficient obtained as a result of the decoding to the output selection unit 194.

In STEP S85, the output selection unit 194 determines whether or not the priority information of the channel subject to be processed supplied from the priority information acquisition unit 191 is equal to or higher than threshold value P specified by a control device on a higher level which is not illustrated. Here, the threshold value P is, for example, determined depending on the calculation capability of the decoding device 151.

In a case where it is determined, in STEP S85, that the priority information is equal to or higher than the threshold value P, the output selection unit 194 supplies the MDCT coefficient of the channel subject to be processed supplied from the channel audio signal decoding unit 193 to the IMDCT unit 196, and the process proceeds to STEP S86. In this case, the priority degree of the audio signal of the channel subject to be processed is equal to or higher than the predetermined priority degree.

Therefore, the decoding of that channel, more specifically, the IMDCT is performed.

In STEP S86, the IMDCT unit 196 performs the IMDCT based on the MDCT coefficient supplied from the output selection unit 194, and generates the audio signal of the channel subject to be processed and supplies the audio signal to the mixing unit 163.

After the audio signal being generated, the process proceeds to STEP S87.

On the other hand, in a case where it is determined, in STEP 585, that the priority information is lower than the threshold value P, the output selection unit 194 supplies the MDCT coefficient to the zero value output unit 195 as a zero value.

The zero value output unit 195 generates the audio signal of the channel subject to be processed from the MDCT coefficient of which the value is zero supplied from the output selection unit 194, and supplies the audio signal to the mixing unit 163.

Therefore, in the zero value output unit 195, no processing for generating the audio signal such as IMDCT is substantially performed.

The audio signal generated by the zero value output unit 195 is a soundless signal. After the audio signal being generated, the process proceeds to STEP S87.

If it is determined, in STEP S85, that the priority information is lower than the threshold value P or the audio signal is generated in STEP 386, in STEP S87, the channel audio signal acquisition unit 192 adds one to the held channel number to update the channel number of the channel subject to be processed.

After the channel number being updated, the process returns to STEP S83, and the processing described above is repeatedly performed. That is, the audio signal of a new channel subject to be processed is generated.

In addition, in a case where, in STEP S83, it is determined that the channel number of the channel subject to be processed is not less than M, since the audio signals of all the channels have been obtained, the process proceeds to STEP S88.

In STEP S88, the object audio signal acquisition unit 191 sets an object number as 0 to the object subject to be processed, and holds the object number.

In STEP 389, the object audio signal acquisition unit 197 determines whether or not the held object number is less than the number of objects N.

In a case where, in STEP S89, it is determined that the object number is less than N, in STEP S90, the object audio signal decoding unit 198 decodes the encoded data of the audio signal of the object to be processed.

That is, the object audio signal acquisition unit 197 acquires the encoded data of the object subject to be processed from the bit stream supplied from the priority information acquisition unit 191, and supplies the encoded data to the object audio signal decoding unit 198.

Then, the object audio signal decoding unit 198 decodes the encoded data supplied from the object audio signal acquisition unit 197, and supplies the MDCT coefficient obtained as a result of the decoding to the output selection unit 199.

In STEP S91, the output selection unit 199 determines whether or not the priority information of the object subject to be processed supplied from the priority information acquisition unit 191 is equal to or higher than the threshold value Q specified by a control device on a higher level which is not illustrated. Here, the threshold value Q is, for example, determined depending on the calculation capability of the decoding device 151.

In a case where it is determined, in STEP S91, that the priority information is equal to or higher than the threshold value Q, the output selection unit 199 supplies the MDCT coefficient of the object subject to be processed supplied from the object audio signal decoding unit 198 to the IMDCT unit 201, and the process proceeds to STEP S92.

In STEP S92, the IMDCT unit 201 performs the IMDCT based on the MDCT coefficient supplied from the output selection unit 199, and generates the audio signal of the object subject to be processed and supplies the audio signal to the rendering unit 162. After the audio signal is generated, the process proceeds to STEP S93.

On the other hand, in a case where it is determined, in STEP S91, that the priority information is lower than the threshold value Q, the output selection unit 199 supplies the MDCT coefficient to the zero value output unit 200 as a zero value.

The zero value output unit 200 generates the audio signal of the object subject to be processed from the MDCT coefficient of which the value is zero supplied from the output selection unit 199, and supplies the audio signal to the rendering unit 162. Therefore, in the zero value output unit 200, no processing for generating the audio signal such as IMDCT is substantially performed.

The audio signal generated by the zero value output unit 200 is a soundless signal. After the audio signal is generated, the process proceeds to STEP S93.

If it is determined that the priority information is lower than the threshold value Q in STEP S91 or the audio signal is generated in STEP S92, in STEP S93, the object audio signal acquisition unit 197 adds one to the held object number to update the object number of the object subject to be processed.

After the channel number being updated, the process returns to STEP S89, and the processing described above is repeatedly performed. That is, the audio signal of a new object subject to be processed is generated.

Figure 11:
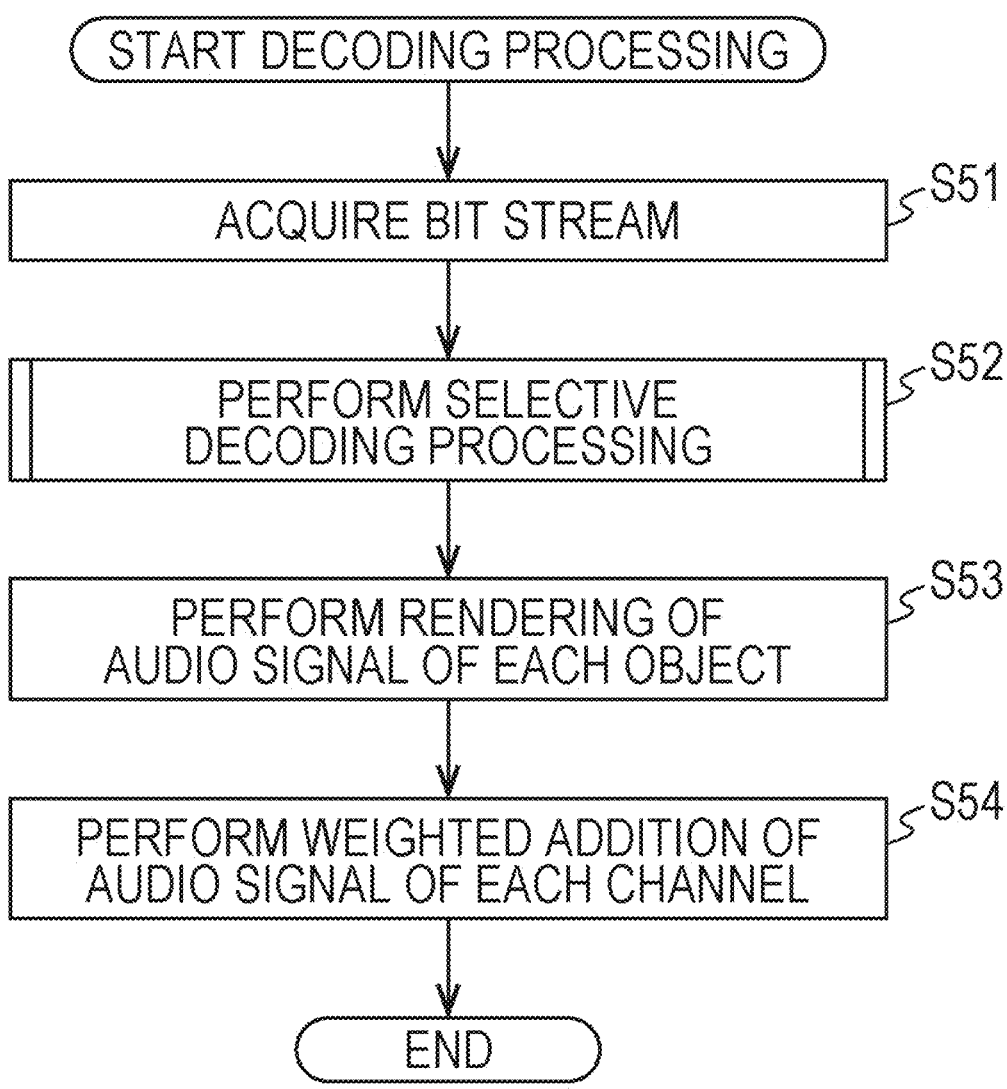
FIG. 11 is a flow chart explaining decoding processing.

In addition, in a case where, in STEP S89, it is determined that the channel number of the channel subject to be processed is not less than M, since the audio signals of all the channels and all the objects have been obtained, the selective decoding processing ends, and then, the process proceeds to STEP S53 in FIG. 11.

As described above, the decoding device 151 compares the priority information and the threshold value of each channel and each object, and decodes the encoded audio signal with determining whether or not to perform the decoding of the encoded audio signal for each channel and each object of the frame to be processed.

That is, in the decoding device 151, only the predetermined number of encoded audio signals depending on the priority information of each audio signal are decoded, and the remaining audio signals are not decoded.

In this way, to match the reproduction environment, only the audio signal having the high priority degree can be selectively decoded. Therefore, it is possible to minimize the deterioration of the sound quality of the sound reproduced from the audio signal and decrease the amount of calculation for decoding.

Furthermore, the decoding of the encoded audio signal is performed based on the priority information of the audio signal of each object. Therefore, it is possible to decrease not only the amount of calculation for decoding the audio signal but also the amount of calculation for the processing thereafter such as the processing in the rendering unit 162.

Modification Example 1 of First Embodiment

PRIORITY INFORMATION

In the above description, one priority information item is generated with respect to one audio signal of each channel and each object. However, a plurality of priority information items may be generated.

In this case, for example, a plurality of priority information items can be generated for every calculation capability according to the amount of calculation for decoding, that is, the calculation capability at the decoding side.

Specifically, for example, the priority information items for the device having the calculation capability equivalent to two channels are generated based on the amount of calculation for decoding the audio signals equivalent to two channels in real time.

In the priority information items for the device equivalent to two channels, for example, among all the audio signals, the priority information items are generated such that the number of audio signals becomes large, to which the low priority degree, that is, the value close to 0 is assigned as the priority information.

In addition, for example, the priority information items for the device having the calculation capability equivalent to 24 channels are also generated based on the amount of calculation for decoding the audio signals equivalent to 24 channels in real time. In the priority information items for the device equivalent to 24 channels, for example, among all the audio signals, the priority information items are generated such that the number of audio signals becomes large, to which the high priority degree, that is, the value close to 7 is assigned as the priority information.

In this case, for example, the priority information generation unit 52, in STEP S11 in FIG. 8, generates the priority information items for the device equivalent to two channels with respect to the audio signal of each channel and adds an identifier indicating that the priority information items are for the device equivalent to two channels to the priority information items, and then, supplies the priority information items to the packing unit 24.

Furthermore, the priority information generation unit 52, in STEP S11, generates the priority information items for the device equivalent to 24 channels with respect to the audio signal of each channel and adds an identifier indicating that the priority information items are for the device equivalent to 24 channels to the priority information items, and then, supplies the priority information items to the packing unit 24.

Similarly, the priority information generation unit 92, in STEP S13 in FIG. 8, also generates the priority information items for the device equivalent to two channels and the priority information items for the device equivalent to 24 channels and adds the identifier, and then, supplies the priority information items to the packing unit 24.

In this way, for example, a plurality of priority information items are obtained according to the calculation capability of the reproduction devices such as a portable audio player, a multi-functional mobile phone, a tablet-type computer, a television receiver, a personal computer, and high-quality audio equipment.

For example, the calculation capability of reproduction devices such as a portable audio player is relatively low. Therefore, in such a reproduction device, if the encoded audio signal is decoded based on the priority information items for the device equivalent to two channels, it is possible to perform the reproduction of the audio signals in real time.

As described above, in a case where a plurality of priority information items are generated with respect to one audio signal, in the decoding device 151, for example, the priority information acquisition unit 191 is instructed by a control device on a higher level to determine which priority information among the plurality of priority information items will be used for performing the decoding. The instruction to determine which priority information will be used is performed by supplying, for example, the identifier.

A determination that which priority information of the identifier will be used may be made in advance for each decoding device 151.

Figure 12:
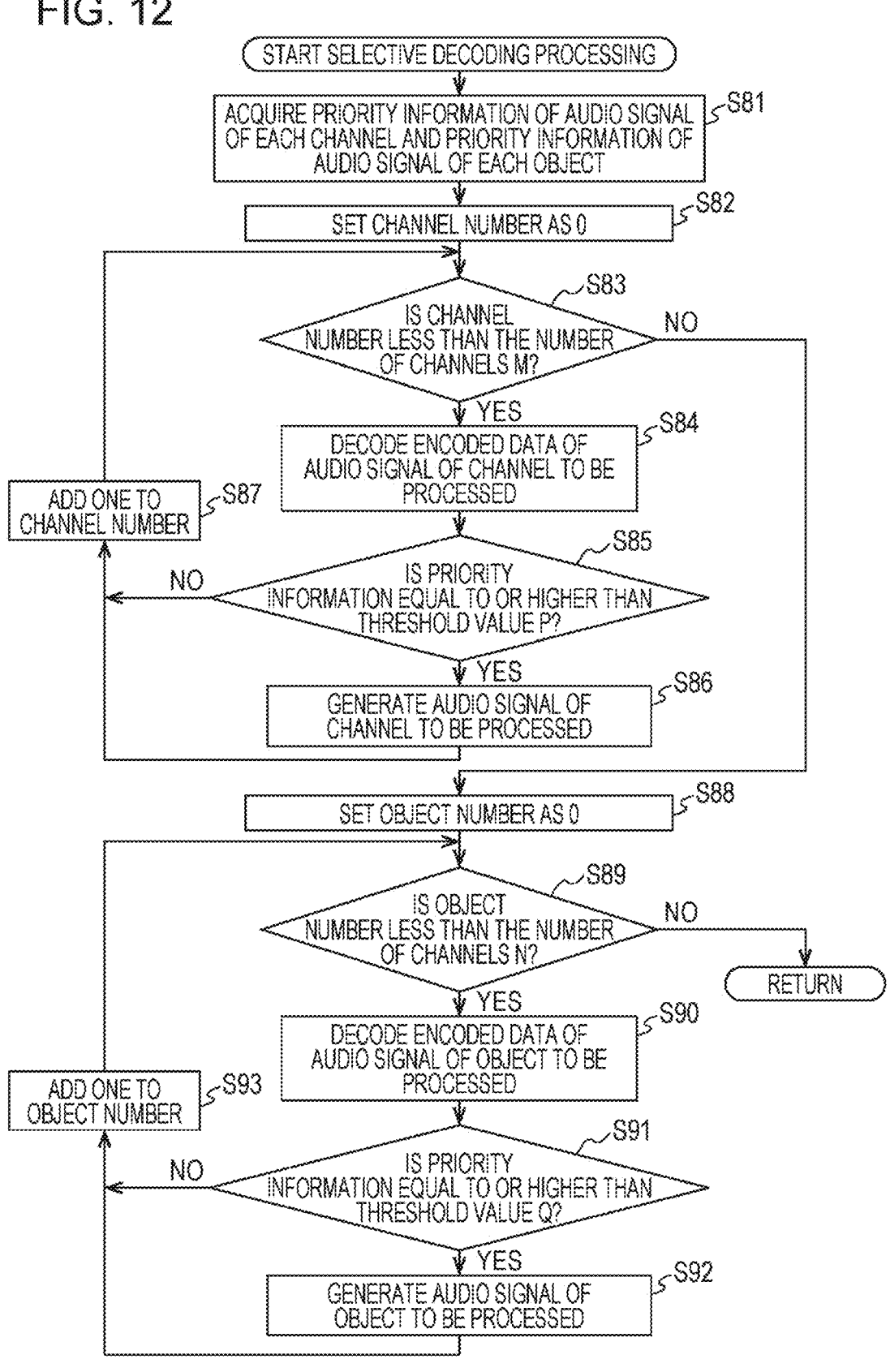
FIG. 12 is a flow chart explaining selective decoding processing.

For example, in the priority information acquisition unit 191, in a case where which priority information on the identifier to use is determined in advance, or in a case where the identifier is designated by the control device on a higher level, in STEP S81 in FIG. 12, the priority information acquisition unit 191 acquires the priority information to which the determined identifier is added. Then, the acquired priority information is supplied to the output selection unit 194 or the output selection unit 199 from the priority information acquisition unit 191.

In other words, among a plurality of the priority information items stored in the bit stream, one appropriate priority information item is selected according to the calculation capability of the decoding device 151, specifically, of the unpacking/decoding unit 161.

In this case, different identifiers may be used in the priority information of each channel and the priority information of each object, and the priority information may be read from the bit stream.

As described above, by selectively acquiring a specific priority information item among a plurality of priority information items included in a bit stream, it is possible to select appropriate priority information according to the calculation capability of the decoding device 151, and to perform decoding. In this way, it is possible to reproduce the audio signal in real time in any of the decoding devices 151.

Second Embodiment

Configuration Example of Unpacking/Decoding Unit

In the above description, an example in which the priority information is included in the bit stream output from the encoding device 11 is described. However, depending on the encoding devices, the priority information may or may not be included in the bit stream.

Therefore, the priority information may be generated in the decoding device 151. For example, the priority information can be generated using the information indicating the sound pressure of the audio signal or the information indicating the spectral shape that can be extracted from the encoded data of the audio signal included in the bit stream.

Figure 13:
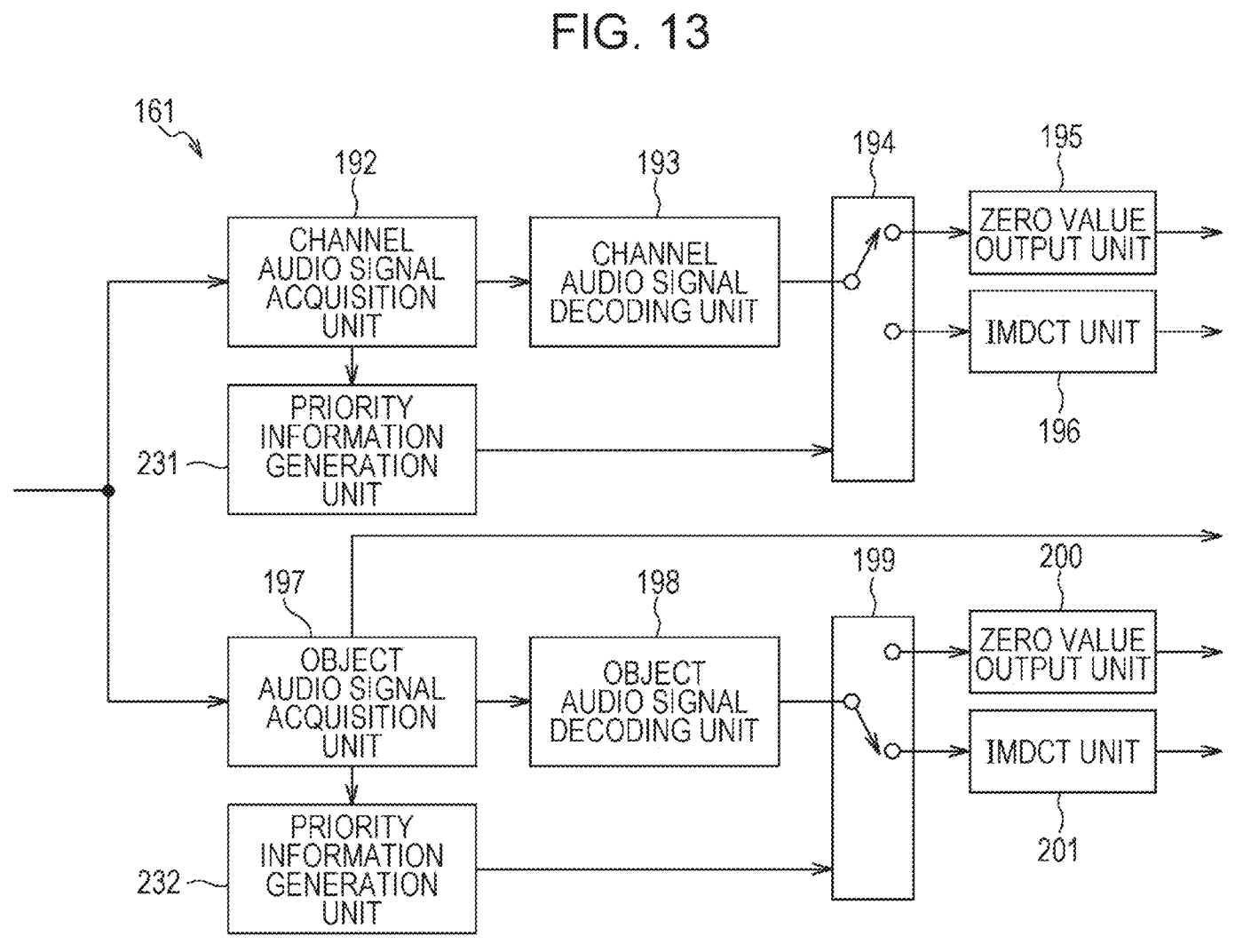

In a case where the priority information is generated in the decoding device 151 as described above, the unpacking/decoding unit 161 of the decoding device 151 is, for example, configured as illustrated in FIG. 13. In FIG. 13, the same reference signs are given to the elements corresponding to the case in FIG. 10 and the description thereof will not be repeated.

The unpacking/decoding unit 161 in FIG. 13 includes the channel audio signal acquisition unit 192, the channel audio signal decoding unit 193, the output selection unit 194, the zero value output unit 195, the IMDCT unit 196, the object audio signal acquisition unit 197, the object audio signal decoding unit 198, the output selection unit 199, the zero value output unit 200, the IMDCT unit 201, a priority information generation unit 231, and a priority information generation unit 232.

A configuration of the unpacking/decoding unit 161 illustrated in FIG. 13 is different from the unpacking/decoding unit 161 illustrated in FIG. 10 in that the priority information generation unit 231 and the priority information generation unit 232 are newly provided without providing the priority information acquisition unit 191, and other configurations are the same as the unpacking/decoding unit 161 in FIG. 10.

The channel audio signal acquisition unit 192 acquires the encoded data of each channel from the supplied bit stream and supplies the encoded data to the channel audio signal decoding unit 193 and the priority information generation unit 231.

The priority information generation unit 231 generates the priority information of each channel based on the encoded data of each channel supplied from the channel audio signal acquisition unit 192, and supplies the priority information to the output selection unit 194.

The object audio signal acquisition unit 197 acquires the encoded data of each object from the supplied bit stream and supplies the encoded data to the object audio signal decoding unit 198 and the priority information generation unit 232. In addition, the object audio signal acquisition unit 197 acquires the meta-data of each object from the supplied bit stream and supplies the meta-data to the rendering unit 162.

The priority information generation unit 232 generates the priority information of each object based on the encoded data of each object supplied from the object audio signal acquisition unit 197, and supplies the priority information to the output selection unit 199.

<Description on Selective Decoding Processing>

Figure 14:
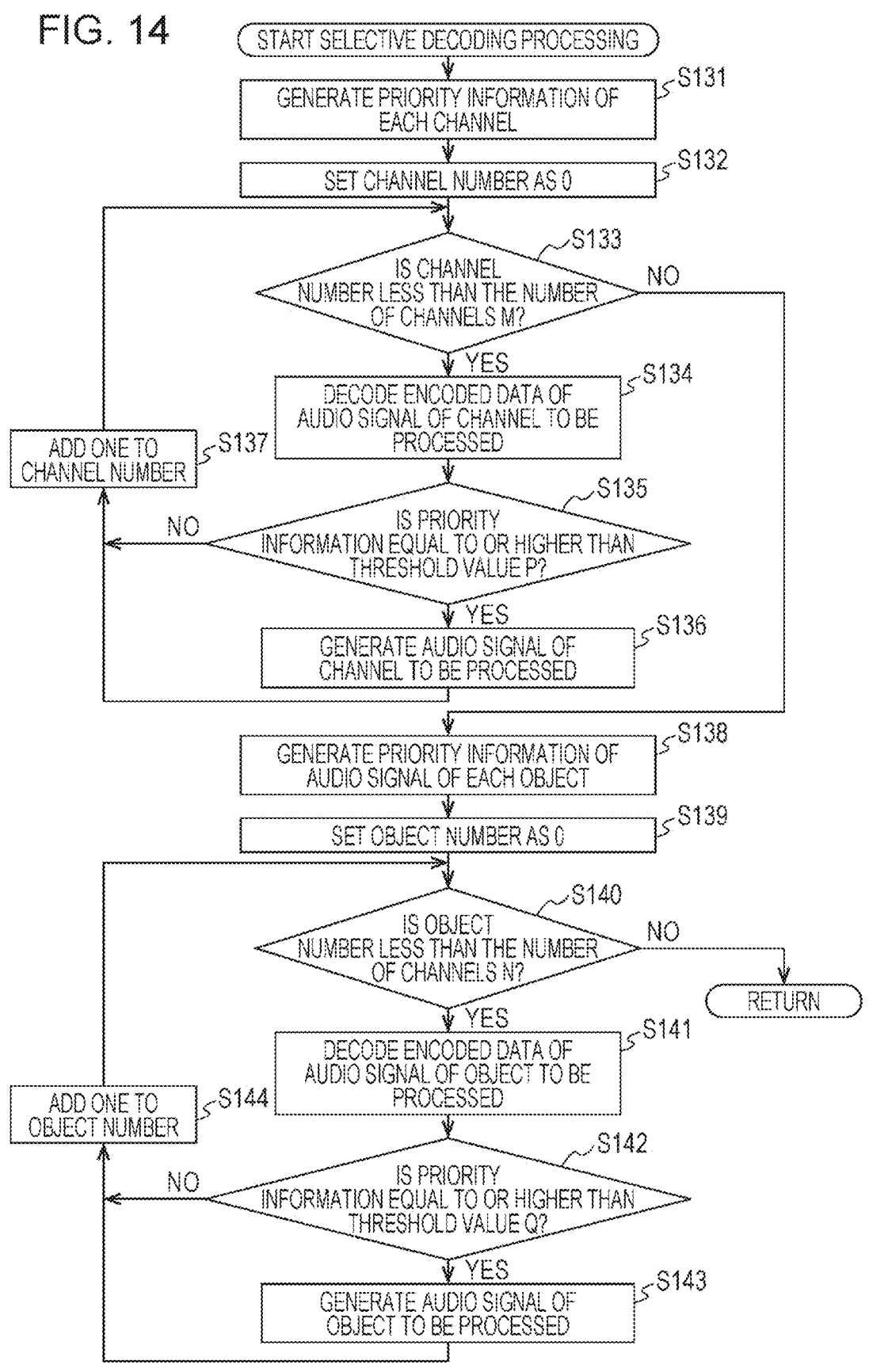
FIG. 14 is a flow chart explaining the selective decoding processing.

In a case where the unpacking/decoding unit 161 is configured as illustrated in FIG. 13, the decoding device 151 performs the selective decoding processing illustrated in FIG. 14 as the processing corresponding to STEP S52 of the decoding processing illustrated in FIG. 11. Hereinafter, the selective decoding processing by the decoding device 151 will be described referring to a flow chart in FIG. 14.

In STEP S131, the priority information generation unit 231 generates the priority information of each channel.

For example, the channel audio signal acquisition unit 192 acquires the encoded data of each channel from the supplied bit stream, and supplies the encoded data to the channel audio signal decoding unit 193 and the priority information generation unit 231.

The priority information generation unit 231 generates the priority information of each channel based on the encoded data of each channel supplied from the channel audio signal acquisition unit 192, and supplies the priority information to the output selection unit 194.

For example, in the bit stream, a scale factor for obtaining the MDCT coefficient, side information, and a quantized spectrum are included as the encoded data of the audio signal. Here, the scale factor is information for indicating the sound pressure of the audio signal and the quantized spectrum is information indicating the spectral shape of the audio signal.

The priority information generation unit 231 generates the priority information of the audio signal of each channel based on the scale factor and the quantized spectrum included as the encoded data of each channel. If the priority information is generated using the scale factor and the quantized spectrum like this, the priority information can immediately obtained before performing the decoding of the encoded data, and thus, it is possible to decrease the amount of calculation for generating the priority information.

Additionally, the priority information may be generated based on the sound pressure of the audio signal which can be obtained by calculating a root-mean-square value of the MDCT coefficient or based on the spectral shape of the audio signal which can be obtained from the peak envelope of the MDCT coefficient. In this case, the priority information generation unit 231 appropriately performs the decoding of the encoded data or acquires the MDCT coefficient from the channel audio signal decoding unit 193.

After the priority information of each channel being obtained, the processing tasks from STEP S132 to STEP S137 are performed, but those processing tasks are the same as the processing tasks from STEP S82 to STEP S87 in FIG. 12. Accordingly, the description thereof will not be repeated. However, in this case, since the encoded data of each channel has been acquired already, only the decoding of the encoded data is performed in STEP S134.

In addition, in a case where it is determined that the channel number is not less than M in STEP S133, the priority information generation unit 232 generates the priority information of the audio signal of each object in STEP S138.

For example, the object audio signal acquisition unit 197 acquires the encoded data of each object from the supplied bit stream, and supplies the encoded data to the object audio signal decoding unit 198 and the priority information generation unit 232. In addition, the object audio signal acquisition unit 197 acquires the meta-data of each object from the supplied bit stream and supplies the meta-data to the rendering unit 162.

The priority information generation unit 232 generates the priority information of each object based on the encoded data of each object supplied from the object audio signal acquisition unit 197, and supplies the priority information to the output selection unit 199. For example, similarly to the case of each channel, the priority information is generated based on the scale factor and the quantized spectrum.

In addition, the priority information may be generated based on the sound pressure or the spectral shape obtained from the MDCT coefficient. In this case, the priority information generation unit 232 appropriately performs the decoding of encoded data or acquires the MDCT coefficient from the object audio signal decoding unit 198.

After the priority information of each object being obtained, the processing tasks from STEP S139 to STEP S1144 are performed and selective decoding processing ends. However, those processing tasks are the same as the processing tasks from STEP S88 to STEP S93 in FIG. 12. Accordingly, the description thereof will not be repeated. However, in this case, since the encoded data of each object has been acquired already, only the decoding of the encoded data is performed in STEP S141.

After the selective decoding processing ends, the process proceeds to STEP 353 in FIG. 11.

As described above, the decoding device 151 generates the priority information of the audio signal of each channel and each object based on the encoded data included in the bit stream. By being generated the priority information in the decoding device 151 like this, it is possible to obtain the appropriate priority information of each audio signal with a small amount of calculation, and thus, it is possible to decrease the amount of calculation for decoding or the amount of calculation for rendering. In addition, it is also possible to minimize the deterioration of the sound quality of the sound reproduced from the audio signal.

In a case where the priority information acquisition unit 191 of the unpacking/decoding unit 161 illustrated in FIG. 10 tries to acquire the priority information of the audio signal of each channel and each object from the supplied bit stream, but the case where the priority information may not be obtained from the bit stream, the priority information may be generated. In this case, the priority information acquisition unit 191 performs the processing similar to that of the priority information generation unit 231 or the priority information generation unit 232, and generates the priority information of the audio signal of each channel and each object from the encoded data.

Third Embodiment

<Threshold Value of Priority Information>

Furthermore, in the description above, with regard to each channel and each object, the audio signal to be decoded, specifically the MDCT coefficient on which IMDCT is to be performed is selected by comparing the priority information to the threshold value P or the threshold value Q. However, the threshold value P or the threshold value Q may be dynamically changed for each frame of the audio signal.

For example, in the priority information acquisition unit 191 of the unpacking/decoding unit 161 illustrated in FIG. 10, the priority information of each channel and each object can be acquired from the bit stream without performing the decoding.

Therefore, for example, the priority information acquisition unit 191 can obtain a distribution of the priority information of the frame subject to be processed, without reading out the priority information of the audio signals of all the channels.

In addition, the decoding device 151 knows its own calculation capability in advance, for example, such as how many channels can be processed simultaneously, that is, in real time.

Therefore, the priority information acquisition unit 191 may determine the threshold value P of the priority information with regard to the frame subject to be processed based on the distribution of the priority information in the frame subject to be processed and the calculation capability of the decoding device 151.

For example, the threshold value P is determined such that the largest number of audio signals can be decoded within the range of the processing being performed in real time by the decoding device 151.

In addition, the priority information acquisition unit 191 can dynamically determine the threshold value Q similarly to the case of the threshold value P. In this case, the priority information acquisition unit 191 obtains the distribution of the priority information based on the priority information of the audio signal of all the objects, and determines the threshold value Q of the priority information with regard to the frame subject to be processed based on the obtained distribution and the calculation capability of the decoding device 151.

It is possible to perform determination of the threshold value P or the threshold value Q with a comparatively small amount of calculation.

In this way, by dynamically changing the threshold values of the priority information, the decoding can be performed in real time and it is possible to minimize the deterioration of the sound quality of the sound reproduced from the audio signal.

Particularly, in this case, it is not necessary to prepare a plural number of priority information items or it is not necessary to provide the identifier for the priority information.

Therefore, an amount of code of the bit stream can also be reduced.

<Meta-Data of Object>

Furthermore, in the first embodiment to the third embodiment described above, the meta-data and the priority information of the object for one frame, or the like are stored in the head element of the bit stream.

In this case, in the head element of the bit stream, a syntax of the part where the meta-data and the priority information of the object are stored is the same as illustrated in FIG. 15, for example.

In the example in FIG. 15, in the meta-data of the object, the spatial position information and the priority information of the object of only one frame are stored.

In this example, "num_objects" indicates the number of objects.

In addition, "object_priority[0]" indicates the priority information of a $0^{th}$ object. Here, the 0th object means an object specified by an object number.

"Position_azimuth[0]" indicates a horizontal angle that represents the three-dimensional spatial position of the $0^{th}$ object seen from the user who is a listener, that is, seen from a predetermined reference position. In addition, "position_elevation[0]" indicates a vertical angle that represents the three-dimensional spatial position of the 0th object seen from the user who is a listener. Furthermore, "position_radius[0]" indicates a distance from the listener to the $0^{th}$ object.

Therefore, the position of the object in three-dimensional space is specified by these "position_azimuth[0]", "position_elevation[0]", and "position_radius[0]". In this way, these information items are the spatial position information items of the object.

In addition, a "gain_factor[0]" indicates a gain of the $0^{th}$ object.

In this way, in the meta-data illustrated in FIG. 15, "object_priority[0]", "position_azimuth[0]", "position_elevation[0]", "position_radius[0]", and "gain_factor[0]" with regard to the object are disposed in order as the data of the object. Then, in the meta-data, the data items of each object are disposed in an array, for example, in an order of the object number of the object.

Fourth Embodiment

<Noise due to Complete Reconfiguration and Discontinuity of Audio Signal>

In the description above, the example is described, in which the amount of processing at the time of decoding is reduced by omitting the decoding of IMDCT or the like in a case where the priority information of each frame (hereafter, particularly referred to time frame) for each channel or each object read out from the bit stream in the decoding device 151 is lower than the predetermined threshold value. Specifically, in a case where the priority information is lower than the threshold value, a soundless audio signal, that is, the zero data is output from the zero value output unit 195 or the zero value output unit 200 as the audio signal.

However, in this case, sound quality deterioration occurs when listening. Specifically, there occurs the sound quality deterioration due to the complete reconfiguration of the audio signal and the sound quality deterioration due to noise such as a glitch noise caused by a discontinuity of the signal.

<Sound Quality Deterioration Due to Complete Reconfiguration>

For example, when the zero data is output as the audio signal in a case where the priority information is lower than the threshold value, the sound quality deterioration occurs at the time of switching the output of the zero data and the output of the ordinary audio signal which is not the zero data.

As described above, in the unpacking/decoding unit 161, the IMDCT is performed with respect to the MDCT coefficient for each time frame read out from the bit stream in the IMDCT unit 196 or the IMDCT unit 201. Specifically, in the unpacking/decoding unit 161, the audio signal of the present time frame is generated from the result of the IMDCT or the zero data with regard to the present time frame and the result of the IMDCT or the zero data with regard to the time frame before one time frame.

Here, the generation of the audio signal will be described referring to FIG. 16. Here, the generation of the audio signal of the object is described as an example. However, the generation of the audio signal of each channel is the same. In addition, in the description below, the audio signal output from the zero value output unit 200 and the audio signal output from the IMDCT unit 201 are also particularly referred to as an IMDCT signal. Similarly, the audio signal output from the zero value output unit 195 and the audio signal output from the IMDCT unit 196 are also particularly referred to as an IMDCT signal.

Figure 16:
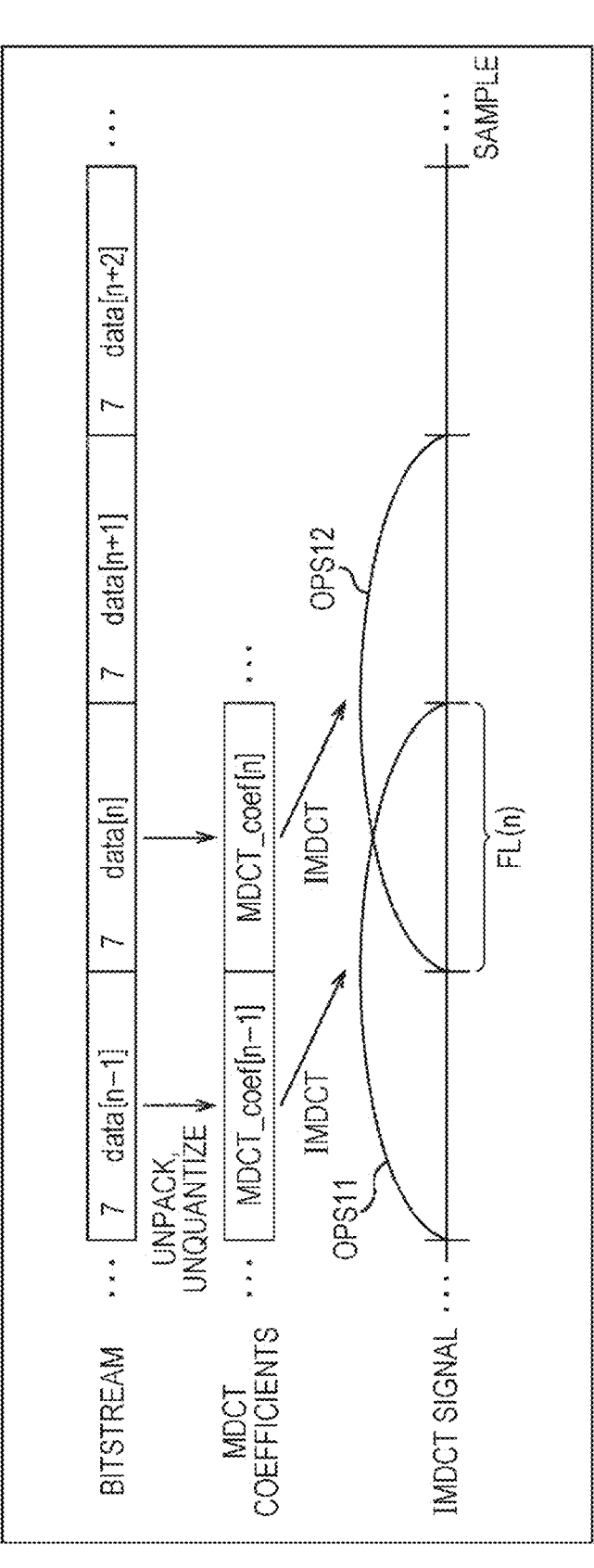
FIG. 16 is a diagram explaining generation of an audio signal.

In FIG. 16, the horizontal direction indicates the time and rectangles labeled "data[n−1]" to "data[n+2]" respectively represent the bit stream of the time frame (n−1) to the time frame (n+2) of a predetermined object. In addition, the value in the bit stream of each time frame indicates the value of the priority information of the object of that time frame. In this example, the value of the priority information of the frame is 7.

Furthermore, rectangles labeled "MDCT_coef[q]" (q=n−1, n, . . . ) in FIG. 16 represent the MDCT coefficients of the time frame (q), respectively.

Now, if the threshold value Q is equal to 4, the value of the priority information of "7" of the time frame (n−1) is equal to or higher than the threshold value Q. Therefore, the IMDCT is performed with respect to the MDCT coefficient of the time frame (n−1). Similarly, the value of the priority information of "7" of the time frame (n) is also equal to or higher than the threshold value Q. Therefore, the IMDCT is performed with respect to the MDCT coefficient of the time frame (n).

As a result, an IMDCT signal OPS11 of the time frame (n−1) and an IMDCT signal OPS12 of the time frame (n) are obtained.

In this case, the unpacking/decoding unit 161 sums the former half of the IMDCT signal OPS12 of the time frame (n) and the latter half of the IMDCT signal OPS11 of the time frame (n−1) which is one time frame before the time frame (n), and obtains an audio signal of time frame (n), that is, an audio signal of a period FL (n). In other words, a part of IMDCT signal OPS11 in the period FL (n) and a part of IMDCT signal OPS12 in the period FL (n) are overlappingly added, and the audio signal of time frame (n) before the encoding of the object subject to be processed is reproduced.

Such processing is the processing necessary for the IMDCT signal to be completely reconfigured to the signal or before the MDCT.

However, in the unpacking/decoding unit 161 described above, for example, as illustrated in FIG. 17, at the timing when the IMDCT signal of the IMDCT unit 201 and the IMDCT signal of the zero value output unit 200 are switched according to the priority information of each time frame, the IMDCT signal is not completely reconfigured to the signal before the MDCT. That is, if the zero data is used instead of the original signal at the time of overlap-addition, the signal is not completely reconfigured. Therefore, the original signal is not reproduced, and the sound quality when listening of the audio signal deteriorates.

Figure 17:
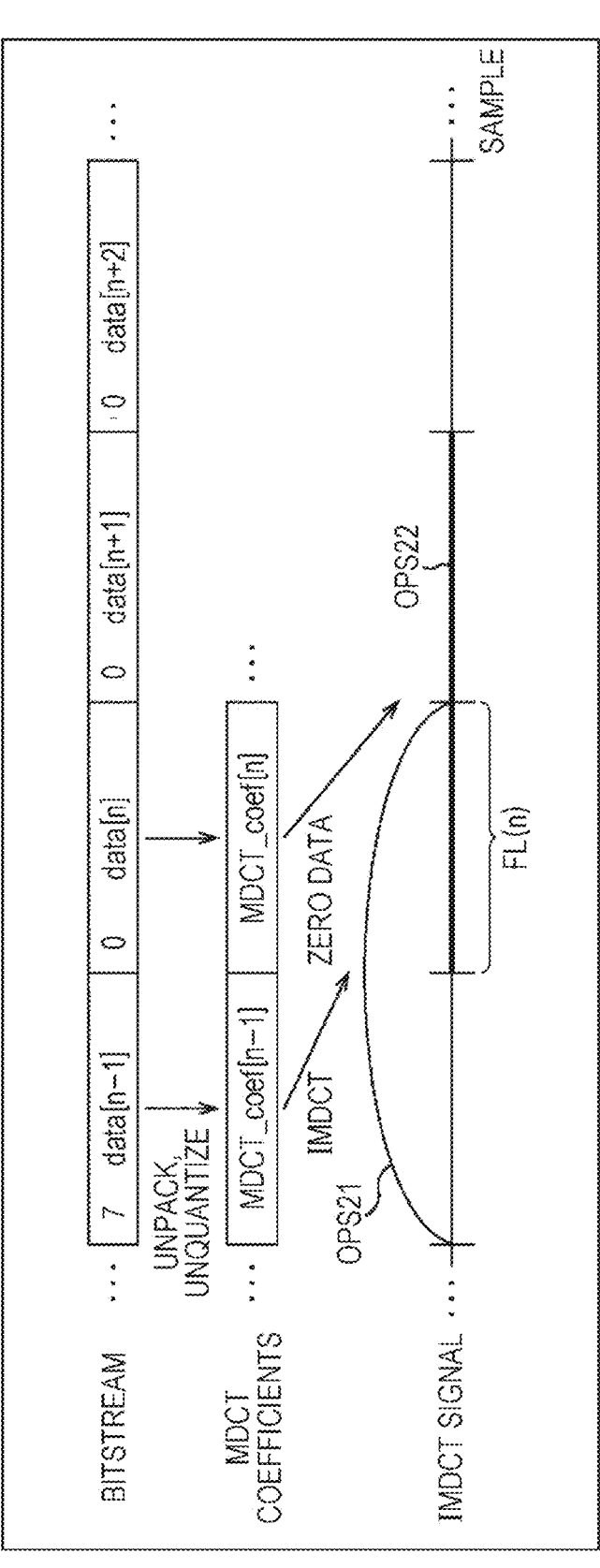
FIG. 17 is a diagram explaining generation of an audio signal.

In an example of FIG. 17, parts corresponding to the case in FIG. 16 are written in the same letter, and the description thereof will not be repeated.

In FIG. 17, the value of the priority information of the time frame (n−1) is "7", but the priority information items of the time frame (n) to the time frame (n+2) are the lowest "0".

Therefore, if the threshold value Q is 4, the IMDCT with regard to the frame (n−1) is performed with respect to the MDCT coefficient by the IMDCT unit 201, and then, the IMDCT signal OPS21 of the time frame (n−1) is obtained. On the other hand, the IMDCT with regard to the time frame (n) is not performed with respect to the MDCT coefficient, the zero data output from the zero value output unit 200 becoming the IMDCT signal OPS22 of the time frame (n).

In this case, the former half of the zero data which is the IMDCT signal OPS22 of the time frame (n) and the latter half of the IMDCT signal OPS21 of the time frame (n−1) which is one frame before the time frame (n) are summed, and the result becomes the final audio signal of the time frame (n). That is, parts of the IMDCT signal OPS22 and the IMDCT signal OPS2l in the period FL (n) are overlappingly added, and the result becomes the final audio signal of the time frame (n) of the object subject to be processed.

In this way, when the output source of the IMDCT signal is switched from the IMDCT unit 201 to the zero value output unit 200 or switched from the zero value output unit 200 to the IMDCT unit 201, the IMDCT signal from the IMDCT unit 201 not being completely reconfigured, the deterioration of the sound quality when listening occurs.

<The Sound Quality Deterioration Due to Generation of Noise Caused by Discontinuity>

In addition, in a case where the output source of the IMDCT signal is switched from the IMDCT unit 201 to the zero value output unit 200 or switched from the zero value output unit 200 to the IMDCT unit 201, since the signal is not completely reconfigured, in some cases, the signal is discontinuous in a connection portion of the IMDCT signal obtained from the IMDCT and the IMDCT signal which becomes the zero data. As a result, the glitch noise occurs at the connection portion, and sound quality deterioration when listening to the audio signal occurs.

Furthermore, in order to improve the sound quality in the unpacking/decoding unit 161, there is a case where spectral band replication (SBR) processing or the like is performed with respect to the audio signal obtained by overlappingly adding the IMDCT signals output from the IMDCT unit 201 and the zero value output unit 200.

Various processing tasks can be considered for the processing subsequent to the IMDCT unit 201 or the zero value output unit 200, and hereinafter, the description will be continued with SBR as an example.

In SBR, a high frequency component of the original audio signal before the encoding is generated from the audio signal of a low frequency component obtained by the overlapping addition and a high frequency power value stored in a bit stream.

Specifically, the audio signal of one frame is divided into a few sections called time slots, and the audio signal of each time slot is band-divided into a signal (hereafter, referred to as low frequency sub-band signal) of a plurality of low frequency sub-bands.

Then, a signal of each sub-band of high frequency (hereinafter, referred to as a high frequency sub-band signal) is generated based on the low frequency sub-band signal of each sub-band and the power value of each sub-band in the high frequency side.

For example, a target high frequency sub-band signal is generated by adjusting the power of a low frequency sub-band signal of a predetermined sub-band by the power value of the target sub-band of high frequency, or by shifting the frequency thereof.

Furthermore, the high frequency sub-band signal and the low frequency sub-band signal are synthesized, the audio signal including the high frequency component is generated, and the audio signal including the high frequency component generated for each time slot are combined, and the result becomes the audio signal of one time frame including the high frequency component.

In a case where such an SBR is performed in the stage subsequent to the IMDCT unit 201 or the zero value output unit 200, with regard to the audio signal made from the IMDCT signal output from the IMDCT unit 201, the high frequency component is generated by the SBR. Incidentally, since the IMDCT signal output from the zero value output unit 200 is the zero data, with regard to the audio signal made from the IMDCT signal output from the zero value output unit 200, the high frequency component obtained by the SBR is also the zero data.

Then, when the output source of the IMDCT signal is switched from the IMDCT unit 201 to the zero value output unit 200 or switched from the zero value output unit 200 to the IMDCT unit 201, the signal becomes discontinuous in a connection portion in the high frequency side as well. In such a case, the glitch noise occurs and sound quality deterioration when listening occurs.

Therefore, in the present technology, the output destination of the MDCT coefficient is selected considering the previous and next time frames, and fade-in processing and fade-out processing with respect to the audio signal are performed, and thus, the sound quality deterioration when listening described above is suppressed and the sound quality is improved.

<Selection of Output Destination of MDCT Coefficient Considering Previous and Next Time Frames>

First, the selection of the output destination of the MDCT coefficient considering the previous and next time frame will be described. Here, the description will be made with the audio signal of the object as an example as well. However, the description is similar to the case of the audio signal of each channel. In addition, the processing tasks described below are performed for each object and each channel.

For example, in the embodiment described above, it was described that the output selection unit 199 selectively switches the output destination of the MDCT coefficient of each object based on the priority information of the present time frame. On the other hand, in the present embodiment, the output selection unit 199 switches the output destination of the MDCT coefficient based on the priority information items of three consecutive time frames in time, those being, the present time frame, the time frame of one time frame before the present time frame, and the time frame of one time frame after the present time frame.

In other words, whether the decoding of the encoded data is performed or not is selected based on the priority information items of three consecutive time frames.

Specifically, the output selection unit 199, in a case where the conditional formula indicated in the following Formula (1) is satisfied with regard to the object subject to be processed, supplies the MDCT coefficient of the time frame (n) of the object to the IMDCT unit 201.

[Math. 1]

$$(\text{object\_priority}[n-1] \geqq thre)$$ (1)

$$\|(\text{object\_priority}[n] \geqq thre)\|(\text{object\_priority}[n+1] \geqq thre)$$

In Formula (1), object_priority[q] (where, q=n−1, n, n+1) indicates the priority information of each time frame (q), and thre indicates the threshold value Q.

Therefore, among the three consecutive time frames of the present time frame, and the time frames before and after the present time frame, in a case where there is at least one or more time frame of which the priority information is equal to or higher than the threshold value Q, the IMDCT unit 201 is selected as an MDCT coefficient supply destination. In this case, the decoding of the encoded data, specifically, the IMDCT with respect to the MDCT coefficient is performed. On the other hand, if the priority information items of all the three time frames are lower than the threshold value Q, the MDCT coefficient is zero and is output to the zero value output unit 200. In this case, the decoding of the encoded data, specifically, the IMDCT with respect to the MDCT coefficient is substantially not performed.

Figure 18:
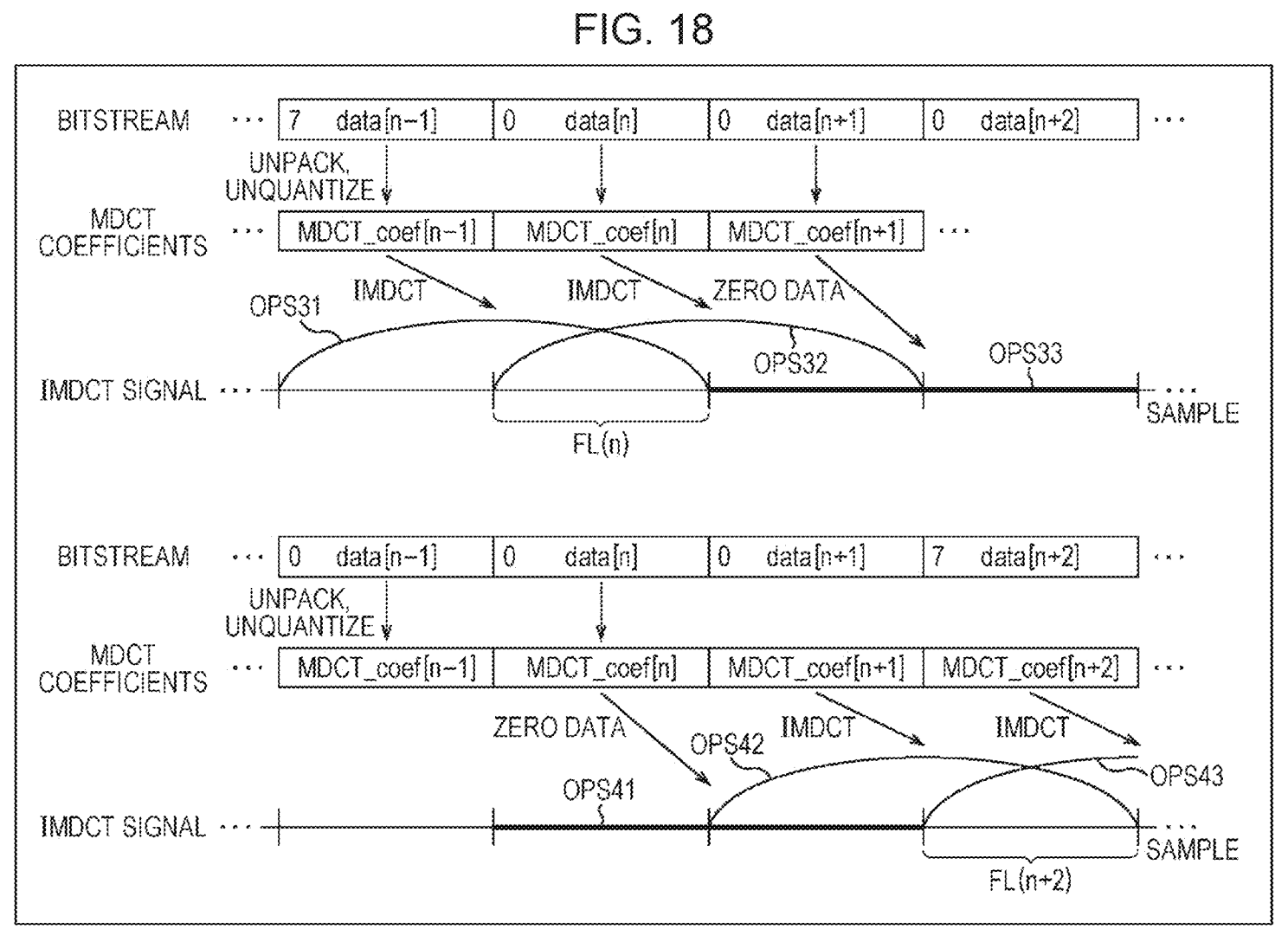

In this way, as illustrated in FIG. 18, the audio signal being completely reconfigured from the IMDCT signal, the deterioration of the sound quality when listening is suppressed.

In FIG. 18, the parts corresponding to the case in FIG. 16 are written in the same letters or the like, and the description thereof will not be repeated.

In the example illustrated in upper diagram in FIG. 18, the value of the priority information of each time frame is the same as that in the example illustrated in FIG. 17. For example, the threshold value Q is assumed to be 4, in the upper diagram in FIG. 18, the priority information of the time frame (n−1) is equal to or higher than the threshold value Q, but the priority information items of the time frame (n) to the time frame (n+2) are lower than the threshold value Q.

For this reason, from the conditional formula illustrated in Formula (1), the IMDCT is performed with respect to the MDCT coefficients of the time frame (n−1) and the time frame (n), and then, an IMDCT signal OPS31 and an IMDCT signal OPS32 are obtained respectively. On the other hand, in the time frame (n+1) where the conditional formula is not satisfied, the IMDCT with respect to the MDCT coefficient is not performed, and then, the zero data is an IMDCT signal OPS33.

Therefore, the audio signal of the time frame (n) which is not completely reconfigured in the example illustrated in FIG. 17 is completely reconfigured in the example illustrated in the upper diagram in FIG. 18, and then, the deterioration of the sound quality when listening is suppressed. However, in this example, since the audio signal is not completely reconfigured in the next time frame (n+1), fade-out processing described below is performed in the time frame (n) and the time frame (n+1), and thus, the deterioration of the sound quality when listening is suppressed.

In addition, in the example illustrated in the lower diagram in FIG. 18, the priority information items in the time frame (n−1) to the time frame (n+1) are lower than the threshold value Q, and the priority information time frame (n+2) is equal to or higher than the threshold value Q.

For this reason, from the conditional formula illustrated in Formula (1), the IMDCT is not performed with respect to the MDCT coefficient in the time frame (n) where the conditional formula is not satisfied, and then, the zero data is an IMDCT signal OPS41. On the other hand, the IMDCT is performed with respect to the MDCT coefficients of the time frame (n+1) and the time frame (n+2), and then, an IMDCT signal OPS42 and tan IMDCT signal OPS43 are obtained respectively.

In this example, the audio signal can be completely reconfigured in the time frame (n+2) where the value of the priority information is switched from a value lower than the threshold value Q to a value equal to or higher than the threshold value Q. Therefore, it is possible to suppress the deterioration of the sound quality when listening. However, even in this case, since the audio signal of the time frame (n+1) immediately before the time frame (n+2) is not completely reconfigured, fade-in processing described below is performed in the time frame (n+1) and the time frame (n+2), and thus, the deterioration of the sound quality when listening is suppressed.

Here, a pre-reading of the priority information for only one time frame is performed, and then, the output destination of the MDCT coefficient is selected from the priority information items of three consecutive time frames. For this reason, in the example illustrated in the upper diagram in FIG. 18, the fade-out processing is performed in the time frame (n) and the time frame (n+1), and in the example illustrated in the lower diagram in FIG. 18, the fade-in processing is performed in the time frame (n+1) and the time frame (n+2).

However, in a case where the pre-reading of the priority information for two time frames can be performed, the fade-out processing may be performed in the time frame (n+1) and the time frame (n+2) in the example illustrated in the upper diagram in FIG. 18, and the fade-in processing may be performed in the time frame (n) and the time frame (n+1) in the example illustrated in the lower diagram in FIG. 18.

<Fade-In Processing and Fade-Out Processing>

Next, the fade-in processing and the fade-out processing with respect to the audio signal will be described. Here, the description will be made with the audio signal of the object as an example as well. However, the description is similar to the case of the audio signal of each channel. In addition, the fade-in processing and the fade-out processing are performed for each object and each channel.

In the present technology, for example, as in the example illustrated in FIG. 18, the fade-in processing or the fade-out processing is performed in the time frame where the IMDCT signal obtained by the IMDCT and the IMDCT signal which is the zero data are overlappingly added, and in the time frame before or after the above-described time frame.

In the fade-in processing, gain adjustment with respect to the audio signal is performed such that the amplitude (magnitude) of the audio signal of the time frame increases with time. Conversely, in the fade-out processing, the gain adjustment with respect to the audio signal is performed such that the amplitude (magnitude) of the audio signal of the time frame decreases with time.

In this way, even in a case where the connection portion of the IMDCT signal obtained by the IMDCT and the IMDCT signal which is the zero data is discontinuous, it is possible to suppress the deterioration of the sound quality when listening. Hereinafter, at the time of such the gain adjustment, a gain value by which the audio signal is multiplied is particularly referred to as a fading signal gain.

Furthermore, in the present technology, in the SBR with regard to the connection portion of the IMDCT signal obtained by the IMDCT and the IMDCT signal which is the zero data, the fade-in processing or the fade-out processing is performed as well.

That is, in the SBR, a power value of each high frequency sub-band is used for each time slot. However, in the present technology, the power value of each high frequency sub-band is multiplied by the gain value determined for the fade-in processing or for the fade-out processing for each time slot, and then, the SBR is performed. That is, the gain adjustment of the high frequency power value is performed.

Hereinafter, the gain value by which the power value of each high frequency sub-band is multiplied and determined for each time slot is particularly referred to as a fading SBR gain.

Specifically, the gain value of the fading SBR gain for the fade-in processing is determined so as to increase with time, that is, so as to increase as large as the gain value of the fading SBR gain of the next time slot. Conversely, the gain value of the fading SBR gain for the fade-out processing is determined so as to increase as small as the gain value of the fading SBR gain of the next time slot.

In this way, by performing the fade-in processing or the fade-out processing at the time of SBR as well, it is possible to suppress the deterioration of the sound quality when listening even when the high frequency is discontinuous.

Figure 19:
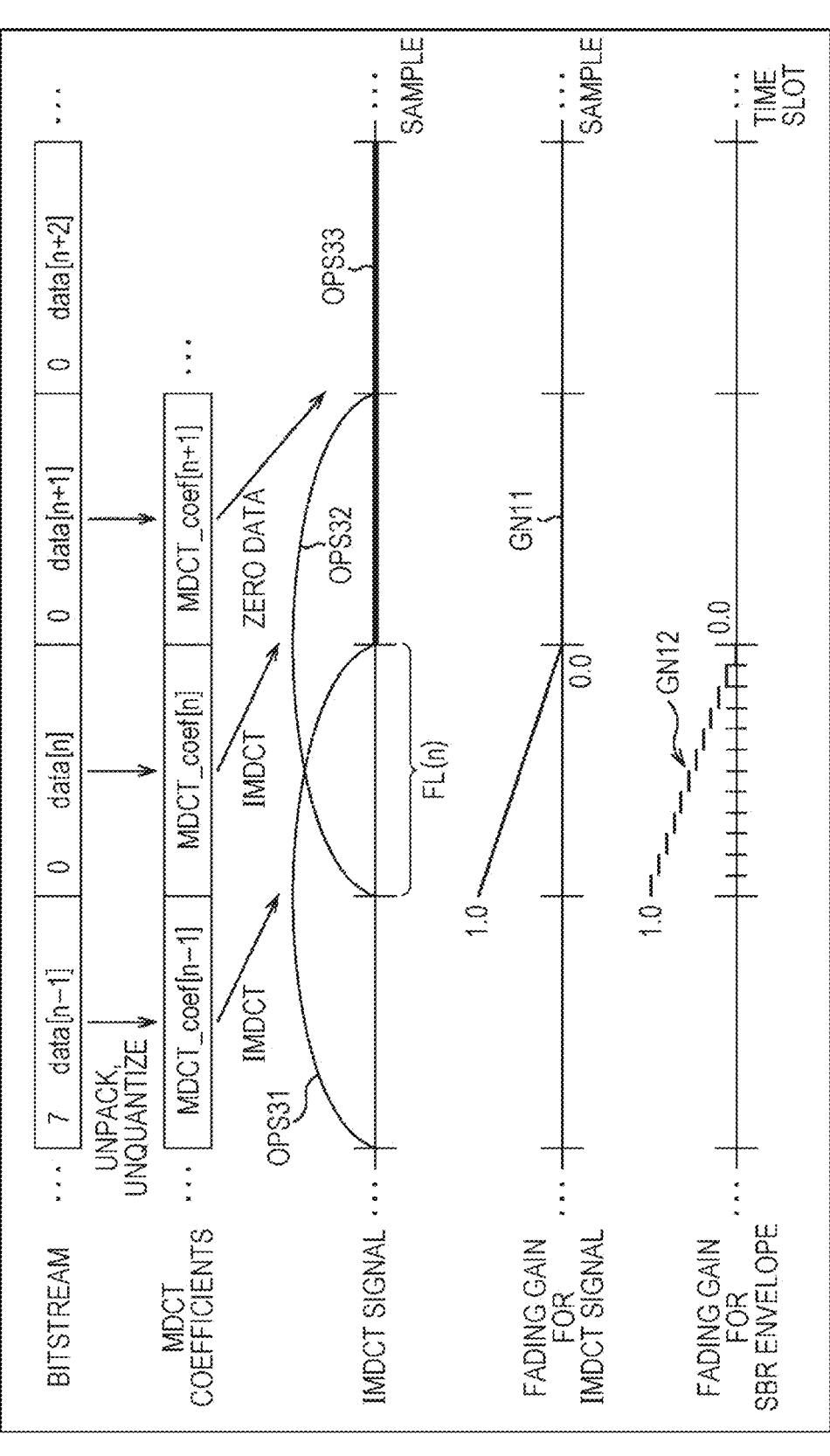
FIG. 19 is a diagram explaining a gain adjustment of the audio signal and a power value in a high frequency band.
Figure 20:
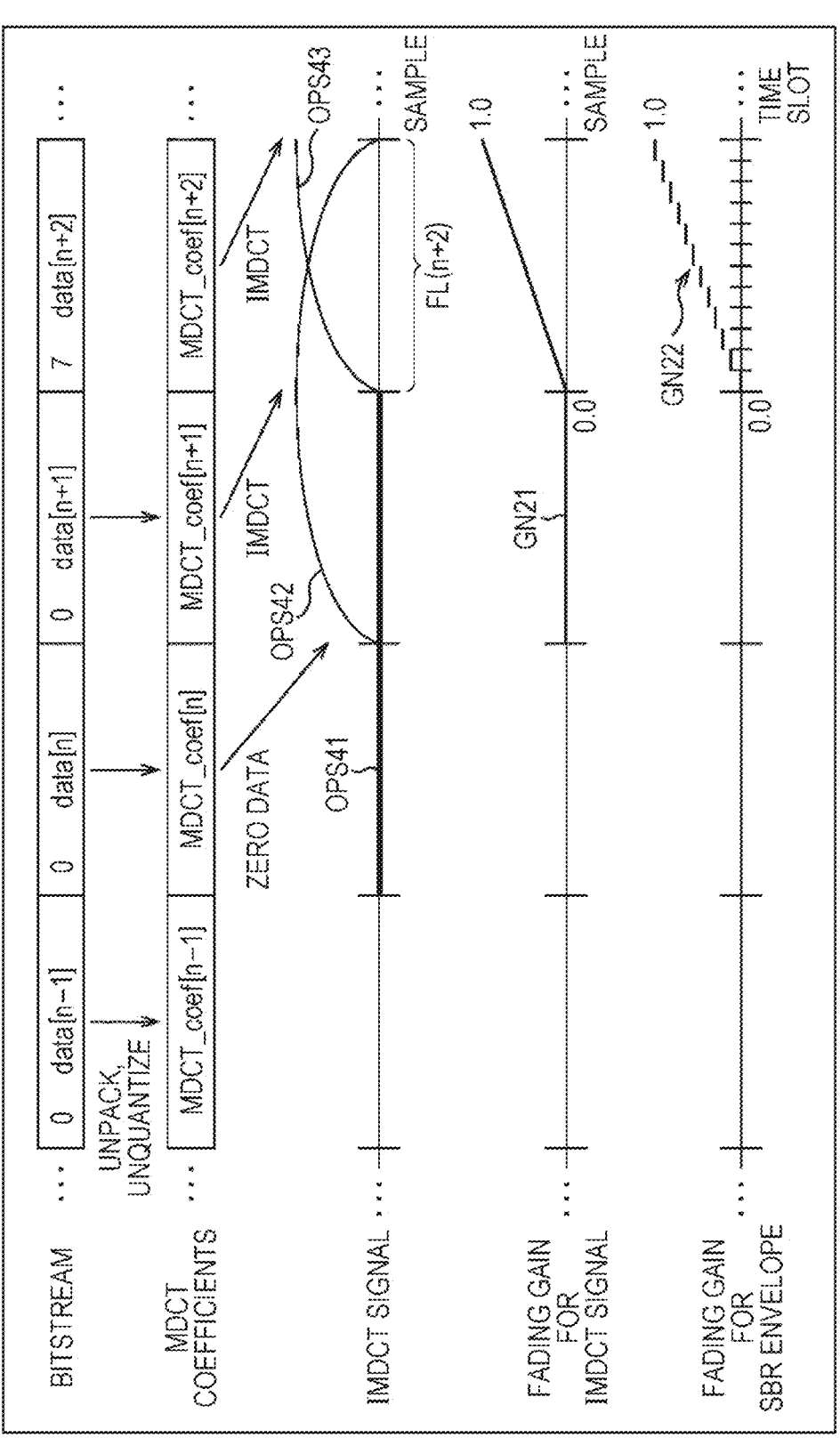
FIG. 20 is a diagram explaining a gain adjustment of the audio signal and the power value in the high frequency band.

Specifically, the processing tasks illustrated in, for example, FIG. 19 and FIG. 20 are performed as the gain adjustment such as the fade-in processing or the fade-out processing with respect to the audio signal and the high frequency power value.

In FIG. 19 and FIG. 20, the parts corresponding to the case in FIG. 18 are written in the same letters or signs, and the description thereof will not be repeated.

An example in FIG. 19 is a case of the example illustrated in the upper diagram in FIG. 18. In this example, the audio signals of the time frame (n) and the time frame (n+1) are multiplied by the fading signal gain indicated by a polygonal line GN11.

The value of the fading signal gain illustrated in the polygonal line GN11 linearly changes from "1" to "0" with time at the portion of the time frame (n), and is continuously "0" at the portion of the time frame (n+1). Therefore, since the audio signal gradually changes to the zero data by adjusting the gain of the audio signal using the fading signal gain, it is possible to suppress the deterioration of the sound quality when listening.

In addition, in this example, the high frequency power value of each time slot of the time frame (n) is multiplied by the fading SBR gain illustrated in an arrow GN12.

The value of the fading SBR gain illustrated by the arrow GN12 changes from "1" to "0" with time so as to decrease to being as small as that in the next time slot. Therefore, since the high frequency component of the audio signal gradually changes to the zero data by adjusting the high frequency gain using the fading SBR signal gain, it is possible to suppress the deterioration of the sound quality when listening.

On the other hand, an example illustrated in FIG. 20 is a case of the example illustrated in the lower diagram in FIG. 18. In this example, the audio signal of time frame (n+1) and the time frame (n+2) is multiplied by the fading signal gain illustrated in a polygonal line GN21.

The value of the fading signal gain illustrated in the polygonal line GN21 is continuously "0" at the portion of the time frame (n+1), and linearly changes from "0" to "1" with time at the portion of the time frame (n+2). Therefore, since the audio signal gradually changes to the original signal from the zero data by adjusting the gain of the audio signal using the fading signal gain, it is possible to suppress the deterioration of the sound quality when listening.

In addition, in this example, the high frequency power value of each time slot of the time frame (n+2) is multiplied by the fading SBR gain illustrated in an arrow GN22.

The value of the fading SBR gain illustrated by the arrow GN22 changes from "0" to "1" with time so as to increase to being as large as that in the next time slot. Therefore, since the high frequency component of the audio signal gradually changes to the original signal from the zero data by adjusting the high frequency gain using the fading SBR signal gain, it is possible to suppress the deterioration of the sound quality when listening.

Configuration Example of Unpacking and Decoding Unit

Figure 21:
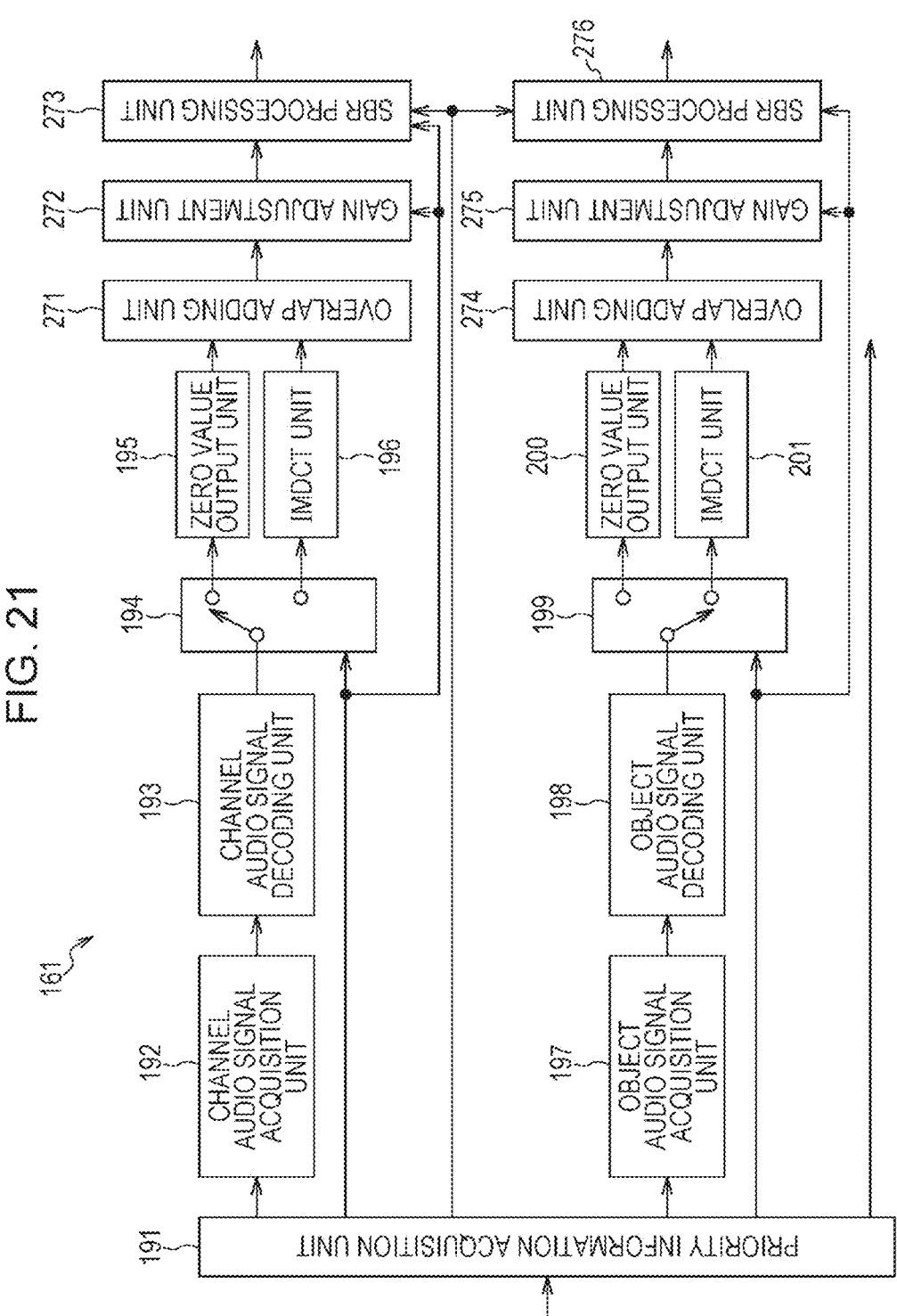
FIG. 21 is a diagram illustrating another configuration example of the unpacking/decoding unit.

In a case where the selection of the output destination of the MDCT coefficient and the gain adjustment such as the fade-in processing or the fade-out processing are performed as described above, the unpacking/decoding unit 161 is configured as illustrated in FIG. 21. In FIG. 21, the parts corresponding to the case in FIG. 10 are written in the same signs, and the description thereof will not be repeated.

The unpacking/decoding unit 161 in FIG. 21 includes the priority information acquisition unit 191, the channel audio signal acquisition unit 192, the channel audio signal decoding unit 193, the output selection unit 194, the zero value output unit 195, the IMDCT unit 196, an overlap adding unit 271, a gain adjustment unit 272, an SBR processing unit 273, the object audio signal acquisition unit 197, the object audio signal decoding unit 198, the output selection unit 199, the zero value output unit 200, the IMDCT unit 201, an overlap adding unit 274, a gain adjustment unit 275, and an SBR processing unit 276.

The configuration of the unpacking/decoding unit 161 illustrated in FIG. 21 is a configuration in which components of from the overlap adding unit 271 to the SBR processing unit 276 are additionally provided to the configuration of the unpacking/decoding unit 161 illustrated in FIG. 10.

The overlap adding unit 271 overlappingly adds the IMDCT signal (the audio signal) supplied from the zero value output unit 195 or the IMDCT unit 196, and generates the audio signal of each time frame, and then, supplies the audio signal to the gain adjustment unit 272.

The gain adjustment unit 272 adjusts the gain of the audio signal supplied from the overlap adding unit 271 based on the priority information supplied from the priority information acquisition unit 191, and supplies the result to the SBR processing unit 273.

The SBR processing unit 273 acquires the power value of each high frequency sub-band for each time slot from the priority information acquisition unit 191, and adjusts the gain of the high frequency power value based on the priority information supplied from the priority information acquisition unit 191. In addition, the SBR processing unit 273 performs the SBR with respect to the audio signal supplied from the gain adjustment unit 272 using the high frequency power value of which the gain is adjusted, and then, supplies the audio signal obtained as a result of the SBR to the mixing unit 163.

The overlap adding unit 274 overlappingly adds the IMDCT signals (the audio signal) supplied from the zero value output unit 200 or the IMDCT unit 201, and generates the audio signal of each time frame, and then, supplies the audio signal to the gain adjustment unit 275.

The gain adjustment unit 275 adjusts the gain of the audio signal supplied from the overlap adding unit 274 based on the priority information supplied from the priority information acquisition unit 191, and supplies the audio signal to the SBR processing unit 276.

The SBR processing unit 276 acquires the power value of each high frequency sub-band from the priority information acquisition unit 191 for each time slot, and adjusts the gain of the high frequency power value based on the priority information supplied from the priority information acquisition unit 191. In addition, the SBR processing unit 276 performs the SBR with respect to the audio signal supplied from gain adjustment unit 275 using the high frequency power value of which the gain is adjusted, and then, supplies the audio signal obtained as a result of the SBR to the rendering unit 162.

<Description on Selective Decoding Processing>

Figure 22:
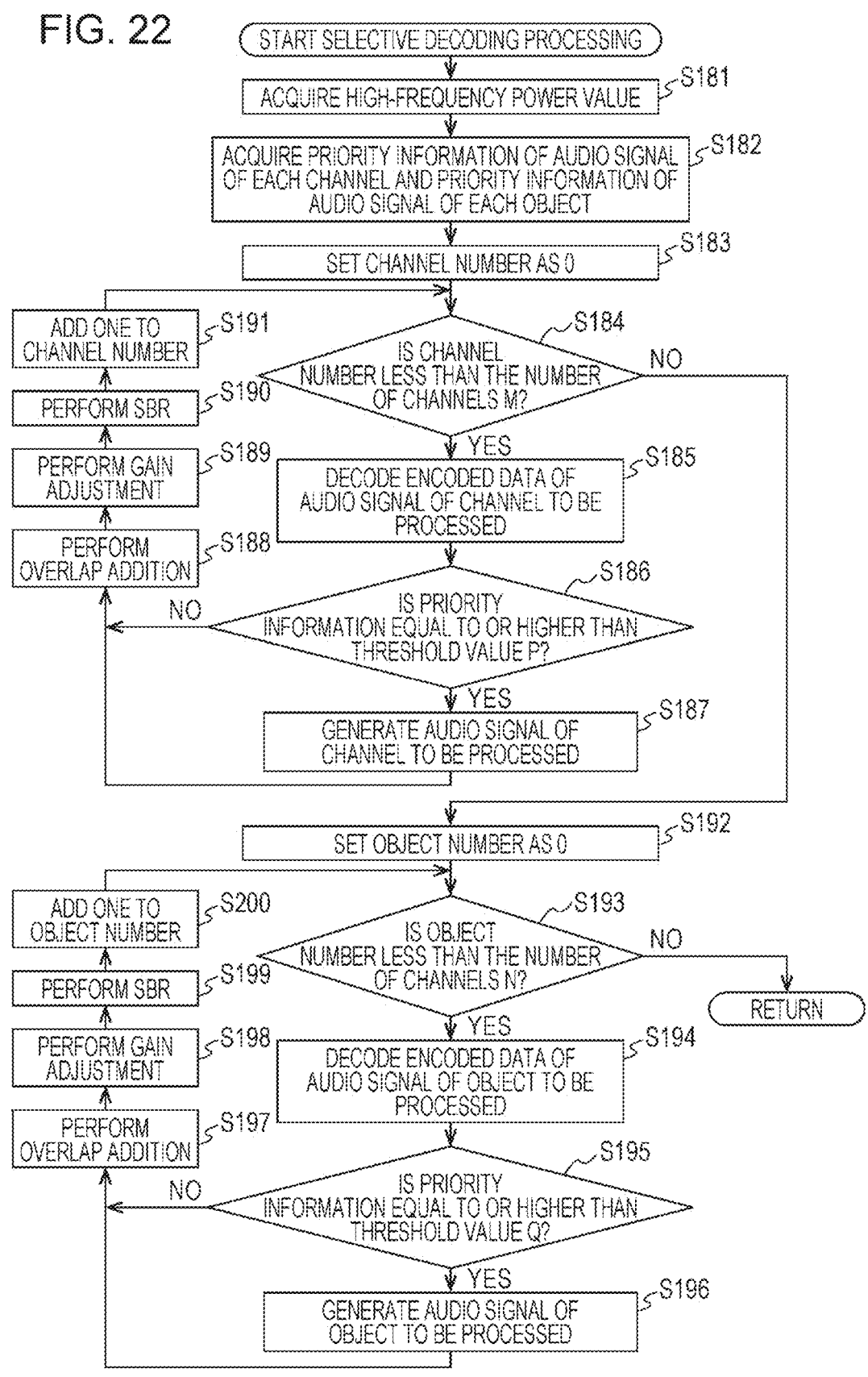
FIG. 22 is a flow chart explaining selective decoding processing.

Subsequently, the operation of the decoding device 151 in a case where the unpacking/decoding unit 161 has a configuration illustrated in FIG. 21 will be described. In this case, the decoding device 151 performs the decoding processing described referring to FIG. 11. However, the processing illustrated in FIG. 22 is performed as the selective decoding processing in STEP 352.

Hereinafter, the selective decoding processing corresponding to the processing in STEP S52 in FIG. 11 will be described referring to a flow chart in FIG. 22.

In STEP S181, the priority information acquisition unit 191 acquires the high frequency power value of the audio signal of each channel from the supplied bit stream and supplies the high frequency power value to the SBR processing unit 273, and acquires the high frequency power value of the audio signal of each object from the supplied bit stream and supplies the high frequency power value to the SBR processing unit 276.

After the high frequency power value being acquired, the processing tasks in STEP S182 to STEP S187 are performed, and the audio signal (IMDCT signal) of the channel subject to be processed is generated. However, those processing tasks are similar to those in STEP S81 to STEP S86 in FIG. 12, and the description thereof will not be repeated.

However, in STEP S186, in a case where a condition similar to Formula (1) described above is satisfied, that is, in a case where at least one or more priority information items are equal to or higher than the threshold value P among the priority information of the present time frame of the channel to be processed and the priority information items of time frames immediately before and immediately after the present time frame of the channel subject to be processed, it is determined that the priority information is equal to or higher than the threshold value P. In addition, the IMDCT signal generated in the zero value output unit 195 or the IMDCT unit 196 is output to the overlap adding unit 271.

In a case where it is not determined that the priority information is equal to or higher than the threshold value P in STEP S186 or the IMDCT signal is generated in STEP S187, the processing in STEP S188 is performed.

In STEP S188, the overlap adding unit 271 performs the overlapping addition of the IMDCT signals supplied from the zero value output unit 195 or the IMDCT unit 196, and supplies the audio signal of the present time frame obtained as a result of the overlapping addition to the gain adjustment unit 272.

Specifically, for example, as described referring to FIG. 18, the former half of the IMDCT signal of the present time frame and the latter half of the IMDCT signal immediately before the present time frame are summed, and becomes the audio signal of the present time frame.

In STEP S189, the gain adjustment unit 272 adjusts the gain of the audio signal supplied from the overlap adding unit 271 based on the priority information of the channel subject to be processed supplied from the priority information acquisition unit 191, and supplies the result of the gain adjustment to the SBR processing unit 273.

Specifically, in a case where the priority information of the time frame immediately before the present time frame is equal to or higher than the threshold value P and the priority information of the present time frame and the priority information of the time frame immediately after the present time frame are lower than the threshold value P, the gain adjustment unit 272 adjusts the gain of the audio signal at the fading signal gain illustrated in the polygonal line GN11 in FIG. 19. In this case, time frame (n) in FIG. 19 corresponds to the present time frame, and in the time frame immediately after the present time frame, as illustrated on the polygonal line GN11, the gain adjustment at the fading signal gain of zero is performed.

In addition, in a case where the priority information of the present time frame is equal to or higher than the threshold value P and the priority information items of two time frames immediately before the present time frame are lower than the threshold value P, the gain adjustment unit 272 adjusts the gain of the audio signal at the fading signal gain illustrated on the polygonal line GN21 in FIG. 20. In this case, time frame (n+2) in FIG. 20 corresponds to the present time frame, and in the time frame immediately before the present time frame, as illustrated on the polygonal line GN21, the gain adjustment at the fading signal gain of zero is performed.

The gain adjustment unit 272 performs the gain adjustment only in the case of the two examples described above, and does not perform the gain adjustment in other cases, and supplies the audio signal to the SBR processing unit 273 as it is.

In STEP S190, the SBR processing unit 273 performs the SBR with respect to the audio signal supplied from the gain adjustment unit 272 based on the high frequency power value and the priority information of the channel subject to be processed supplied from the priority information acquisition unit 191.

Specifically, in a case where the priority information of the time frame immediately before the present time frame is equal to or higher than the threshold value P, the priority information of the present time frame and the priority information of the time frame immediately after the present time frame are lower than the threshold value P, the SBR processing unit 273 adjusts the gain of the high frequency power value at the fading SBR gain illustrated by the arrow GN12 in FIG. 19. That is, the high frequency power value is multiplied by the fading SBR gain.

Then, the SBR processing unit 273 performs the SBR using the high frequency power value of which the SBR, and supplies the audio signal obtained as a result of the gain adjustment to the mixing unit 163. In this case, the time frame (n) in FIG. 19 corresponds to the present time frame.

In addition, in a case where the priority information of the present time frame is equal to or higher than the threshold value P and the priority information items of two time frames immediately before the present time frame are lower than the threshold value P, the SBR processing unit 273 adjusts the gain of the high frequency power value at the fading SBR gain illustrated by the arrow GN22 in FIG. 20. Then, the SBR processing unit 273 performs the SBR using the high frequency power value of which the gain is adjusted, and supplies the audio signal obtained as a result of the SBR to the mixing unit 163. In this case, the time frame (n+2) in FIG. 20 corresponds to the present time frame.

The SBR processing unit 273 performs the gain adjustment of the high frequency power value only in the case of the two examples described above, and does not perform the gain adjustment in other cases and performs the SBR using the acquired high frequency power value as it is, and then, supplies the audio signal obtained as a result of the SBR to the mixing unit 163.

After the SBR being performed and the audio signal of the present time frame being obtained, the processing tasks in STEP S191 to STEP S196 are performed. However, those processing tasks are similar to those in STEP S87 to STEP S92 in FIG. 12, and the description thereof will not be repeated.

However, in STEP S195, in a case where the condition above-described Formula (1) is satisfied, it is determined that the priority information is equal to or higher than the threshold value Q. In addition, the IMDCT signal (the audio signal) generated in the zero value output unit 200 or the IMDCT unit 201 is output to the overlap adding unit 214.

In this way, when the IMDCT signal of the present time frame is obtained, the processing tasks in STEP S197 to STEP S199 are performed and the audio signal of the present time frame is generated. However, those processing tasks similar to those in STEP S188 to STEP S190 and the description thereof will not be repeated.

In STEP S200, when the object audio signal acquisition unit 197 adds one to the object number, the process returns to STEP S193. Then, when it is determined that the object number is not less than N in STEP S193, the selective decoding processing ends, and then, the process proceeds to STEP S53 in FIG. 11.

As described above, the unpacking/decoding unit 161 selects the output destination of the MDCT coefficient according to the priority information items of the present time frame and the time frames before and after the present time frame. In this way, the audio signal is completely reconfigured in the portion where the time frame in which the priority information is equal to or higher than a threshold value and the time frame in which the priority information is lower than the threshold value are switched, and thus, it is possible to suppress the deterioration of the sound quality when listening.

In addition, the unpacking/decoding unit 161 adjusts the gain of the overlappingly added audio signal or the high frequency power value based on the priority information items of three consecutive time frames. That is, the fade-in processing or the fade-out processing is appropriately performed. In this way, the occurrence of the glitch noise is suppressed, and thus, it is possible to suppress the deterioration of the sound quality when listening.

Fifth Embodiment

<Fade-In Processing and Fade-Out Processing>

In the description in the fourth embodiment, the gain adjustment is performed with respect to the overlappingly added audio signal, and further, the gain adjustment is performed with respect to the high frequency power value at the time of SBR.

In this case, the separate gain adjustment in the low frequency component and the high frequency component of the final audio signal, that is, the fade-in processing and the fade-out processing are performed.

Here, the gain adjustment may not be performed immediately after the overlapping addition and at the time of SBR, or the gain adjustment may be performed with respect to the audio signal obtained by the SBR such that the fade-in processing and the fade-out processing can be realized with less processing.

Figure 23:
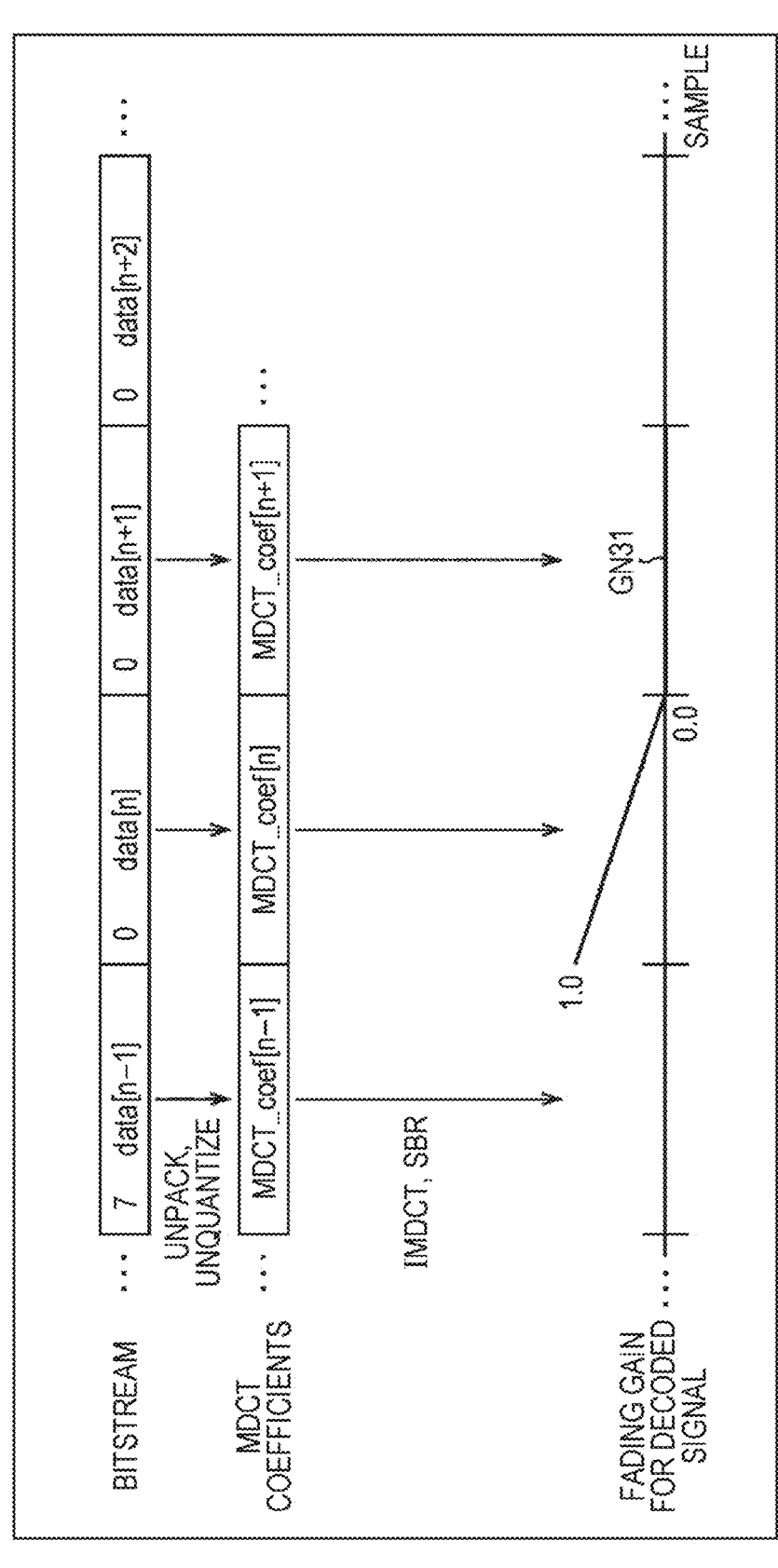
FIG. 23 is a diagram explaining a gain adjustment of the audio signal.
Figure 24:
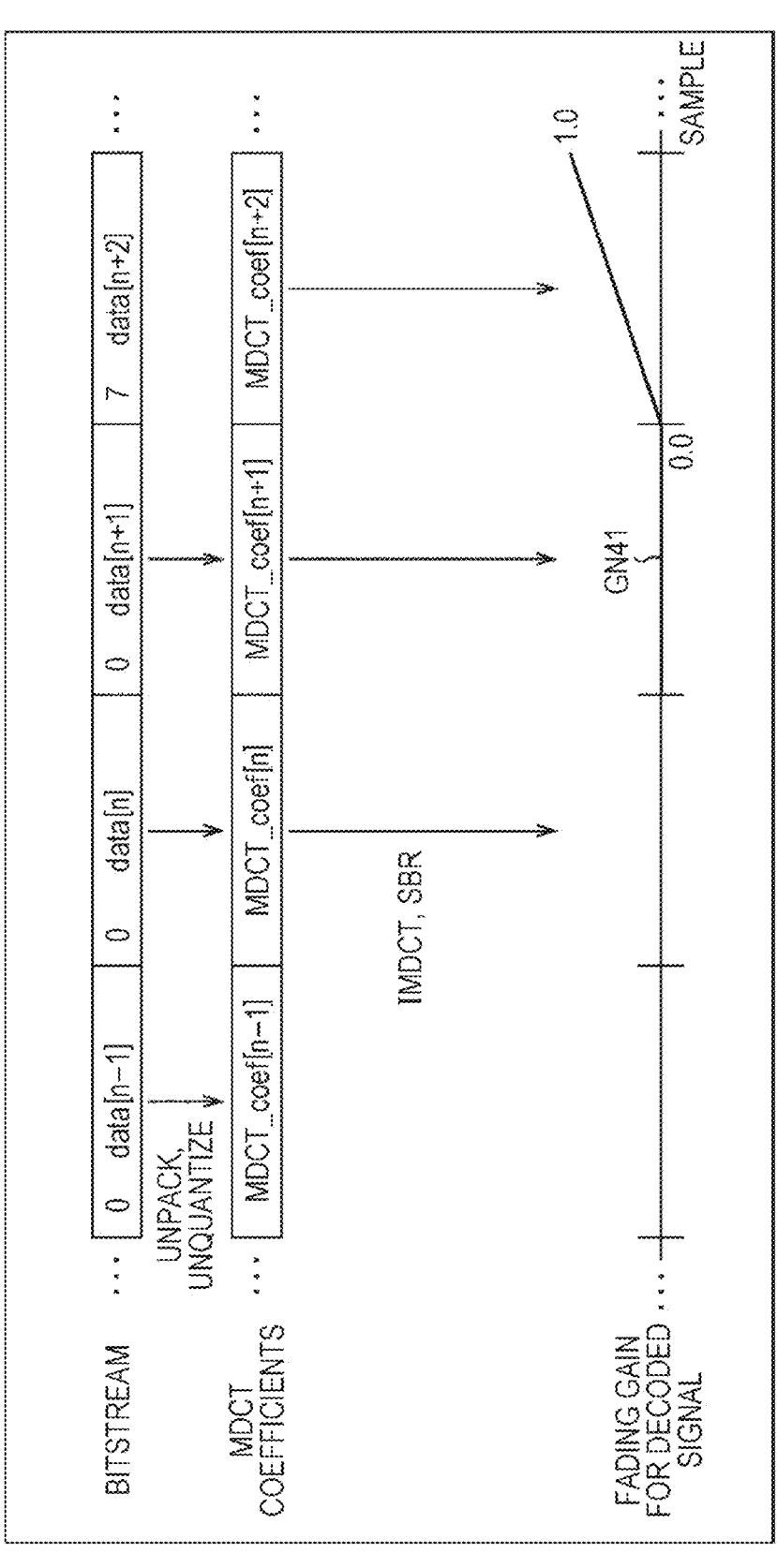
FIG. 24 is a diagram explaining a gain adjustment of the audio signal.

In such a case, for example, the gain adjustment is performed as illustrated in FIG. 23 and FIG. 24. In FIG. 23 and FIG. 24, the parts corresponding to the case in FIG. 19 and FIG. 20 are written in the same letters or the like, and the description thereof will not be repeated.

The changes of the priority information in an example illustrated in FIG. 23 are the same as that in the example of the case illustrated in FIG. 19. In this example, if the threshold value Q is 4, the priority information of the time frame (n−1) is equal to or higher than the threshold value Q, but the priority information items of the time frame (n) to the time frame (n+2) are less than the threshold value Q.

In this case, the gain adjustment is performed by the audio signal obtained by the SBR in the time frame (n) and the time frame (n+1) being multiplied by the fading signal gain illustrated on the polygonal line GN31.

The fading signal gain illustrated in the polygonal line GN31 is the same as the fading signal gain illustrated on the polygonal line GN11 in FIG. 19. However, in a case of an example in FIG. 23, since the audio signal subject to the gain adjustment includes both of the low frequency component and the high frequency component, the gain adjustment of the low frequency component and the high frequency component can be performed by one fading signal gain.

By the gain adjustment of the audio signal using the fading signal gain, the audio signals gradually change to the zero data at the portion where the IMDCT signal obtained by IMDCT and the IMDCT signal that is the zero data are overlappingly added and the portion immediately therebefore. In this way, it is possible to suppress the deterioration of the sound quality when listening.

On the other hand, the change of the priority information in the example illustrated in FIG. 24 is the same as that in the case illustrated in FIG. 20. In this example, if the threshold value Q is 4, the priority information items are lower than the threshold value Q at the time frame (n) and the time frame (n+1), but the priority information of the time frame (n+2) is equal to or higher than the threshold value Q.

In such a case, the gain is adjusted by the audio signal obtained by the SBR at the time frame (n+1) and the time frame (n+2) being multiplied by the fading signal gain illustrated on a polygonal line GN41.

The fading signal gain illustrated on the polygonal line GN41 is the same as the fading signal gain illustrated on the polygonal line GN21 in FIG. 20. However, in the case of the example in FIG. 24, since the audio signal subject to the gain adjustment includes both of the low frequency component and the high frequency component, the gain adjustment of the low frequency component and the high frequency component can be performed by one fading signal gain.

By the gain adjustment of the audio signal using the fading signal gain, the audio signals gradually change from the zero data to the original signal at the portion where the IMDCT signal obtained by IMDCT and the IMDCT signal that is the zero data are overlappingly added and the portion immediately therebefore.

In this way, it is possible to suppress the deterioration of the sound quality when listening.

Configuration Example of Unpacking/Decoding Unit

Figure 25:
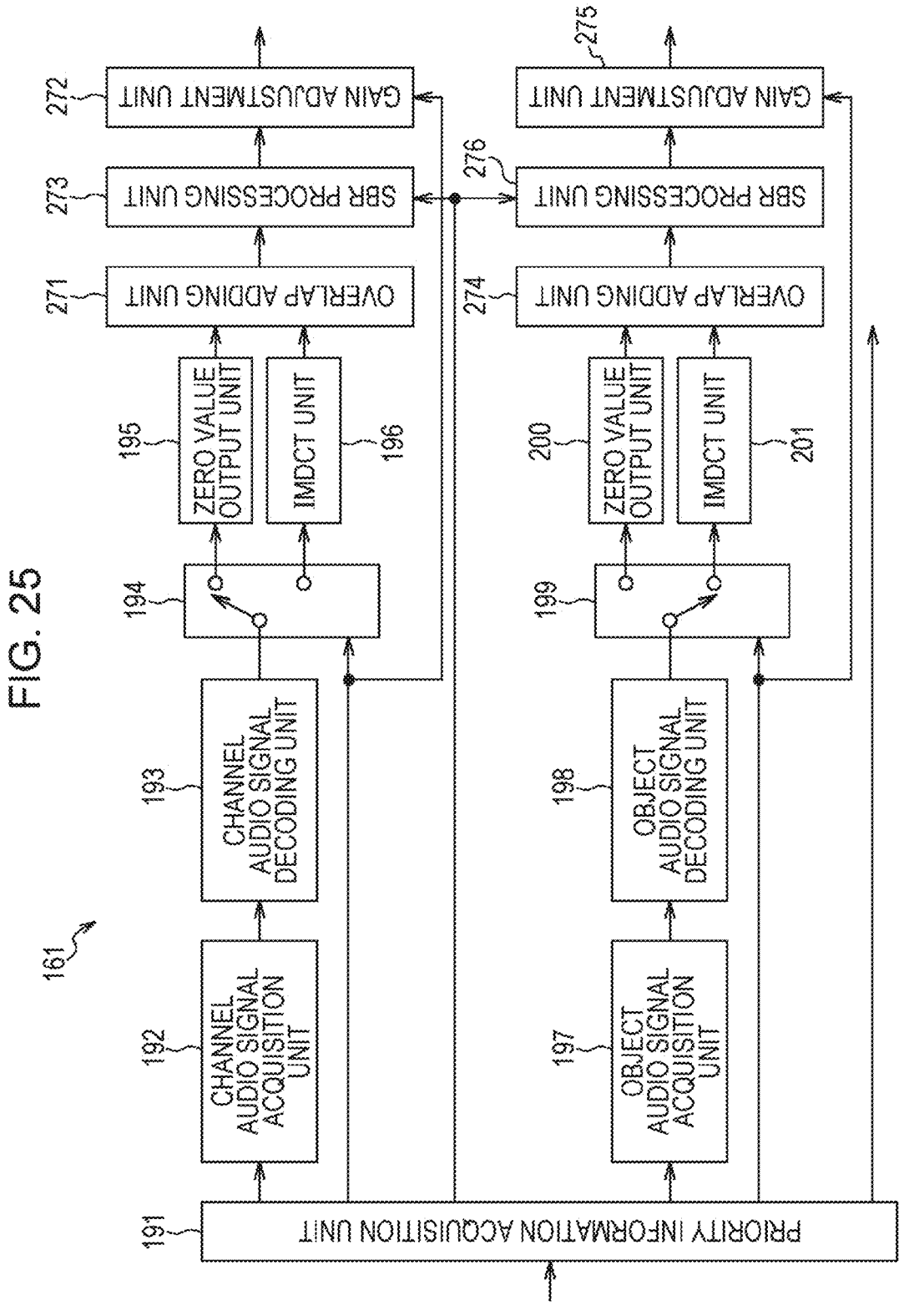
FIG. 25 is a diagram illustrating another configuration example of the unpacking/decoding unit.

In a case where the gain adjustment is performed by the fade-in processing or the fade-out processing described above referring to FIG. 23 and FIG. 24, the unpacking/decoding unit 161, for example, is configured as illustrated in FIG. 25. In FIG. 25, the parts corresponding to the case in FIG. 21 are written in the same signs, and the description thereof will not be repeated.

The unpacking/decoding unit 161 illustrated in FIG. 25 includes the priority information acquisition unit 191, the audio signal acquisition unit 192, the channel audio signal decoding unit 193, the output selection unit 194, the zero value output unit 195, the IMDCT unit 196, the overlap adding unit 271, the SBR processing unit 273, the gain adjustment unit 272, the object audio signal acquisition unit 197, the object audio signal decoding unit 198, the output selection unit 199, the zero value output unit 200, the IMDCT unit 201, the overlap adding unit 274, the SBR processing unit 276, and the gain adjustment unit 275.

The configuration of the unpacking/decoding unit 161 illustrated in FIG. 25 is different from the configuration of the unpacking/decoding unit 161 illustrated in FIG. 21 in the point that each of the gain adjustment unit 272 and the gain adjustment unit 275 are disposed at the stage after the SBR processing unit 273 and the SBR processing unit 276 respectively.

In the unpacking/decoding unit 161 illustrated in FIG. 25, the SBR processing unit 273 performs the SBR with respect to the audio signal supplied from the overlap adding unit 271 based on the high frequency power value supplied from the priority information acquisition unit 191, and supplies the audio signal obtained from the result thereof to the gain adjustment unit 272. In this case, in the SBR processing unit 273, the gain adjustment of the high frequency power value is not performed.

The gain adjustment unit 272 adjusts the gain of the audio signal supplied from the SBR processing unit 273 based on the priority information supplied from the priority information acquisition unit 191, and supplies the audio signal to the mixing unit 163.

The SBR processing unit 276 performs the SBR with respect to the audio signal supplied from the overlap adding unit 274 based on the high frequency power value supplied from the priority information acquisition unit 191, and supplies the audio signal obtained from the result thereof to the gain adjustment unit 275. In this case, in the SBR processing unit 276, the gain adjustment of the high frequency power value is not performed.

The gain adjustment unit 275 adjusts the gain of the audio signal supplied from the SBR processing unit 276 based on the priority information supplied from the priority information acquisition unit 191, and supplies the audio signal to the rendering unit 162.

<Description of Selective Decoding Processing>

Subsequently, the operation of the decoding device 151 in a case where the unpacking/decoding unit 161 has a configuration illustrated in FIG. 25 will be described. In this case, the decoding device 151 performs the decoding processing described referring to FIG. 11. However, the pro-

Figure 26:
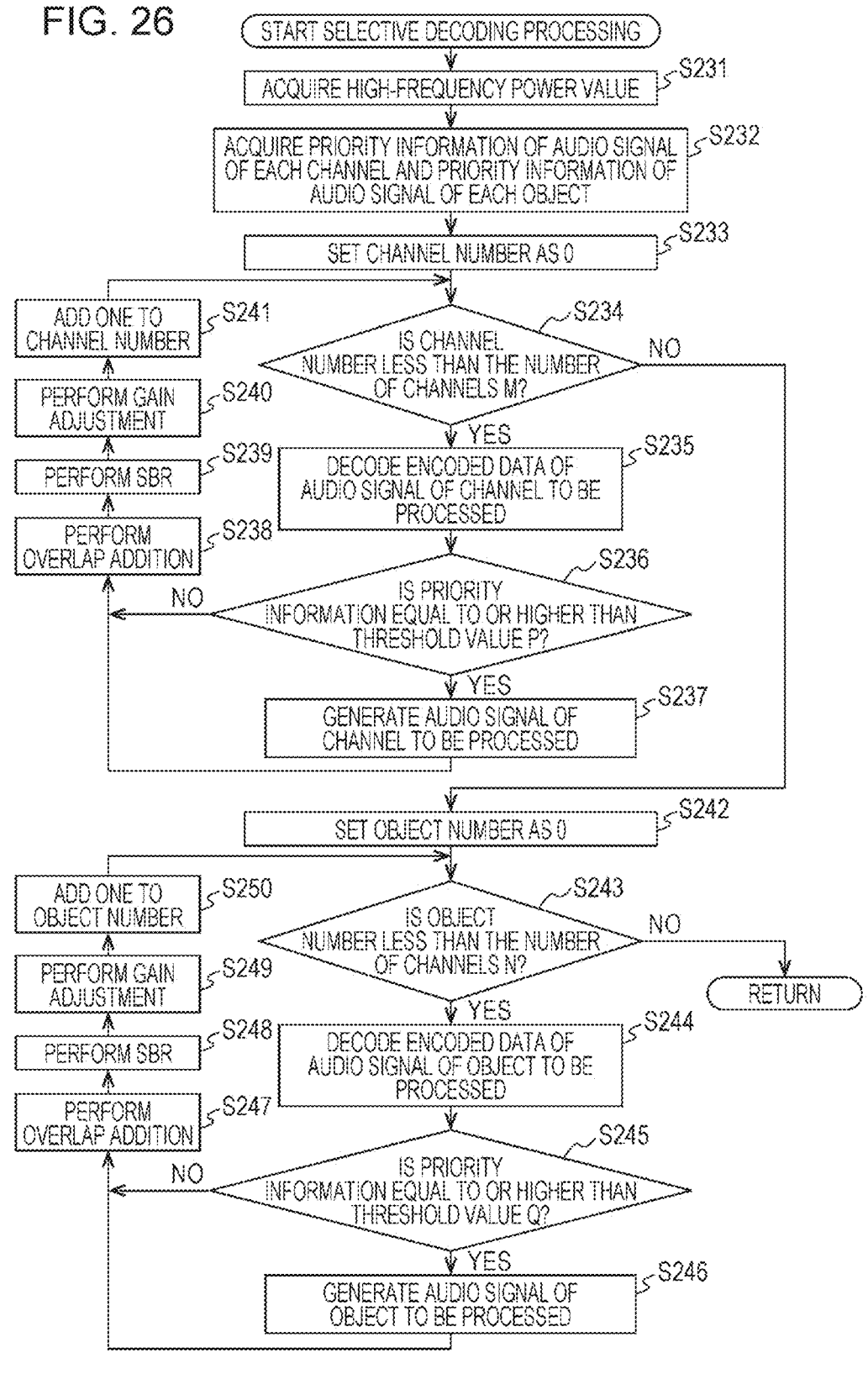
FIG. 26 is a flow chart explaining selective decoding processing.

36 cessing illustrated in FIG. 26 is performed as the selective decoding processing in STEP S52.

Hereinafter, the selective decoding processing corresponding to the processing in STEP S52 in FIG. 11 will be described referring to a flow chart in FIG. 26. The processing tasks thereafter in STEP S231 to STEP S238 are the same as the processing tasks in STEP S181 to STEP S188 in FIG. 22, and the description thereof will not be repeated. However, in STEP S232, the priority information is not supplied to the SBR processing unit 273 and the SBR processing unit 276.

In STEP S239, the SBR processing unit 273 performs the SBR with respect to the audio signal supplied from the overlap adding unit 271 based on the high frequency power value supplied from the priority information acquisition unit 191, and supplies the audio signal obtained from the result thereof to the gain adjustment unit 272.

In STEP S240, the gain adjustment unit 272 adjusts the gain of the audio signal supplied from the SBR processing unit 273 based on the priority information of the channel subject to be processed supplied from the priority information acquisition unit 191, and supplies the audio signal to the mixing unit 163.

Specifically, in a case where the priority information of the time frame immediately before the present time frame is equal to or higher than the threshold value P and the priority information of the present time frame and the priority information of the time frame immediately after the present time frame are lower than the threshold value P, the gain adjustment unit 272 adjusts the gain of the audio signal at the fading signal gain illustrated in the polygonal line GN31 in FIG. 23. In this case, time frame (n) in FIG. 23 corresponds to the present time frame, and in the time frame immediately after the present time frame, as illustrated in the polygonal line GN31, the gain adjustment at the fading signal gain of zero is performed.

In addition, in a case where the priority information of the present time frame is equal to or higher than the threshold value P and the priority information items of two time frames immediately before the present time frame are lower than the threshold value P, the gain adjustment unit 272 adjusts the gain of the audio signal at the fading signal gain illustrated in the polygonal line GN41 in FIG. 24. In this case, time frame (n+2) in FIG. 24 corresponds to the present time frame, and in the time frame immediately before the present time frame, as illustrated in the polygonal line GN41, the gain adjustment at the fading signal gain of zero is performed.

The gain adjustment unit 272 performs the gain adjustment only in the case of the two examples described above, and does not perform the gain adjustment in other cases, and supplies the audio signal to the mixing unit 163 as it is.

After the gain adjustment of the audio signal being performed, the processing tasks in STEP S241 to STEP S247 are performed. However, those processing tasks are similar to those in STEP S191 to STEP S197 in FIG. 22, and the description thereof will not be repeated.

In this way, when the audio signal of the present time frame of the object subject to be processed is obtained, the processing tasks in STEP S248 and in STEP S249 are performed and the final audio signal of the present time frame is obtained. However, those processing tasks are similar to those in STEP S239 and STEP S240, and the description thereof will not be repeated.

In STEP S250, when the object audio signal acquisition unit 197 adds one to the object number, the process returns to STEP S243. Then, when it is determined that the object number is not less than N in STEP S243, the selective decoding processing ends, and then, the process proceeds to STEP S53 in FIG. 11.

As described above, the unpacking/decoding unit 161 adjusts the gain of the audio signal obtained by the SBR based on the priority information items of three consecutive time frames. In this way, the occurrence of the glitch noise is simply suppressed, and thus, it is possible to suppress the deterioration of the sound quality when listening.

In the present embodiment, the example of selecting the output destination of the MDCT coefficient using the priority information items of three time frames and performing the gain adjustment by the fading signal gain is described. However, only the gain adjustment by the fading signal gain may be performed.

In such a case, in the output selection unit 194 and the output selection unit 199, the output destination of the MDCT coefficient is selected by the processing similar to that of the case in the first embodiment. Then, in the gain adjustment unit 272 and the gain adjustment unit 275, in a case where the priority information of the present time frame is lower than the threshold value, the fade-in processing or the fade-out processing is performed by linearly increasing or decreasing the fading signal gain of the present time frame. Here, the determination of whether the fade-in processing be performed or the fade-out processing be performed may be made by the priority information of the present time frame and the priority information items of the time frame immediately before and after the present time frame.

Sixth Embodiment

<Fade-In Processing and Fade-Out Processing>

Incidentally, in the rendering unit 162, for example, the VBAP is performed and the audio signal of each channel for reproducing the sound of each object from the audio signal of each object is generated.

Specifically, in the VBAP, for each channel, that is, for each speaker that reproduces the sound, with regard to each object, a gain value (hereafter, referred to as a VBAP gain) of the audio signal is calculated for each time frame. Then, the sum of the audio signals of each channel multiplied by the VBAP gain of the same channel (speaker) is the audio signal of that channel. In other words, with regard to each object, the VBAP gain calculated for each channel is assigned to each channel.

Therefore, with regard to the audio signal of the object, the generation of the glitch noise may be suppressed and the deterioration of the sound quality when listening may be suppressed by appropriately adjusting the VBAP gain instead of adjusting the gain of the audio signal of the object or the high frequency power value.

In such a case, for example, a linear interpolation or the like is performed with respect to the VBAP gain of each time frame, and the VBAP gain of each sample of the audio signal in each time frame is calculated, and then, the audio signal of each channel is generated by the obtained VBAP gain.

For example, the VBAP gain value of a first sample in the time frame subject to be processed is the VBAP gain value of a last sample in the time frame immediately before the time frame subject to be processed. In addition, the VBAP gain value of the last sample in the time frame subject to be processed is the VBAP gain value calculated by the ordinary VBAP with respect to the time frame subject to be processed.

Then, in the time frame subject to be processed, the VBAP gain value of each sample between the first sample and the last sample is determined such that the VBAP gain linearly changes from the first sample to the last sample.

However, in a case where the priority information of the time frame subject to be processed is lower a than threshold value, the calculation of the VBAP is not performed, the VBAP gain value of each sample is determined such that and the VBAP gain value of the last sample of the time frame subject to be processed becomes zero.

In this way, by performing the gain adjustment of the audio signal of each object through the VBAP gain, the gain adjustment of the low frequency component and the high frequency component can be performed in one time, and then, the occurrence of the glitch noise is suppressed with a lesser amount of processing, and thus, it is possible to suppress the deterioration of the sound quality when listening.

Figure 27:
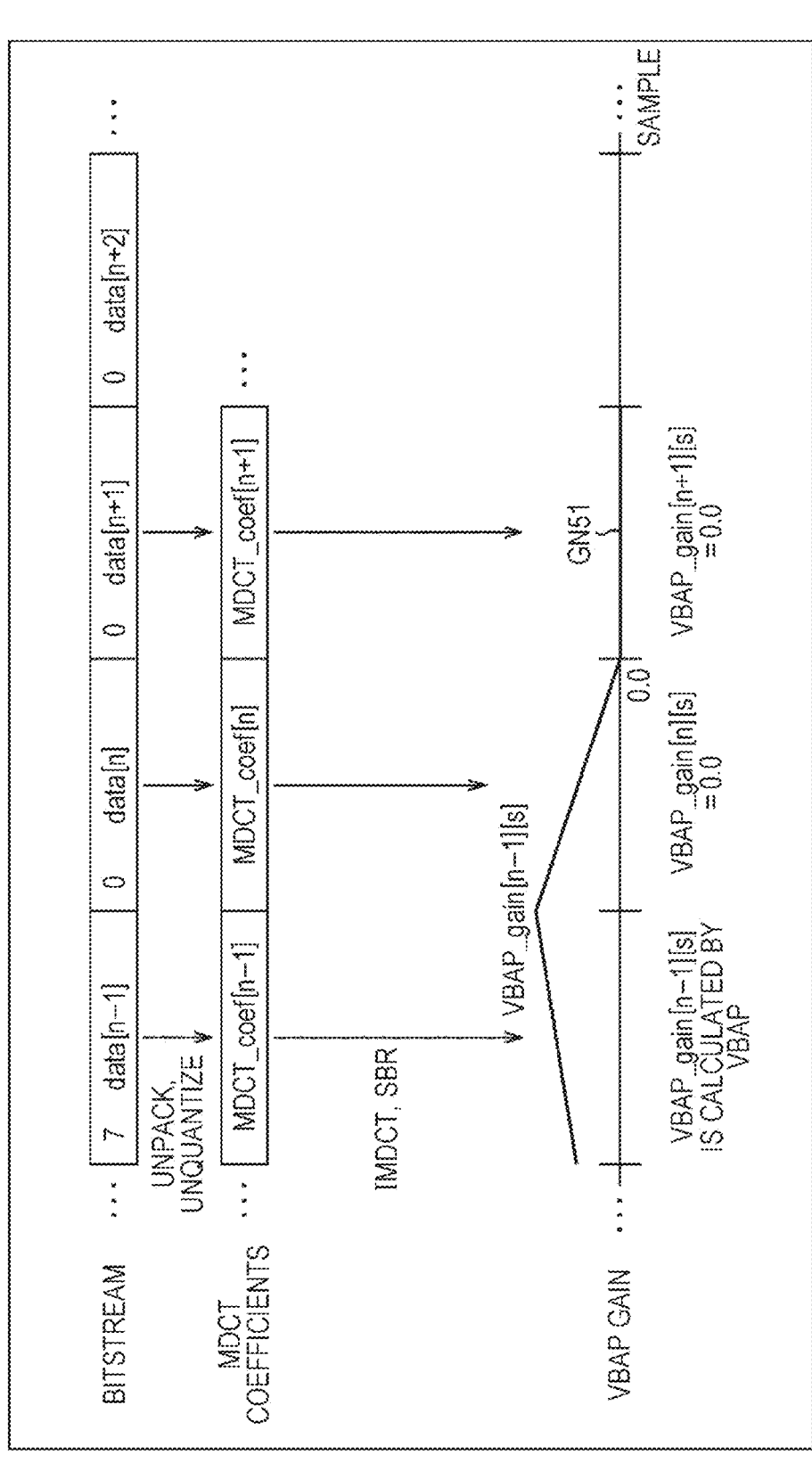
FIG. 27 is a diagram explaining a VBAP gain.
Figure 28:
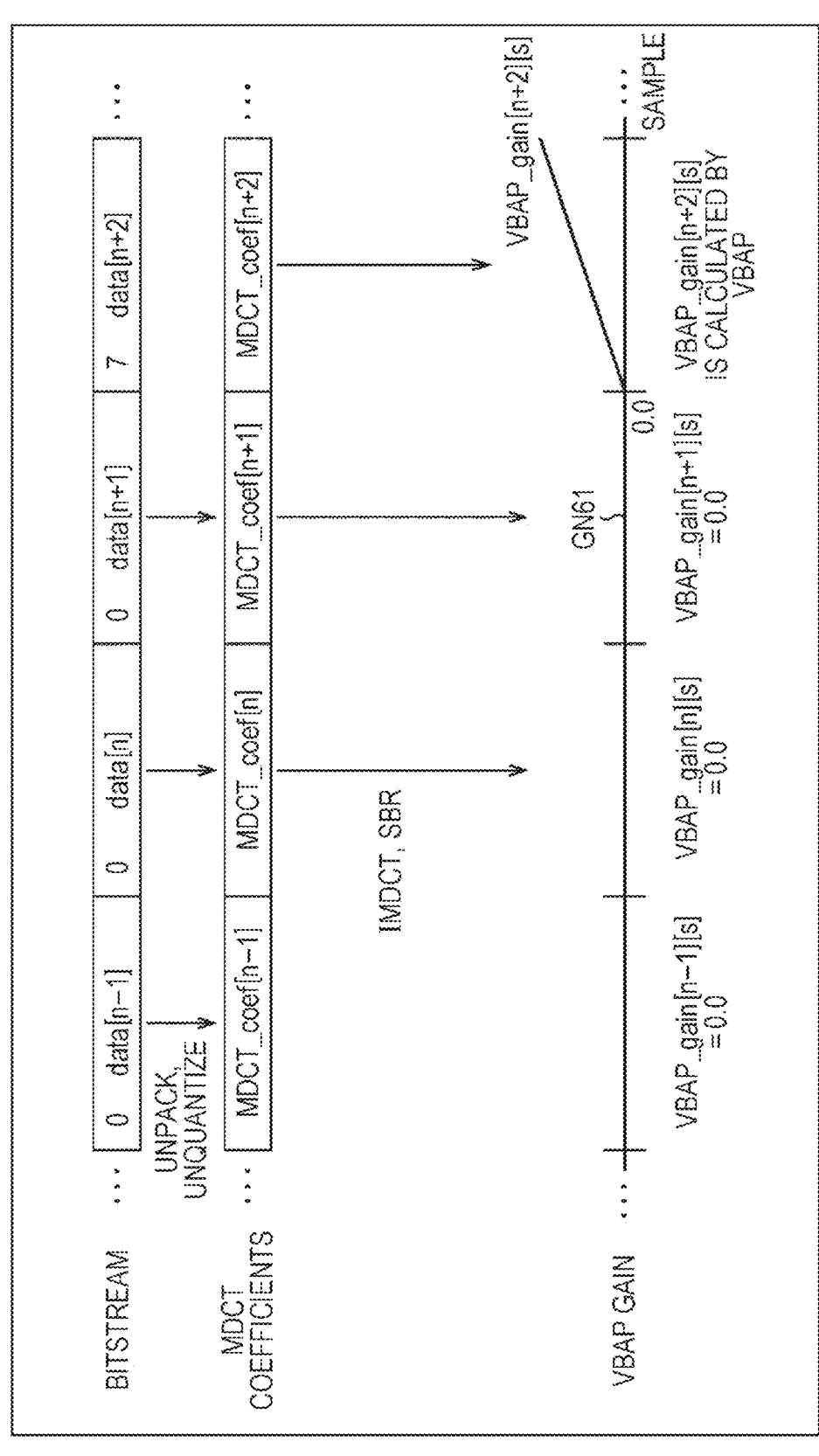
FIG. 28 is a diagram explaining a VBAP gain.

In a case where the VBAP gain is determined for each sample as described above, the VBAP gain for each sample of each time frame is, for example, as illustrated in FIG. 27 and FIG. 28.

In FIG. 27 and FIG. 28, the parts corresponding to the case in FIG. 19 and FIG. 20 are written in the same letters or the like, and the description thereof will not be repeated. In addition, in FIG. 27 and FIG. 28, "VBAP_gain[q][s]" (where, $q=n-1$, n, n+1, n+2) indicates the VBAP gain of the time frame (q) of the object subject to be processed of which a speaker index is s that specifies the speaker corresponding to the predetermined channel.

The example illustrated in FIG. 27, is the example in which the change of the priority information is the same as that in the case illustrated in FIG. 19. In this example, if the threshold value Q is 4, the priority information of the time frame (n−1) is equal to or higher than the threshold value Q. However, the priority information is lower than the threshold value Q in the time frame (n) to the time frame (n+2).

In such a case, VBAP gains of the time frame (n−1) to the time frame (n+1) are, for example, the gain indicated on a polygonal line GN51.

In this example, since the priority information of the time frame (n−1) is equal to or higher than the threshold value Q, the VBAP gain of each sample is determined based on the VBAP gain calculated by the ordinary VBAP.

That is, the VBAP gain value of the first sample of the time frame (n−1) is the same as the VBAP gain value of the last sample of the time frame (n−2). In addition, with regard to the object subject to be processed, the VBAP gain value of the last sample of the time frame (n−1) is the VBAP gain value of the channel corresponding to the speaker s, which is calculated by the ordinary VBAP with respect to the time frame (n−1). Then, the VBAP gain value of each sample of the time frame (n−1) is determined so as to linearly change from the first sample to the last sample.

In addition, since the priority information of the time frame (n) is lower than the threshold value Q, the VBAP gain value of the last sample of the time frame (n) is zero.

That is, the VBAP gain value of the first sample of the time frame (n) is the same as the VBAP gain value of the last sample of the time frame (n−1), and the VBAP gain value of the last sample of the time frame (n) is zero. Then, the VBAP gain value of each sample of the time frame (n) is determined so as to linearly change from the first sample to the last sample.

Furthermore, since the priority information of the time frame (n+1) is lower than the threshold value Q, the VBAP gain value of the last sample of the time frame (n+1) is zero, and as a result, the VBAP gain values of all the samples of the time frame (n+1) are zero.

In this way, by the VBAP gain value of the last sample of the time frame in which the priority information is lower than the threshold value Q being zero, the fade-out processing equivalent to the example in FIG. 23 can be performed.

On the other hand, the changes of the priority information in an example illustrated in FIG. 28 are the same as that in the example of the case illustrated in FIG. 24. In this example, if the threshold value Q is 4, the priority information items in the time frame (n−1) to the time frame (n+1) are lower than the threshold value Q, but the priority information item of the time frame (n+2) is equal to higher than the threshold value Q.

In this case, VBAP gains of the time frame (n−1) to time frame (n+2) are, for example, the gain indicated on a polygonal line GN61.

In this example, since both of the priority information of the time frame (n) and the priority information of the time frame (n+1) are lower than the threshold value Q, the VBAP gains of all the samples of the time frame (n+1) are zero.

In addition, since the priority information of the time frame (n+2) is equal to or higher than the threshold value Q, with regard to the object subject to be processed, the VBAP gain value of each sample is determined based on the VBAP gain of the channel corresponding to the speaker s, which is calculated by the ordinary VBAP.

That is, the VBAP gain value of the first sample of the time frame (n+2) is zero which is the VBAP gain value of the last sample of the time frame (n+1), and the VBAP gain value of the last sample of the time frame (n+2) is the VBAP gain value calculated by the ordinary VBAP with respect to the time frame (n+2). Then, the VBAP gain value of each sample of the time frame (n+2) is determined so as to linearly change from the first sample to the last sample.

In this way, by the VBAP gain value of the last sample of the time frame in which the priority information is lower than the threshold value Q being zero, the fade-in processing equivalent to the example in FIG. 24 can be performed.

Configuration Example of Unpacking/Decoding Unit

Figure 29:
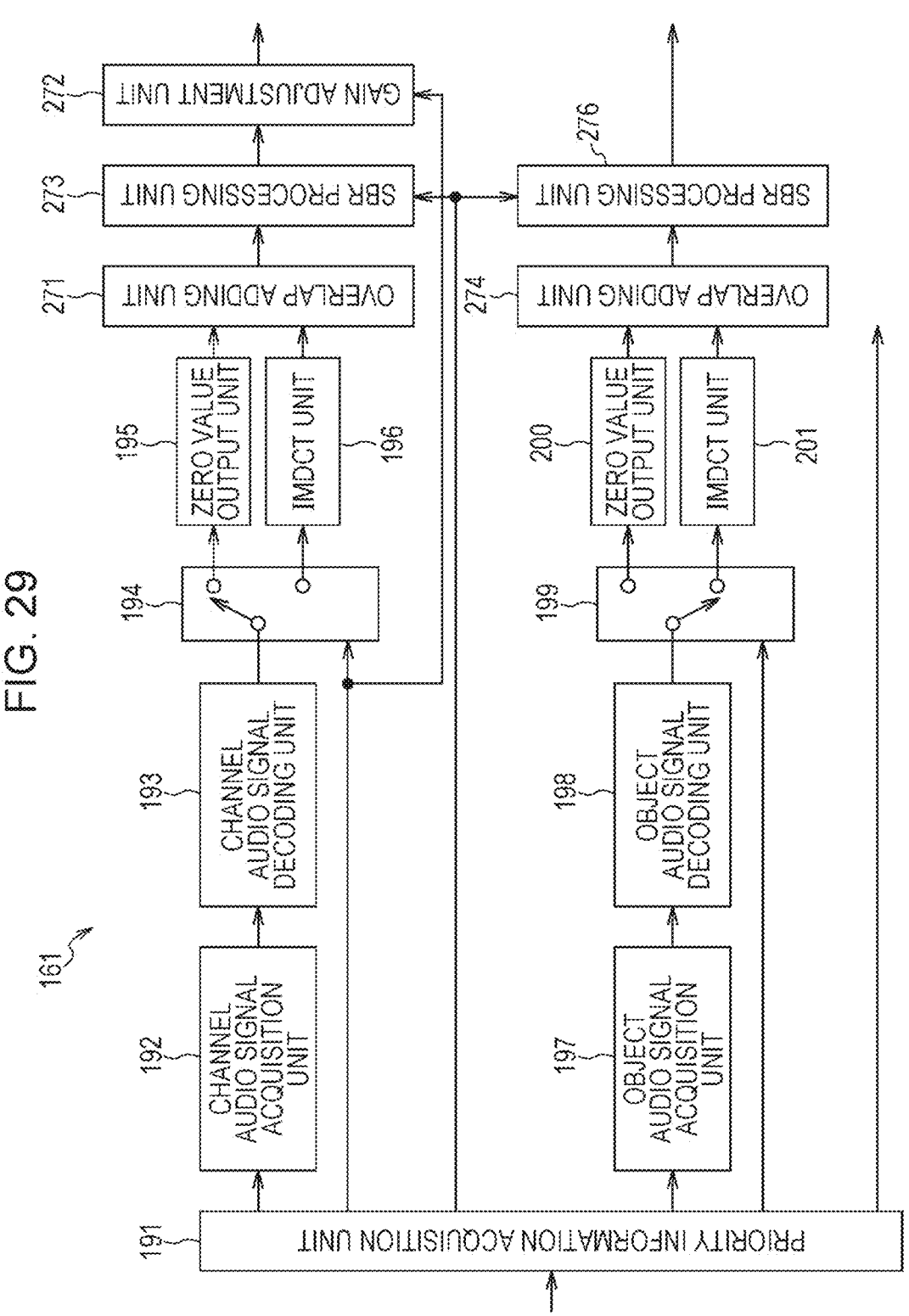
FIG. 29 is a diagram illustrating another configuration example of the unpacking/decoding unit.

In a case where the gain adjustment is performed by the fade-in processing or the fade-out processing described above referring to FIG. 27 and FIG. 28, the unpacking/ decoding unit 161, for example, is configured as illustrated in FIG. 29. In FIG. 29, the parts corresponding to the case in FIG. 25 are written in the same signs, and the description thereof will not be repeated.

The unpacking/decoding unit 161 illustrated in FIG. 29 includes the priority information acquisition unit 191, the channel audio signal acquisition unit 192, the channel audio signal decoding unit 193, the output selection unit 194, the zero value output unit 195, the IMDCT unit 196, the overlap adding unit 271, the SBR processing unit 273, the gain adjustment unit 272, the object audio signal acquisition unit 197, the object audio signal decoding unit 198, the output selection unit 199, the zero value output unit 200, the IMDCT unit 201, the overlap adding unit 274, and the SBR processing unit 276.

The configuration of the unpacking/decoding unit 161 illustrated in FIG. 29 is different from the configuration of the unpacking/decoding unit 161 illustrated in FIG. 25 in the point that the gain adjustment unit 275 is not provided, and the points are the same as that illustrated in FIG. 25.

In the unpacking/decoding unit 161 illustrated in FIG. 29, the SBR processing unit 276 performs the SBR with respect to the audio signal supplied from the overlap adding unit 274 based on the high frequency power value supplied from the priority information acquisition unit 191, and supplies the audio signal obtained from the result thereof to the rendering unit 162.

In addition, the priority information acquisition unit 191 acquires the meta-data and the priority information of each object from the supplied bit stream and supplies the meta-data and the priority information to the rendering unit 162. The priority information of each object is also supplied to the output selection unit 199.

<Description of Decoding Processing>

Subsequently, the operation of the decoding device 151 in a case where the unpacking/decoding unit 161 has a configuration illustrated in FIG. 29 will be described.

Figure 30:
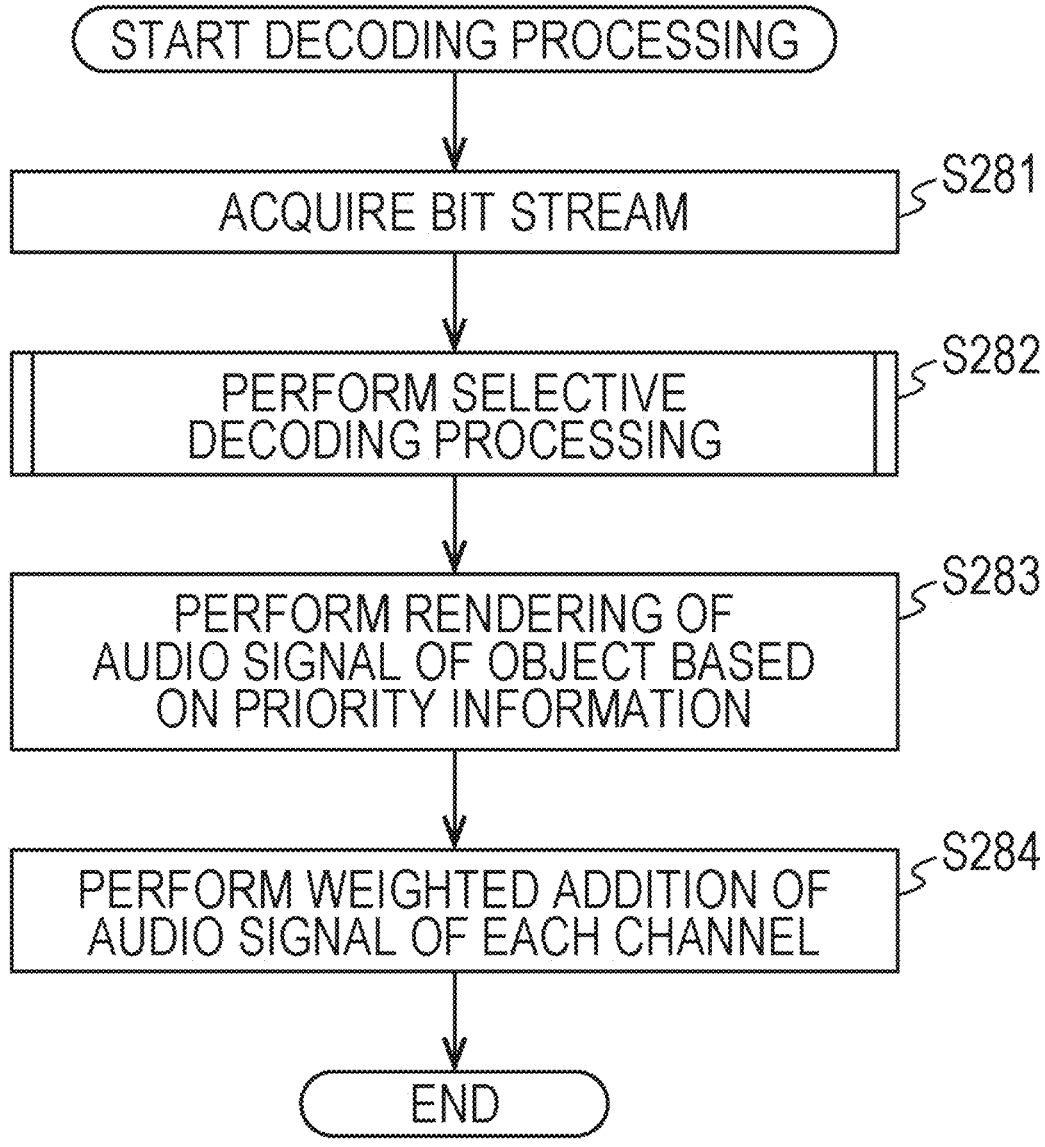
FIG. 30 is a flow chart explaining decoding processing.

The decoding device 151 performs the decoding processing described referring to FIG. 30. Hereinafter, the decoding processing performed by the decoding device 151 will be described referring to a flow chart in FIG. 30. However, in STEP S281, the same processing as that in STEP S51 in FIG. 11 is performed, and the description thereof will not be repeated.

In STEP S282, the unpacking/decoding unit 161 performs the selective decoding processing.

Here, the selective decoding processing corresponding to the processing in STEP S282 in FIG. 30 will be described referring to a flow chart in FIG. 31.

The processing tasks thereafter in STEP S311 to STEP S328 are the same as the processing tasks in STEP S231 to STEP S248 in FIG. 26, and the description thereof will not be repeated.

However, in STEP S312, the priority information acquisition unit 191 supplies the priority information acquired from the bit stream to the rendering unit 162 as well.

In STEP S329, when the object audio signal acquisition unit 197 adds one to the object number, the process returns to STEP S323. Then, when it is determined that the object number is not less than N in STEP S323, the selective decoding processing ends, and then, the process proceeds to STEP S283 in FIG. 30.

Figure 31:
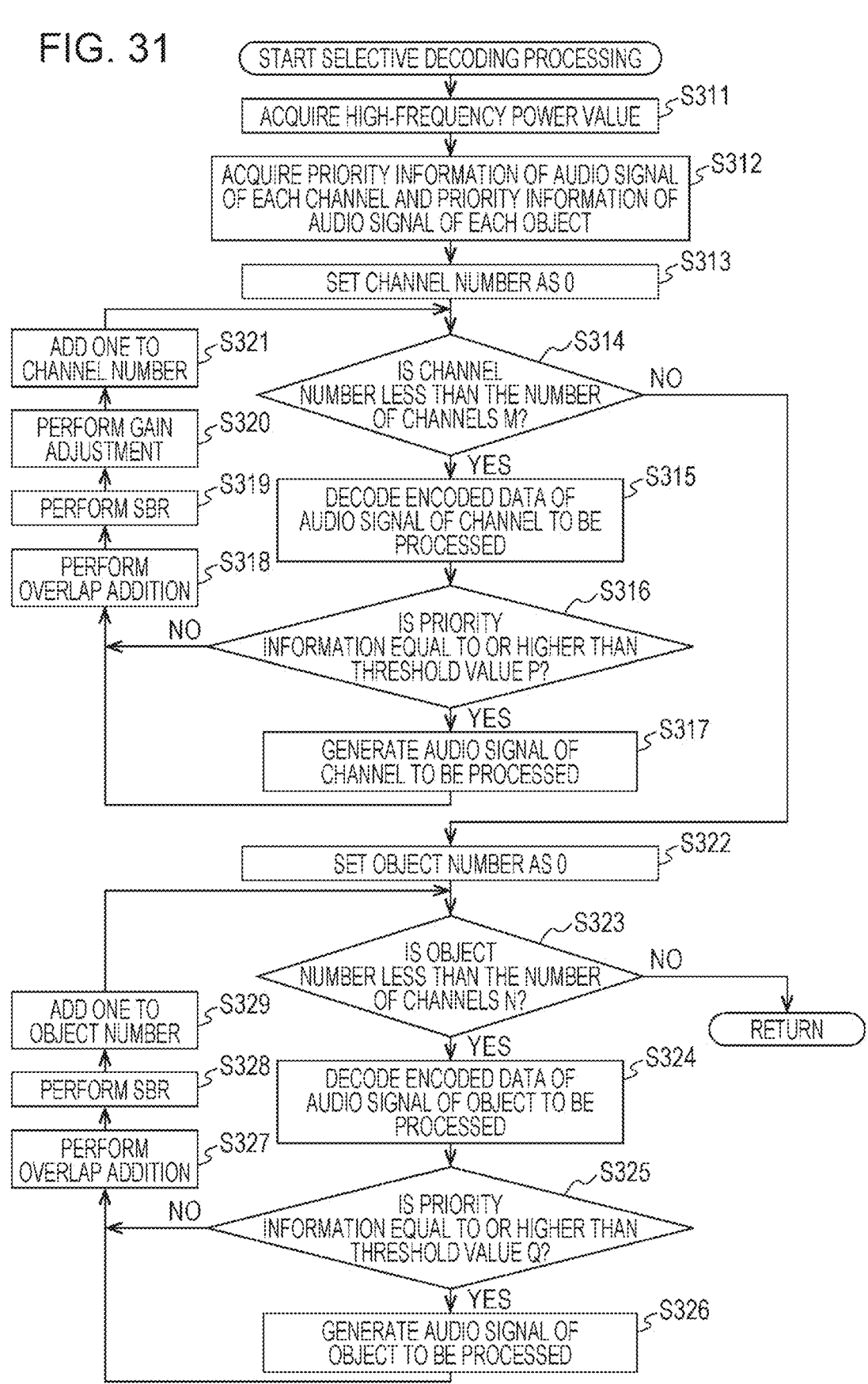
FIG. 31 is a flow chart explaining selective decoding processing.

Therefore, in the selective decoding processing illustrated in FIG. 31, with regard to the audio signal of each channel, the gain adjustment by the fading signal gain is performed similarly to the case in the fifth embodiment, and with regard to each object, the gain adjustment is not performed and the audio signal obtained by the SBR is output to the rendering unit 162 as it is.

Returning to the description of the decoding processing in FIG. 30, in STEP S283, the rendering unit 162 performs the rendering of the audio signal of each object based on the audio signal of each object supplied from the SBR processing unit 276, the position information as the meta-data of each object supplied from the priority information acquisition unit 191, and the priority information of the present time frame of each object.

For example, as described above referring to FIG. 27 and FIG. 28, with regard to each channel, the rendering unit 162 calculates the VBAP gain of each sample of the present time frame based on the priority information of the present time frame of each channel and the VBAP gain of the last sample of the time frame immediately before the present time frame. At this time, the rendering unit 162 appropriately calculates the VBAP gain by the VBAP based on the position information.

Then, the rendering unit 162 generates the audio signal of each channel based on the VBAP gain of each channel for each sample calculated for each object and the audio signal of each object, and supplies the audio signal to the mixing unit 163.

Here, in the description, the VBAP gains of each sample are calculated such that the VBAP gains of each sample in the time frame linearly change. However, the VBAP gain may non-linearly change. In addition, in the description, the audio signal of each channel is generated by the VBAP. However, even in a case where the audio signal of each channel is generated by other methods, it is possible to adjust the gain of the audio signal of each object by the processing similar to the case of VBAP.

After the audio signal of each channel being generated, the processing in STEP S284 is performed, and the decoding processing ends. However, since the processing in STEP S284 is the same as that in STEP S54 in FIG. 11, the description thereof will not be repeated.

In this way, the decoding device 151 calculates the VBAP gain for each sample based on the priority information with regard to each object, and at the time of generating the audio signal of each channel, performs the gain adjustment of the audio signal of the object by the VBAP gain. In this way, the occurrence of the glitch noise is suppressed with a lesser amount of the processing, and thus, it is possible to suppress the deterioration of the sound quality when listening.

In the descriptions in the fourth embodiment to the sixth embodiment, the output destination of the MDCT coefficient is selected using the priority information of the time frames immediately before and after the present time frame, or the gain adjustment is performed by the fading signal gain or the like. However, not limited being thereto, the priority information of the present time frame, and the priority information of the time frames of a predetermined number of time frames before the present time frame or the priority information of the time frames of a predetermined number of time frames after the present time frame, may be used.

Incidentally, a series of processing tasks described above can be executed by hardware or can be executed by software. In a case where the series of processing tasks are executed by software, a program that configures the software is installed in a computer. Here, the computer includes a computer that is built into dedicated hardware or a general-purpose computer, for example, which is capable of executing various functions by various programs being installed.

Figure 32:
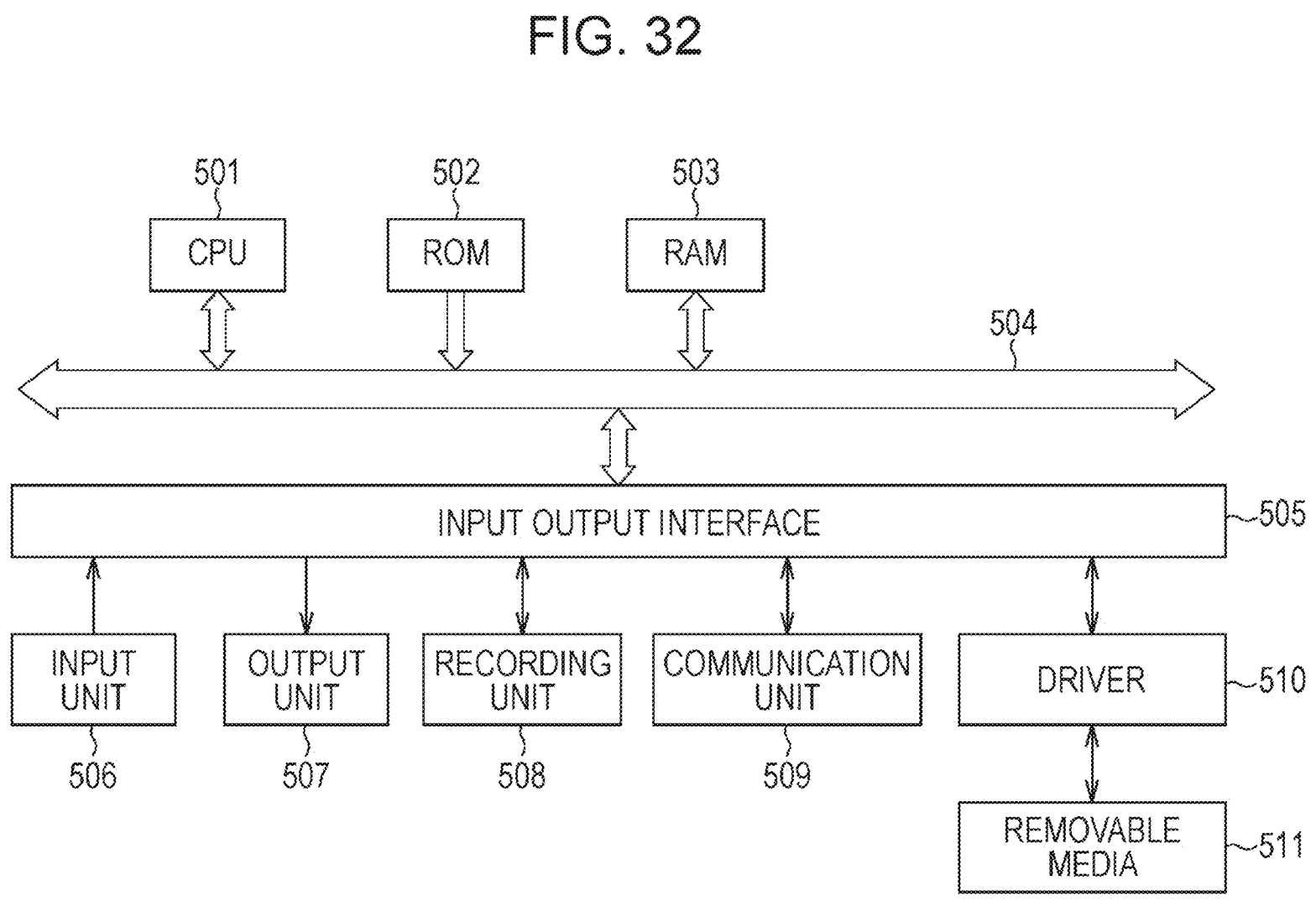

FIG. 32 is a block diagram illustrating a hardware configuration example of a computer that executes the series of processing tasks described above by a program.

In the computer, a central processing unit (CPU) 501, a read only memory (ROM) 502, and a random access memory (RAM) 503 are connected to each other by a bus 504.

Furthermore, an input-output interface 505 is connected to the bus 504. An input unit 506, an output unit 507, a storage unit 508, a communication unit 509 and a drive 510 are connected to the input-output interface 505.

The input unit 506 includes a keyboard, a mouse, a microphone, and an imaging element. The output unit 507 includes a display and speakers. The storage unit 508 includes a hard disk or a non-volatile memory. The communication unit 509 includes a network interface or the like. The drive 510 drives removable media 511 such as a magnetic disk, an optical disk, an optical magnetic disk or a semiconductor memory.

In the computer configured as described above, the CPU 501 loads the program stored in the storage unit 508 via the input-output interface 505 and the bus 504 to the RAM 503 to execute the program, and then, the series of processing tasks described above is performed.

The program executed by the computer (the CPU 501) can be provided by being recorded in a removable media 511 as a package media or the like. In addition, the program can be provided via a wired or a wireless transmission medium such as a local area network, the internet, or digital satellite broadcasting.

In the computer, the program can be installed in the storage unit 508 via the input-output interface 505 by mounting the removable media 511 on the drive 510. In addition, the program can be received by the communication unit 509 via the wired or the wireless transmission medium, and can be installed in the storage unit 508. Furthermore, the program can be installed in the ROM 502 or the storage unit 508 in advance.

The program executed by the computer may be a program in which the processing tasks are performed in a time series in the order described herein, or may be a program in which the processing tasks are performed in parallel or in a necessary timing a call is made.

In addition, the embodiment of the present technology is not limited to the embodiments described above, and various modifications can be made without departing the spirit of the present technology.

For example, the present technology can take a configuration of cloud computing in which one function is processed in sharing and cooperation with a plurality of devices via a network.

In addition, each STEP described in the above flow charts can be executed by one device or can be executed in sharing by a plurality of devices.

Furthermore, in a case where a plurality of processing tasks are included in one STEP, the processing tasks included in that one STEP can be executed by one device, or can be executed in sharing by a plurality of devices.

In addition, the effects described herein are just examples and are not limited thereto, and there may be other effects.

Furthermore, the present technology can have configurations as described below.

(1) A decoding device comprising:

at least one circuit configured to:

acquire one or more encoded audio signals including a plurality of channels and/or a plurality of objects and priority information for each of the plurality of channels and/or the plurality of objects; and decode the one or more encoded audio signals according to the priority information.

(2) The decoding device according to above (1), wherein the at least one circuit is configured to decode according to the priority information at least in part by decoding at least one of the one or more encoded audio signals for which a priority degree indicated by the priority information is equal to or higher than a degree, and refraining from decoding at least one other of the one or more encoded audio signals for which a priority degree indicated by the priority information is less than the degree.

(3) The decoding device according to above (2), wherein the at least one circuit is configured to change the degree based at least in part on the priority information for the plurality of channels and/or the plurality of objects.

(4) The decoding device according to any one of above (1) to (3), wherein:

the at least one circuit is configured to acquire a plurality of sets of priority information for the one or more encoded audio signals, and wherein the at least one circuit is configured to decode the one or more encoded audio signals at least in part by selecting one of the sets of priority information and decoding based at least in part on the one set of priority information.

(5) The decoding device according to above (4), wherein the at least one circuit is configured to select the one of the sets of priority information according to a calculation capability of the decoding device.

(6) The decoding device according to any one of above (1) to (5), wherein the at least one circuit is further configured to generate the priority information based at least in part on the encoded audio signal.

(7) The decoding device according to above (6), wherein the at least one circuit is configured to generate the priority information based at least in part on a sound pressure or a spectral shape of the audio of the one or more encoded audio signals.

(8) The decoding device according to any one of above (1) to (7), wherein:

the priority information for the plurality of channels and/or the plurality of objects comprises, for at least one first channel of the plurality of channels and/or at least one first object of the plurality of objects, priority information indicating different priority degrees of the at least one first channel and/or at least one first object over a period of time; and the at least one circuit is configured to decode based on the priority information at least in part by determining, for the first channel and/or the first object and at a first time during the period of time, whether or not to decode the first channel and/or the first object at the first time based at least in part on a priority degree for the first channel and/or the first object at the first time and a priority degree for the first channel and/or the first object at another time before or after the first time and during the period of time.

(9) The decoding device according to any one of above (1) to (8), wherein the at least one circuit is further configured to: generate an audio signal for a first time at least in part by adding an output audio signal for a channel or object at the time and an output audio signal of the channel or object at a second time before or after the first time, wherein the output audio signal for the channel or object for a time is a signal obtained by the at least one circuit as a result of decoding in a case where decoding of the channel or object for the time is performed and is zero data in a case where decoding of the channel or object for the time is not performed; and perform a gain adjustment of the output audio signal of the channel or object at the time based on the priority information of the channel or object at the time and the priority information of the channel or object at the other time before or after the time.

(10) The decoding device according to above (9), wherein the at least one circuit is further configured to:

adjust a gain of a high frequency power value for the channel or object based on the priority information of the channel or object at the first time and the priority information of the channel or object at the second time before or after the first time, and generate a high frequency component of the audio signal for the first time based on the high frequency power value of which the gain is adjusted and the audio signal of the time.

(11) The decoding device according to above (9) or (10), wherein the at least one circuit is further configured to:

generate, for each channel or each object, an audio signal of the first time in which a high frequency component is included, based on a high frequency power value and the audio signal of the time, perform the gain adjustment of the audio signal of the first time in which the high frequency component is included.

(12) The decoding device according to any one of above (1) to (11), wherein the at least one circuit is further configured to assign an audio signal of a first object, of the plurality of objects, to each of at least some of the plurality of channels with a gain value based on the priority information and to generate the audio of each of the plurality of channels.

(13) A decoding method comprising:

acquiring priority information for each of a plurality of channels and/or a plurality of objects of one or more encoded audio signals; and decoding the plurality of channels and/or the plurality of objects according to the priority information.

(14) At least one non-transitory computer-readable storage medium having encoded thereon executable instructions that, when executed by at least one processor, cause the at least one processor to carry out a method comprising:

acquiring priority information for each of a plurality of channels and/or a plurality of objects of one or more encoded audio signals; and decoding the plurality of channels and/or the plurality of objects according to the priority information.

(15) An encoding device comprising:

at least one circuit configured to:

generate priority information for each of a plurality of channels and/or a plurality of objects of an audio signal; and store the priority information in a bit stream.

(16) The encoding device according to above (15), wherein the at least one circuit is configured to generate the priority information at least in part by generating a plurality of sets of priority information for each of the plurality of channels and/or plurality of objects.

(17) The encoding device according to above (16), wherein the at least one circuit is configured to generate the plurality of sets of priority information for each of a plurality of calculation capabilities of decoding devices.

(18) The encoding device according to any one of above (15) to (17), wherein the at least one circuit is configured to generate the priority information based at least in part on a sound pressure or a spectral shape of the audio signal.

(19) The encoding device according to any one of above (15) to (18), wherein:

the at least one circuit is further configured to encode audio signals of the plurality of channels and/or the plurality of objects of the audio signal to form an encoded audio signal, the at least one circuit is further configured to store the priority information and the encoded audio signal in the bit stream.

(20) An encoding method comprising:

generating priority information for each of a plurality of channels and/or a plurality of objects of an audio signal; and storing the priority information in a bit stream.

(21) At least one non-transitory computer-readable storage medium having encoded thereon executable instructions that, when executed by at least one processor, cause the at least one processor to carry out a method comprising:

generating priority information for each of a plurality of channels and/or a plurality of objects of an audio signal; and storing the priority information in a bit stream.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 11 encoding device
21 channel audio encoding unit
22 object audio encoding unit
23 meta-data input unit
24 packing unit
51 encoding unit
52 priority information generation unit
61 MDCT unit
91 encoding unit
92 priority information generation unit
101 MDCT unit
151 decoding device
161 unpacking/decoding unit
162 rendering unit
163 mixing unit
191 priority information acquisition unit
193 channel audio signal decoding unit
194 output selection unit
196 IMDCT unit
198 object audio signal decoding unit
199 output selection unit
201 IMDCT unit
231 priority information generation unit
232 priority information generation unit
271 overlap adding unit
272 gain adjustment unit
273 SBR processing unit
274 overlap adding unit
275 gain adjustment unit
276 SBR processing unit

The invention claimed is:

1. A decoding device comprising:

circuitry configured to:

acquire one or more encoded audio signals including at least one of a plurality of channels and a plurality of audio objects;

acquire meta-data for each of the plurality of audio objects;

decode the one or more encoded audio signals according to the meta-data; and render the plurality of audio objects based on the meta-data by using VBAP (Vector Base Amplitude Panning) wherein:

the meta-data is priority information for each of the plurality of channels and/or the plurality of audio objects, a value range of the priority information is from 0 to 7, the circuitry is further configured to, prior to the decoding of the one or more encoded audio signals, perform processing with respect to an obtained audio signal such that in the processing:

a high-frequency component of a non-encoded audio signal is generated from an audio signal of:

a low frequency component generated from performing overlapping addition, and a high frequency power value, the obtained audio signal of one frame is divided into sections called time slots, and audio of each of the time slots is band-divided into a signal of a plurality of low frequency sub-bands, a high-frequency sub-band signal and a low-frequency sub-band signal are synthesized, an audio signal including the high frequency component is generated, and the audio signal including the high frequency component generated for each of the time slots are combined, resulting in an audio signal of one time frame including the high frequency component.

2. The decoding device according to claim 1, wherein a lowest priority degree is 0 and a highest priority degree is 7.

3. The decoding device according to claim 1, wherein the meta-data is position information indicating each of position of the plurality of audio objects.

4. The decoding device according to claim 3, wherein the position information is expressed by a horizontal angle from a predetermined reference position, a vertical angle from the predetermined reference position, and a distance from the predetermined reference position to a predetermined audio object.

5. The decoding device according to claim 1, wherein the meta-data is a gain of the audio object.

6. The decoding device according to claim 1, wherein a parameter called num_objects indicates a number of objects representing the plurality of audio objects.

7. The decoding device according to claim 1, wherein the circuitry is further configured to perform IMDCT (inverse modified discrete cosine transform) to generate an audio signal.

8. The decoding device according to claim 1, wherein a sum of audio signals from each of the plurality of channels is multiplied by a VBAP gain of corresponding channels in the plurality of channels, producing an audio signal for each channel.

9. The decoding device according to claim 8, wherein gain adjustment of the encoded audio signals of each object is performed through the VBAP gain.

10. The decoding device according to claim 1, wherein a speaker index, s, acts to specify a speaker corresponding to a predetermined channel.

11. The decoding device according to claim 1, wherein the processing comprises SBR (spectral band) processing is performed with respect to and the audio signal comprises an audio signal obtained by overlappingly adding IMDCT signals output from an IMCDT unit.

12. The decoding device according to claim 1, wherein a signal of each of the sub-bands of high frequency is generated based on a signal of the plurality of low frequency sub-bands and a power value of each of the sub-bands of high frequency.

13. The decoding device according to claim 1, wherein a target high frequency sub-band signal is generated by adjusting power of a low frequency sub-band signal of a predetermined sub-band by a power of a target sub-band of high frequency or by shifting the frequency thereof.

14. A method executed by at least one processing circuit of a decoding device, the method comprising:
acquiring one or more encoded audio signals including at least one of a plurality of channels and a plurality of audio objects;
acquiring meta-data for each of the plurality of audio objects;
decoding the one or more encoded audio signals according to the meta-data; and
rendering the plurality of audio objects based on the meta-data by using VBAP (Vector Base Amplitude Panning) wherein:
the meta-data is priority information for each of the plurality of channels and/or the plurality of audio objects,
a value range of the priority information is from 0 to 7,
the circuitry is further configured to, prior to the decoding of the one or more encoded audio signals, perform processing with respect to an obtained audio signal such that in the processing:
a high-frequency component of a non-encoded audio signal is generated from an audio signal of:
a low frequency component generated from performing overlapping addition, and
a high frequency power value,
the obtained audio signal of one frame is divided into sections called time slots, and audio of each of the time slots is band-divided into a signal of a plurality of low frequency sub-bands,
a high-frequency sub-band signal and a low-frequency sub-band signal are synthesized,
an audio signal including the high frequency component is generated, and
the audio signal including the high frequency component generated for each of the time slots are combined, resulting in an audio signal of one frame including the high frequency component.

15. A non-transitory computer readable medium storing instructions that, when executed by at least one processing circuit of a decoding device, causes the at least one processing circuit to perform a method comprising:
acquiring one or more encoded audio signals including at least one of a plurality of channels and a plurality of audio objects;
acquiring meta-data for each of the plurality of audio objects;
decoding the one or more encoded audio signals according to the meta-data; and
rendering the plurality of audio objects based on the meta-data by using VBAP (Vector Base Amplitude Panning) wherein:
the meta-data is priority information for each of the plurality of channels and/or the plurality of audio objects,
a value range of the priority information is from 0 to 7,
the circuitry is further configured to, prior to the decoding of the one or more encoded audio signals, perform processing with respect to an obtained audio signal such that in the processing:
a high-frequency component of a non-encoded audio signal is generated from an audio signal of:
a low frequency component generated from performing overlapping addition, and
a high frequency power value,
the obtained audio signal of one frame is divided into sections called time slots, and audio of each of the time slots is band-divided into a signal of a plurality of low frequency sub-bands,
a high-frequency sub-band signal and a low-frequency sub-band signal are synthesized,
an audio signal including the high frequency component is generated, and
the audio signal including the high frequency component generated for each of the time slots are combined, resulting in an audio signal of one time frame including the high frequency component.

* * * * *